(12) United States Patent
Kuwabara et al.

(10) Patent No.: US 11,430,960 B2
(45) Date of Patent: Aug. 30, 2022

(54) ORGANIC ELECTROLUMINESCENCE DEVICE AND NITROGEN-CONTAINING COMPOUND FOR ORGANIC ELECTROLUMINESCENCE DEVICE

(71) Applicant: Samsung Display Co., LTD., Yongin-si (KR)

(72) Inventors: Hirokazu Kuwabara, Yokohama (JP); Ryuhei Furue, Yokohama (JP)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 161 days.

(21) Appl. No.: 17/023,969

(22) Filed: Sep. 17, 2020

(65) Prior Publication Data
US 2021/0273165 A1    Sep. 2, 2021

(30) Foreign Application Priority Data
Feb. 13, 2020   (KR) .......................... 10-2020-0017920

(51) Int. Cl.
*H01L 51/00* (2006.01)
*H01L 51/52* (2006.01)
*H01L 51/50* (2006.01)

(52) U.S. Cl.
CPC ........ *H01L 51/008* (2013.01); *H01L 51/5203* (2013.01); *H01L 51/5056* (2013.01); *H01L 51/5072* (2013.01)

(58) Field of Classification Search
CPC .............. H01L 51/008; H01L 51/0061; H01L 51/0071
See application file for complete search history.

(56) References Cited

U.S. PATENT DOCUMENTS

| | | |
|---|---|---|
| 2019/0058124 A1 | 2/2019 | Hatakeyama et al. |
| 2019/0115538 A1 | 4/2019 | Lim et al. |

(Continued)

FOREIGN PATENT DOCUMENTS

| | | |
|---|---|---|
| KR | 10-2018-0108604 | 10/2018 |
| KR | 10-2019-0042791 | 4/2019 |

(Continued)

*Primary Examiner* — Anthony Ho
(74) *Attorney, Agent, or Firm* — Kile Park Reed & Houtteman PLLC

(57) ABSTRACT

An organic electroluminescence device exhibiting high light emission efficiency is provided, which includes a first electrode, a hole transport region disposed on the first electrode, an emission layer disposed on the hole transport region, an electron transport region disposed on the emission layer, and a second electrode disposed on the electron transport region. The emission layer may include a nitrogen-containing compound represented by Formula 1:

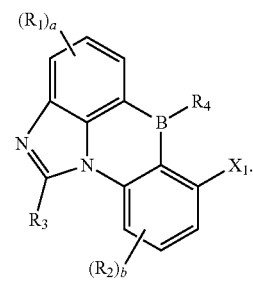

[Formula 1]

20 Claims, 2 Drawing Sheets

(56) References Cited

U.S. PATENT DOCUMENTS

2019/0181350 A1 6/2019 Hatakeyama et al.
2020/0185626 A1 6/2020 Yuuki

FOREIGN PATENT DOCUMENTS

| KR | 10-2019-0069295 | 6/2019 |
| KR | 10-2020-0071192 | 6/2020 |
| WO | 2017/138526 | 8/2017 |
| WO | 2018/212169 | 11/2018 |

ORGANIC ELECTROLUMINESCENCE DEVICE AND NITROGEN-CONTAINING COMPOUND FOR ORGANIC ELECTROLUMINESCENCE DEVICE

CROSS-REFERENCE TO RELATED APPLICATION(S)

This application claims priority to and benefits of Korean Patent Application No. 10-2020-0017920 under 35 U.S.C. § 119, filed on Feb. 13, 2020 in the Korean Intellectual Property Office, the entire contents of which are incorporated herein by reference.

BACKGROUND

1. Technical Field

The disclosure relates to an organic electroluminescence device and a nitrogen-containing compound for the organic electroluminescence device.

2. Description of the Related Art

Recently, active development is being conducted on an organic electroluminescence display as an image display device. Unlike liquid crystal display devices and the like, the organic electroluminescence display is a so-called self-luminescent display device in which holes and electrons injected from a first electrode and a second electrode recombine in an emission layer, and thus a luminescent material including an organic compound in the emission layer emits light to implement display.

In the application of an organic electroluminescence device to a display device, there is continuous demand for an organic electroluminescence device having a low driving voltage, high light emission efficiency, and a long service life. There is also continuous demand for the development of materials for an organic electroluminescence device that are capable of stably attaining such characteristics.

In recent years, in order to implement a highly efficient organic electroluminescence device, technology continues development pertaining to phosphorescence emission using triplet state energy or delayed fluorescence using triplet-triplet annihilation (TTA) in which singlet excitons are generated by collision of triplet excitons, and pertaining to thermally activated delayed fluorescence (TADF) materials using delayed fluorescence phenomenon.

SUMMARY

The disclosure provides an organic electroluminescence device having a long service life and high efficiency, and a nitrogen-containing compound used therein.

The disclosure also provides an organic electroluminescence device including a thermally activated delayed fluorescence emitting material and a nitrogen-containing compound used as a thermally activated delayed fluorescence emitting material.

An embodiment of the inventive concept provides an organic electroluminescence device that may include a first electrode; a hole transport region disposed on the first electrode; an emission layer disposed on the hole transport region; an electron transport region disposed on the emission layer; and the second electrode disposed on the electron transport region. The first electrode and the second electrode may each include at least one material selected from the group consisting of Ag, Mg, Cu, Al, Pt, Pd, Au, Ni, Nd, Ir, Cr, Li, Ca, LiF/Ca, LiF/Al, Mo, Ti, In, Sn, Zn, an oxide thereof, a compound thereof, and a mixture thereof. The emission layer may include a nitrogen-containing compound represented by Formula 1:

[Formula 1]

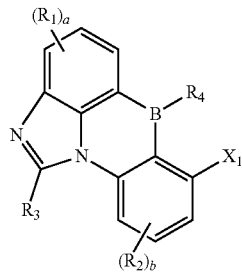

In Formula 1, $X_1$ may be $NAr_1Ar_2$, $OAr_3$, or $SAr_4$, $Ar_1$ to $Ar_4$ may each independently be a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, $R_1$ to $R_4$ may each independently be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, and a and b may each independently be an integer from 0 to 3.

In an embodiment, the emission layer may emit delayed fluorescence.

In an embodiment, the emission layer may be a delayed fluorescence emission layer containing a first compound and a second compound, and the first compound may include the nitrogen-containing compound.

In an embodiment, the emission layer may be a thermally activated delayed fluorescence emission layer which emits blue light.

An embodiment of the inventive concept provides a nitrogen-containing compound represented by Formula 1.

In an embodiment, Formula 1 may be represented by Formula 2:

[Formula 2]

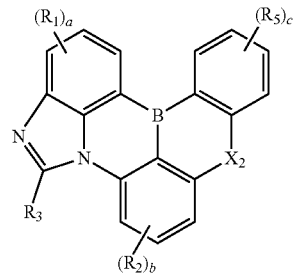

In Formula 2, $X_2$ may be $NAr_1$, O, or S, $R_5$ may be a hydrogen atom, a deuterium atom, a halogen atom, a substituted or unsubstituted amine group, a substituted or unsubstituted boron group, a substituted or unsubstituted thiol group, a substituted or unsubstituted oxy group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, c may be an integer from 0 to 4, and $Ar_1$, $R_1$ to $R_3$, a and b may be the same as defined in Formula 1.

In an embodiment, Formula 2 may be represented by Formula 3:

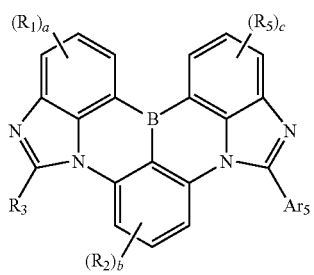

[Formula 3]

In Formula 3, $Ar_5$ may be a hydrogen atom, a substituted or unsubstituted aryl group having 6 to 30 ring-forming carbon atoms, or a substituted or unsubstituted heteroaryl group having 2 to 30 ring-forming carbon atoms, and $R_1$ to $R_3$, $R_5$, and a to c may be the same as defined in Formula 2.

In an embodiment, Formula 2 may be represented by Formula 4-1 or Formula 4-2:

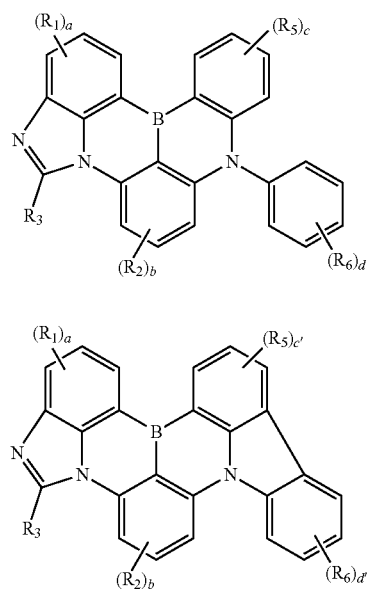

[Formula 4-1]

[Formula 4-2]

In Formula 4-1 and Formula 4-2, $R_6$ may be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, c' may be an integer from 0 to 4, d may be an integer from 0 to 5, d' may be an integer from 0 to 4, and $R_1$ to $R_3$, $R_5$, and a to c may be the same as defined in Formula 2.

In an embodiment, Formula 2 may be represented by Formula 5-1 or Formula 5-2:

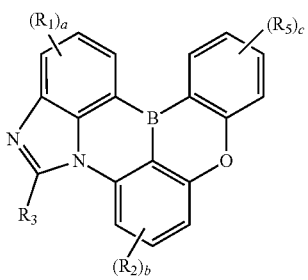

[Formula 5-1]

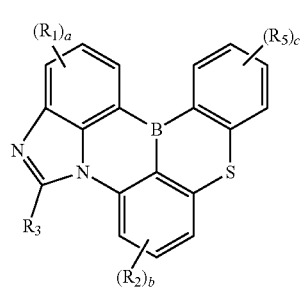

[Formula 5-2]

In Formula 5-1 and Formula 5-2, $R_1$ to $R_3$, $R_5$, and a to c may be the same as defined in Formula 2.

In an embodiment, Formula 2 may be represented by Formula 6:

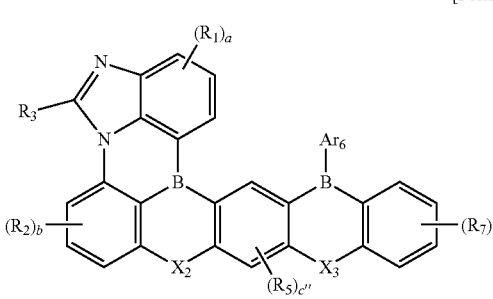

[Formula 6]

In Formula 6 above, $X_3$ may be $NAr_1$, O, or S, $Ar_6$ may be a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, $R_7$ may be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, c" may be an integer from 0 to 2, e may be an integer from 0 to 4, and $X_2$, $Ar_1$, $R_1$ to $R_3$, $R_5$, and a and b may be the same as defined in Formula 2.

In an embodiment, Formula 6 may be represented by Formula 7:

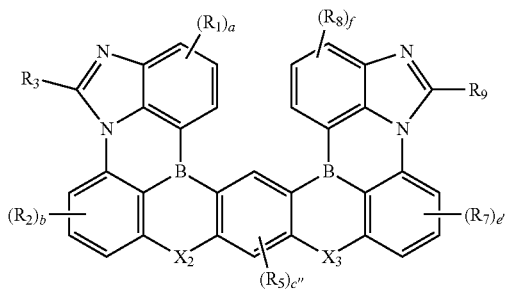

[Formula 7]

In Formula 7, $R_8$ and $R_9$ may each independently be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, e' and f may each independently be an integer from 0 to 3, and $X_2$, $X_3$, $R_1$ to $R_3$, $R_5$, $R_7$, a and b, and c" may be the same as defined in Formula 6.

In an embodiment, $X_2$ and $X_3$ may be the same.

In an embodiment, $R_3$ may be a hydrogen atom, a deuterium atom, a substituted or unsubstituted phenyl group, or a substituted or unsubstituted biphenyl group.

In an embodiment, $R_1$ and $R_2$ above may each independently be a hydrogen atom, a deuterium atom, a substituted or unsubstituted arylamino group, a substituted or unsubstituted alkyl group having 1 to 6 carbon atoms, a substituted or unsubstituted phenyl group, a substituted or unsubstituted biphenyl group, or a substituted or unsubstituted carbazole group.

In an embodiment, the compound represented by Formula 1 may be one selected from Compound Group 1.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
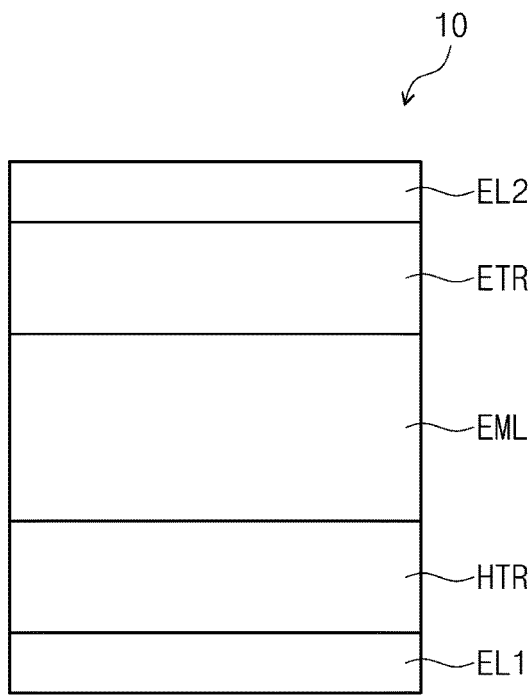
FIG. 1 is a schematic cross-sectional view illustrating an organic electroluminescence device according to an embodiment of the inventive concept.

The inventive concept may have various modifications and may be embodied in different forms, and embodiments will be explained in detail with reference to the accompanying drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

In the description, it will be understood that when an element or layer is referred to as being "on", "connected to" or "coupled to" another element or layer, it can be directly on, connected or coupled to the other element or layer or intervening elements or layers may be present.

Like numbers refer to like elements throughout. In the drawings, the thickness, the ratio, and the dimensions of elements may be exaggerated for an effective description of technical contents.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B, and C" may indicate only A, only B, only C, both A and B, both A and C, both B and C, all of A, B, and C, or variations thereof.

The term "at least one of" is intended to include the meaning of "at least one selected from the group consisting of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

Terms such as "below," "lower," "above," "upper," and the like are used to describe the relationship of the configurations shown in the drawings. The terms are used as a relative concept and are described with reference to the direction indicated in the drawings.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprises," "comprising," "includes," "including," "have," "having," "contains," and/or "containing" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the inventive concept and a compound of an embodiment included therein will be described with reference to the accompanying drawings.

FIGS. 1 to 4 are schematic cross-sectional views illustrating organic electroluminescence devices according to embodiments of the inventive concept. Referring to FIGS. 1 to 4, in each of organic electroluminescence devices 10 according to embodiments, a first electrode EL1 and a second electrode EL2 are disposed to face each other and an emission layer EML may be disposed between the first electrode EL1 and the second electrode EL2.

Each of the organic electroluminescence devices 10 of embodiments may further include functional layers between the first electrode EL1 and the second electrode EL2 in addition to the emission layer EML. The layers may include a hole transport region HTR and an electron transport region ETR. Each of the organic electroluminescence devices 10 according to embodiments may include the first electrode ELL the hole transport region HTR, the emission layer EML, the electron transport region ETR, and the second electrode EL2 in a sequentially stacked embodiment. The organic electroluminescence device 10 of an embodiment may include a capping layer CPL disposed on the second electrode EL2.

The organic electroluminescence device 10 of an embodiment may include a nitrogen-containing compound of an embodiment, which will be described later, in the emission layer EML disposed between the first electrode EL1 and the second electrode EL2. However, the embodiment is not limited thereto, and the organic electroluminescence device 10 of an embodiment may include a compound according to an embodiment, which will be described later, not only in the emission layer EML but also in the hole transport region HTR or electron transport region ETR, which may be included in the functional layers disposed between the first electrode EL1 and the second electrode EL2, or in the capping layer CPL disposed on the second electrode EL2.

Figure 2:
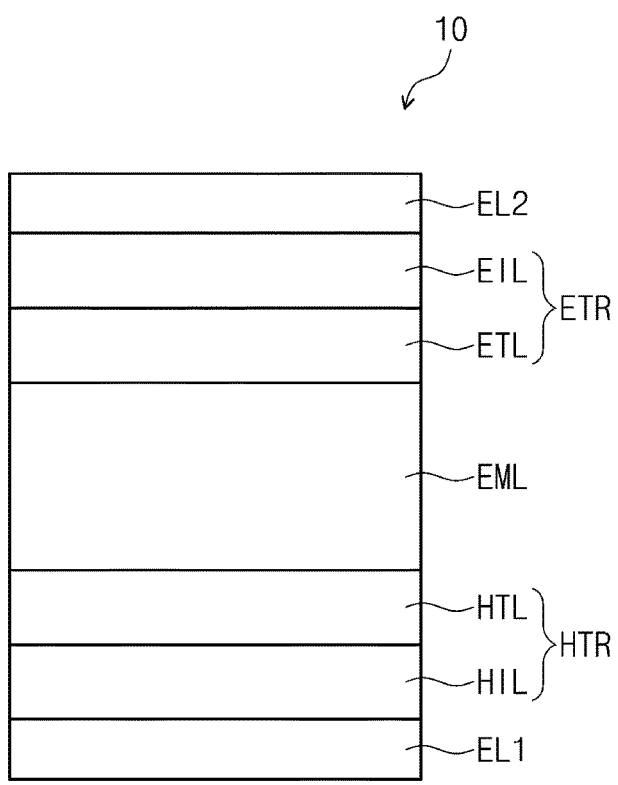
FIG. 2 is a schematic cross-sectional view illustrating an organic electroluminescence device according to an embodiment of the inventive concept.
Figure 3:
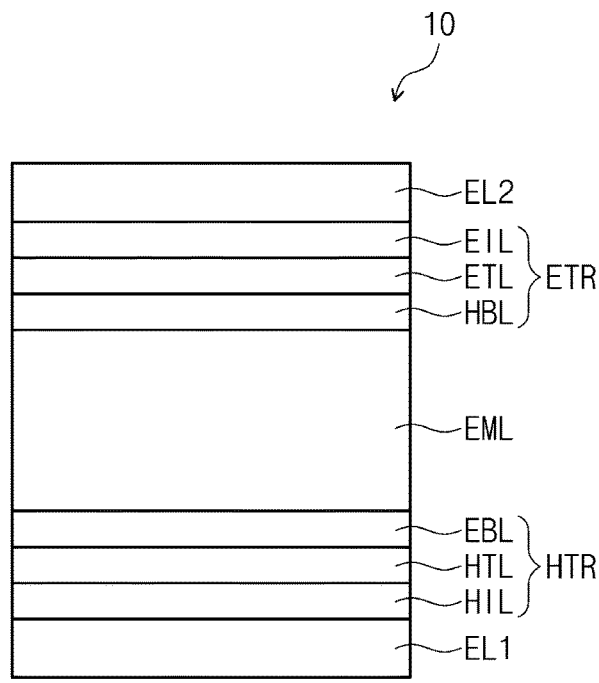
FIG. 3 is a schematic cross-sectional view illustrating an organic electroluminescence device according to an embodiment of the inventive concept.
Figure 4:
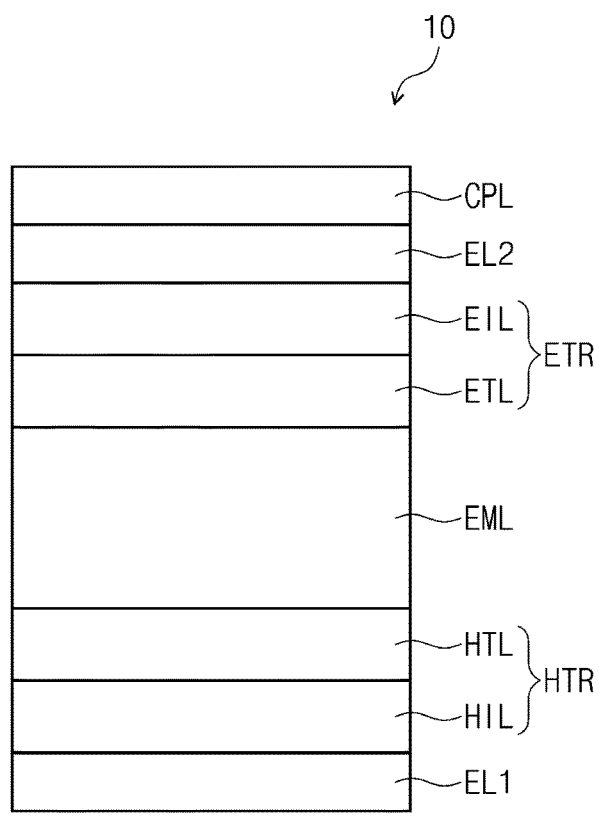
FIG. 4 is a schematic cross-sectional view illustrating an organic electroluminescence device according to an embodiment of the inventive concept.

Compared to FIG. 1, FIG. 2 illustrates a schematic cross-sectional view of an organic electroluminescence device 10 of an embodiment, in which a hole transport region HTR includes a hole injection layer HIL and a hole transport layer HTL, and an electron transport region ETR includes an electron injection layer EIL and an electron transport layer ETL. Compared to FIG. 1, FIG. 3 illustrates a schematic cross-sectional view of an organic electroluminescence device 10 of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 2, FIG. 4 illustrates a schematic cross-sectional view of an organic electroluminescence device 10 of an embodiment including a capping layer CPL disposed on the second electrode EL2.

The first electrode EL1 has conductivity. The first electrode EL1 may be formed of a metal alloy or a conductive compound. The first electrode EL1 may be a pixel electrode or positive electrode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg Cu, Al, Pt, Pd, Au, Ni, Nd, Ir, Cr, Li, Ca, LiF/Ca, LiF/Al, Mo, Ti, In, Sn, Zn, an oxide thereof, a compound thereof, or a mixture thereof (e.g., a mixture of Ag and Mg). The first electrode EL1 may have a multilayer structure including a reflective layer or a transflective layer formed of the above-described materials, and a transparent conductive layer formed of ITO, IZO, ZnO, ITZO, etc. For example, the first electrode EL1 may have a three-layer structure of ITO/Ag/ITO, but is not limited thereto. The thickness of the first electrode EL1 may be in a range of about 1,000 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a hole buffer layer (not shown), or an electron blocking layer.

The hole transport region HTR may have a single layer formed of a single material, a single layer formed of different materials, or a multilayer structure including multiple layers formed of different materials.

For example, the hole transport region HTR may have a single layer structure of a hole injection layer HIL or a hole transport layer HTL, and may have a single layer structure formed of a hole injection material and a hole transport material. The hole transport region HTR may have a single layer structure formed of different materials, or a structure in which a hole injection layer HIL/hole transport layer HTL, a hole injection layer HIL/hole transport layer HTL/hole buffer layer (not shown), a hole injection layer HIL/hole buffer layer (not shown), a hole transport layer HTL/hole buffer layer, or a hole injection layer HIL/hole transport layer HTL/electron blocking layer EBL are stacked in order from the first electrode EL1, but an embodiment is not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris{N,-(2-naphthyl)-N-phenylamino)-triphenylamine (2-TNATA), poly (3,4-ethylenedioxythiophene)/poly(4-styrenesulfonate) (PEDOT/P S S), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPD), tri phenyl amine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include generally materials known in the art. For example, the hole transport layer HTL may further include carbazole derivatives such as N-phenyl carbazole and polyvinyl carbazole, fluorine derivatives, N,N'-bis(3-methylphenyl)-N,N'-diphenyl-[1,1-biphenyl]-4,4'-diamine (TPD), triphenylamine derivatives such as 4,4',4''-tris(N-carbazolyl)triphenylamine (TCTA), N,N'-di(1-naphtalene-1-yl)-N,N'-diphenyl-benzidine (NPD), 4,4'-cyclohexylidene bis[N,N-bis(4-methylphenyl] benzenamine] (TAPC), 4,4'-bis[N,N'(3-tolyl)amino]-3,3'-dimethylbiphenyl (HMTPD), 1,3-bis(N-carbazolyl)benzene (mCP), etc.

The electron blocking layer EBL may include, for example, carbazole derivatives such as N-phenyl carbazole and polyvinyl carbazole, fluorine derivatives, N,N'-bis(3-methylphenyl)-N,N'-diphenyl-[1,1-biphenyl]-4,4'-diamine (TPD), triphenylamine derivatives such as 4,4',4''-tris(N-carbazolyl)triphenylamine (TCTA), N,N'-di(1-naphtalene-1-yl)-N,N'-diphenyl-benzidine (NPD), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), mCP, etc.

The thickness of the hole transport region HTR may be in a range of about 50 Å to about 15,000 Å. For example, the thickness of the hole transport region HTR may be in a range of about 100 Å to about 5,000 Å. The thickness of the hole injection region HIL may be, for example, in a range of about 30 Å to about 1,000 Å, and the thickness of the hole transport layer HTL may be in a range of about 30 Å to about 1,000 Å. For example, the thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, but is not limited thereto. For example, non-limiting examples of the p-dopant may include quinone derivatives such as tetracyanoquinodimethane (TCNQ) and 2,3,5,6-tetrafluoro-7,7',8,8'-tetracyanoquinodimethane (F4-TCNQ), metal oxides such as tungsten oxide and molybdenum oxide, etc., but is not limited thereto.

As described above, the hole transport region HTR may further include at least one of a hole buffer layer (not shown) or an electron blocking layer EBL in addition to the hole injection layer HIL and the hole transport layer HTL. The hole buffer layer (not shown), may compensate a resonance distance according to the wavelength of light emitted from an emission layer EML and may increase light emission efficiency. Materials which may be included in the hole transport region HTR may be used as materials which may be included in the hole buffer layer (not shown). The electron blocking layer EBL is a layer that may serve to prevent electrons from being injected from the electron transport region ETR to the hole transport region HTR.

The emission layer EML may be provided on the hole transport region HTR. The thickness of the emission layer EML may be in a range of about 100 Å to about 1000 Å. For example, the thickness of the emission layer EML may be in a range of about 100 Å to about 300 Å. The emission layer EML may have a single layer formed of a single material, a single layer formed of different materials, or a multilayer structure having multiple layers formed of different materials.

The emission layer may emit one of red, green, blue, white, yellow, or cyan light. The emission layer EML may include a fluorescence-emitting material or a phosphorescence-emitting material.

In an embodiment, the emission layer EML may be a fluorescence emission layer. For example, some of the light emitted from the emission layer EML may result from thermally activated delayed fluorescence (TADF). The emission layer EML may include a luminescent component that emits thermally activated delayed fluorescence, and in an embodiment, the emission layer EML may be an emission layer that emits thermally activated delayed fluorescence emitting blue light.

The emission layer EML of the organic electroluminescence device 10 of an embodiment may include a nitrogen-containing compound according to an embodiment of the inventive concept.

In the description, the term "substituted or unsubstituted" may indicate that one is substituted or unsubstituted with at least one substituent selected from the group consisting of a deuterium atom, a halogen atom, a cyano group, a nitro group, an amino group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. Each of the substituents described above may be substituted or unsubstituted. For example, a biphenyl group may be interpreted as an aryl group or a phenyl group substituted with a phenyl group.

In the description, the term "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The rings formed by being bonded to an adjacent group may be monocyclic or polycyclic. The rings formed by being bonded to each other may be connected to another ring to form a spiro structure.

In the description, the term "an adjacent group" may mean a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other.

In the description, examples of the halogen atom may include a fluorine atom, a chlorine atom, a bromine atom, and an iodine atom.

In the description, unless otherwise specified, an alkyl group may be chained or cyclic. The number of carbons in the alkyl group is 1 to 50, 1 to 30, 1 to 20, 1 to 10, or 1 to 6. Examples of the alkyl group may include, but are not limited to, methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc. Examples of the cyclic alkyl group may include, but are not limited to, cyclopentyl group, cyclohexyl group, 4-methylcyclohexyl group, 4-t-butylcyclohexyl group, cyclooctyl group, etc.

In the description, an alkenyl group means a hydrocarbon group including at least one carbon double bond in the middle or terminal of an alkyl group having 2 or more carbon atoms. The alkenyl group may be linear or branched. Although the number of carbon atoms is not specifically limited, it is 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but are not limited thereto.

In the description, an alkynyl group means a hydrocarbon group including at least one carbon triple bond in the middle or terminal of an alkyl group having 2 or more carbon atoms. The alkynyl group may be linear or branched. Although the number of carbon atoms is not specifically limited, it is 2 to 30, 2 to 20, or 2 to 10. Specific examples of the alkynyl group may include an ethynyl group, a propynyl group, etc., but are not limited thereto.

In the description, a hydrocarbon ring group may be an any functional group or substituent derived from an aliphatic hydrocarbon ring, or an any functional group or substituent derived from an aromatic hydrocarbon ring. The number of ring-forming carbon atoms in the hydrocarbon ring group may be 5 to 60, 5 to 30, or 5 to 20.

In the description, an aryl group means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., but are not limited thereto.

In the description, a heterocyclic group means any functional group or substituent derived from a ring containing at least one of B, O, N, P, Si, or S as a hetero atom. The heterocyclic group includes an aliphatic heterocyclic group and an aromatic heterocyclic group. The aromatic heterocyclic group may be a heteroaryl group. The aliphatic heterocycle and aromatic heterocycle may be monocyclic or polycyclic.

In the description, the heterocyclic group may include at least one of B, O, N, P, Si or S as a hetero atom. When the heterocyclic group contains two or more hetero atoms, the two or more hetero atoms may be the same as or different from each other. The heterocyclic group may be a monocyclic heterocyclic group or a polycyclic heterocyclic group, and includes a heteroaryl group. The number of ring-forming carbon atoms in in the heterocyclic group may be 2 to 30, 2 to 20, or 2 to 10.

In the description, the aliphatic heterocyclic group may include at least one of B, O, N, P, Si, or S as a hetero atom. The number of ring-forming carbon atoms in the aliphatic heterocyclic group may be 2 to 30, 2 to 20, or 2 to 10. Examples of the aliphatic heterocyclic group include an oxirane group, a tyran group, a pyrrolidine group, a piperidine group, a tetrahydrofuran group, a tetrahydrothiophene group, a thian group, a tetrahydropyran group, a 1,4-dioxane group, etc., but are not limited to thereto.

In the description, the heteroaryl group may include at least one of B, O, N, P, Si, or S as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidyl, pyrido pyrazinyl, pyrazino pyrazinyl, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophenyl, thienothiophene, benzofuranyl, phenanthroline, thiazolyl, isooxazolyl, oxadiazolyl, thiadiazolyl, phenothiazolyl, phenothiazinyl, dibenzosilole, dibenzofuranyl, etc., but are not limited thereto.

In the description, the number of carbon atoms in an amine group is not specifically limited, but may be 1 to 30. The amine group may include an alkyl amine group, an aryl amine group, or a heteroaryl amine group. Examples of the amine group include a methylamine group, a dimethylamine group, a phenylamine group, a diphenylamine group, a naphthylamine group, a 9-methyl-anthracenylamine group, a triphenylamine group, etc., but are not limited thereto.

In the description, a thiol group may include an alkylthio group and an arylthio group.

In the description, the boron group includes an alkyl boron group and an aryl boron group. The boron group may mean that a boron atom is bonded to the alkyl group or the aryl group as defined above. Examples of the boron group may include, but are not limited to, trimethylboron, triethylboron, t-butyldimethylboron, triphenylboron, diphenylboron, phenylboron, etc.

In the description, an oxy group may an alkoxy group and an aryloxy group. The oxy group may mean that an oxygen atom is bonded to the alkyl group or the aryl group as defined above. Examples of an oxy group include methoxy, ethoxy, n-propoxy, isopropoxy, butoxy, pentyloxy, hexyloxy, octyloxy, nonyloxy, decyloxy, benzyloxy, etc., but are not limited thereto.

The nitrogen-containing compound according to an embodiment of the inventive concept is represented by Formula 1:

[Formula 1]

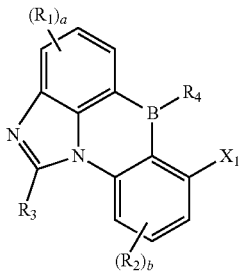

In Formula 1, $X_1$ may be $NAr_1Ar_2$, $OAr_3$, or $SAr_4$.

In Formula 1, $Ar_1$ to $Ar_4$ may each independently be a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula 1, $R_1$ to $R_4$ may each independently be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula 1, a and b may each independently be an integer from 0 to 3. When a is an integer of 2 or more, the $R_1$'s may be the same as or different from each other, and when b is an integer of 2 or more, the $R_2$'s may be the same as or different from each other.

In an embodiment, $R_4$ in Formula 1 may be a substituted or unsubstituted phenyl group.

In an embodiment, Formula 1 may be represented by Formula 2 below:

[Formula 2]

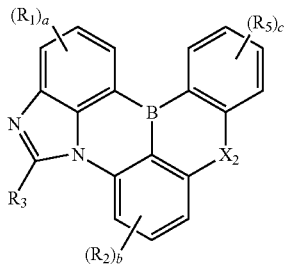

In Formula 2, $X_2$ may be $NAr_1$, O, or S.

In Formula 2, $R_5$ may be a hydrogen atom, a deuterium atom, a halogen atom, a substituted or unsubstituted amine group, a substituted or unsubstituted boron group, a substituted or unsubstituted thiol group, a substituted or unsubstituted oxy group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula 2, c may be an integer from 0 to 4. When c is an integer of 2 or more, the $R_5$'s may be the same as or different from each other.

In Formula 2, $Ar_1$, $R_1$ to $R_3$, and a and b may be the same as defined in Formula 1.

In an embodiment, Formula 2 may be represented by Formula 3:

[Formula 3]

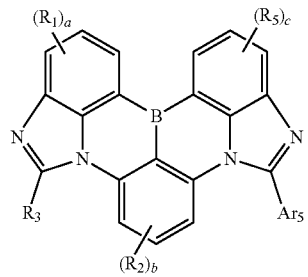

In Formula 3, $Ar_5$ may be a hydrogen atom, a deuterium atom, a substituted or unsubstituted aryl group having 6 to 30 ring-forming carbon atoms, or a substituted or unsubstituted heteroaryl group having 2 to 30 ring-forming carbon atoms.

In Formula 3, $R_1$ to $R_3$, $R_5$, and a to c may be the same as defined in Formula 2.

In an embodiment, Formula 2 may be represented by Formula 4-1:

[Formula 4-1]

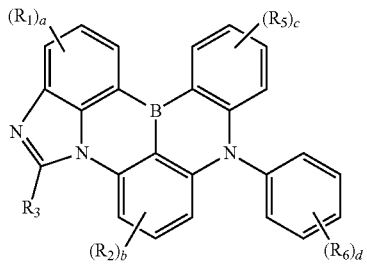

In Formula 4-1, $R_6$ may be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula 4-1, d may be an integer from 0 to 5, and when d is an integer of 2 or more, the $R_6$'s may be the same as or different from each other.

In Formula 4-1, $R_1$ to $R_3$, $R_5$, and a to c may be the same as defined in Formula 2.

In an embodiment, Formula 2 may be represented by Formula 4-2:

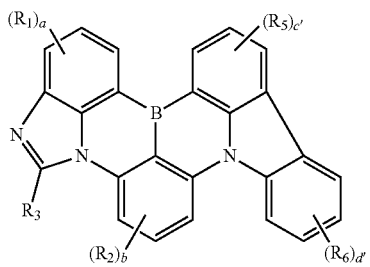

[Formula 4-2]

In Formula 4-2, $R_6$ may be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula 4-2, d' may be an integer from 0 to 4, and when d' is an integer of 2 or more, the $R_6$'s may be the same as or different from each other.

In Formula 4-2, c' may be an integer from 0 to 3, and when c' is an integer of 2 or more, the $R_5$'s may be the same as or different from each other.

In Formula 4-2, $R_1$ to $R_3$, $R_5$, and a and b may be the same as defined in Formula 2.

In an embodiment, Formula 2 may be represented by Formula 5-1 or Formula 5-2:

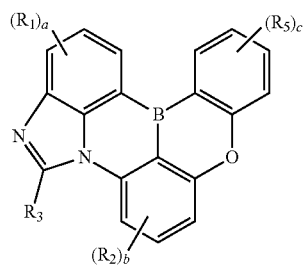

[Formula 5-1]

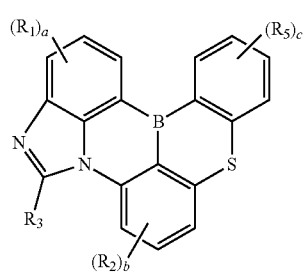

[Formula 5-2]

In Formula 5-1 and Formula 5-2, $R_1$ to $R_3$, $R_5$, and a to c may be the same as defined in Formula 2.

In an embodiment, Formula 2 may be represented by Formula 6:

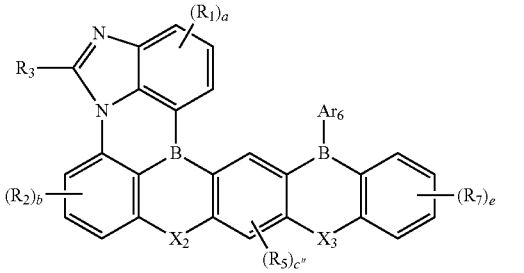

[Formula 6]

In Formula 6, $X_3$ may be $NAr_1$, O, or S, and

In Formula 6, $Ar_6$ may be a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula 6, $R_7$ may be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula 6, c" may be an integer of 0 to 2, and when c" is 2, $R_5$'s may be the same as or different from each other.

In Formula 6, e may be an integer from 0 to 4, and when e is an integer of 2 or more, the $R_7$'s may be the same as or different from each other.

In Formula 6, $X_2$, $Ar_1$, $R_1$ to $R_3$, $R_5$, and a and b may be the same as defined in Formula 2.

In an embodiment, Formula 6 may be represented by Formula 7:

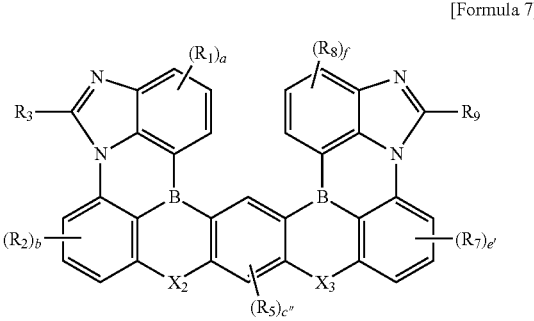

[Formula 7]

In Formula 7, $R_8$ and $R_9$ may be each independently a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula 7, e' and f may each independently be an integer from 0 to 3. When e' is an integer of 2 or more, the Vs may be the same as or different from each other, and when f is an integer of 2 or more, the $R_8$'s may be the same as or different from each other.

In Formula 7, $X_2$, $X_3$, $R_1$ to $R_3$, $R_5$, $R_7$, a and b, and c" may be the same as defined in Formula 6.

In an embodiment, $X_2$ and $X_3$ in Formula 6 and Formula 7 may be the same.

In an embodiment, $R_3$ in Formula 1 to Formula 7 may be a hydrogen atom, a deuterium atom, a substituted or unsubstituted phenyl group, or a substituted or unsubstituted biphenyl group.

In an embodiment, $R_1$ and $R_2$ in Formula 1 to Formula 7 may each independently be a hydrogen atom, a deuterium atom, a substituted or unsubstituted arylamino group, a substituted or unsubstituted alkyl group having 1 to 6 carbon atoms, a substituted or unsubstituted phenyl group, a substituted or unsubstituted biphenyl group, or a substituted or unsubstituted carbazole group.

In an embodiment, the nitrogen-containing compound represented by Formula 1 may be one selected from Compound Group 1, which includes Compounds 1 to 179. However, the inventive concept is not limited thereto.

[Compound Group 1]

1

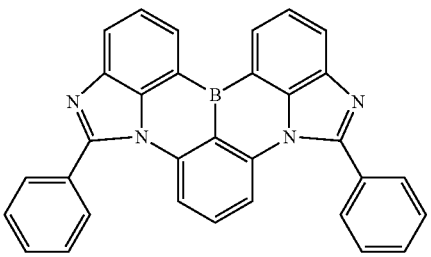

2

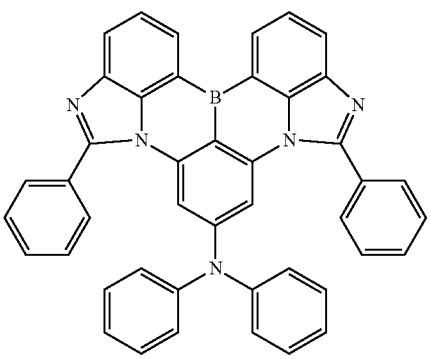

3

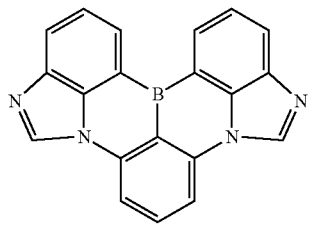

4

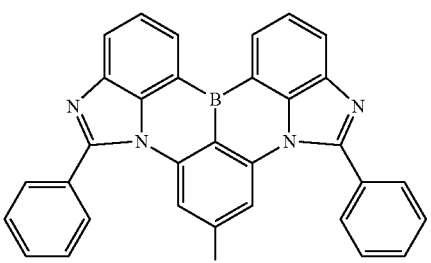

5

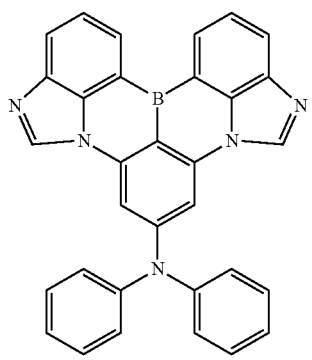

6

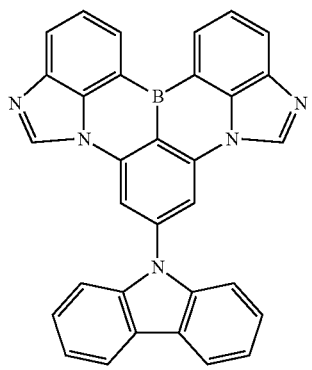

7

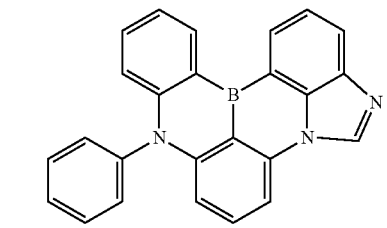

8

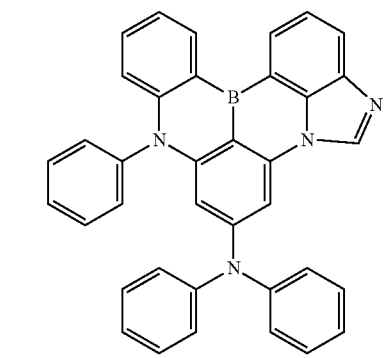

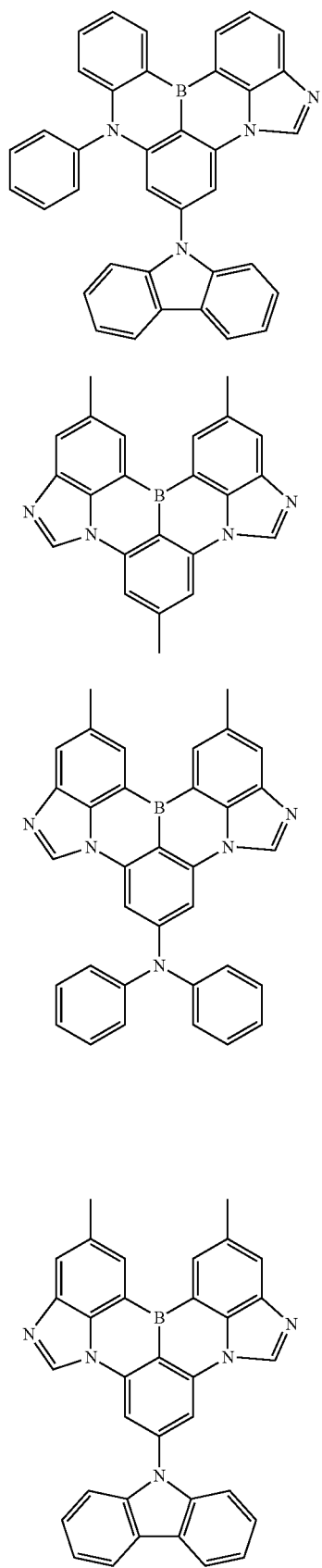
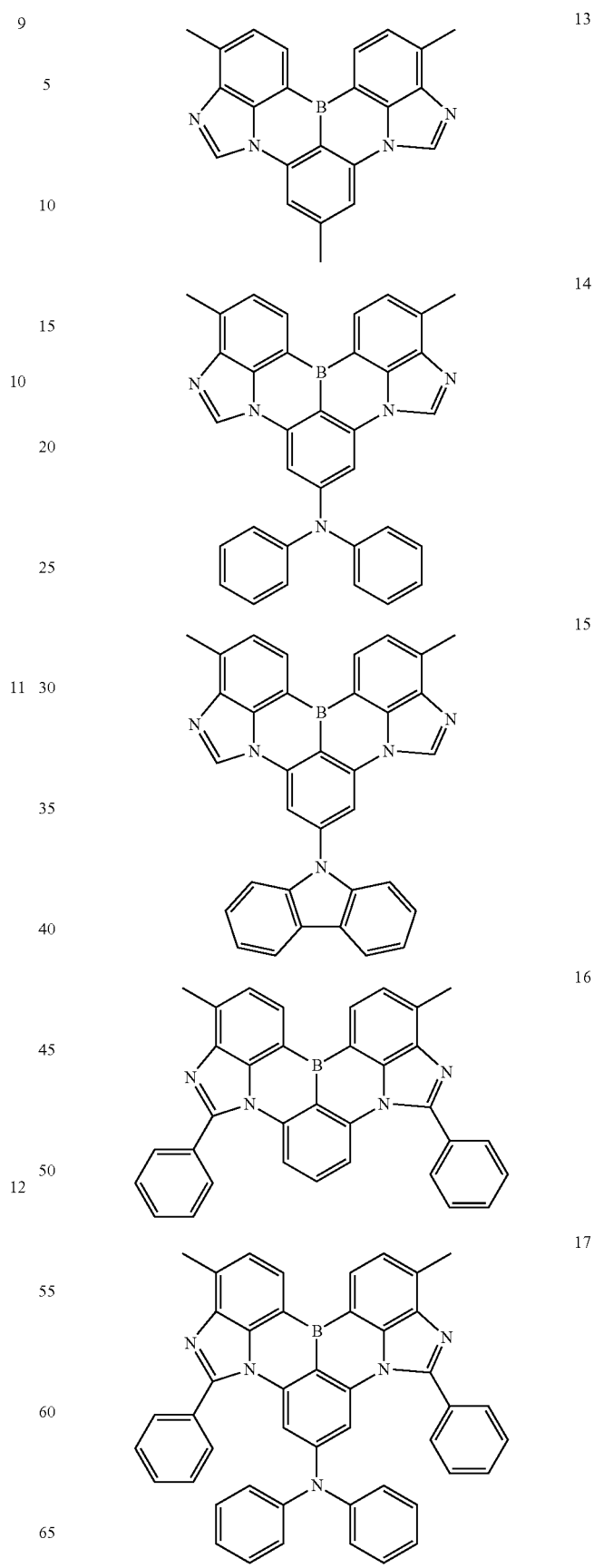

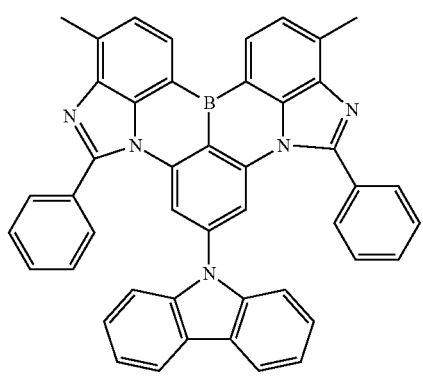
18
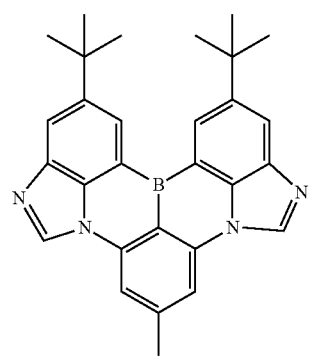
19
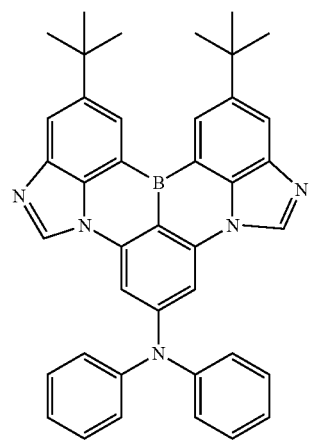
20
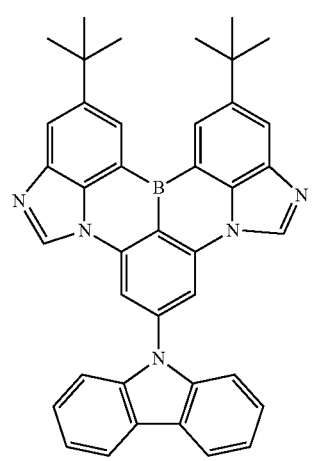
21
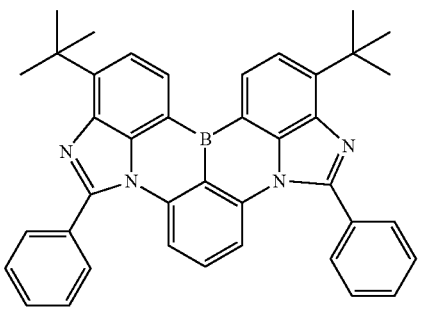
22
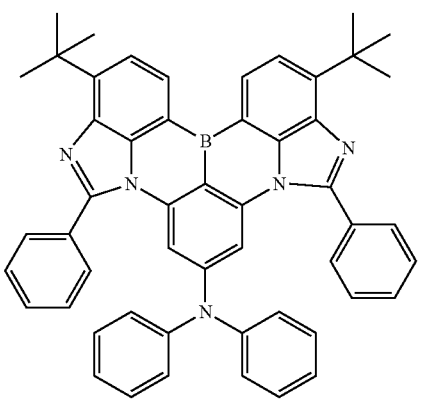
23
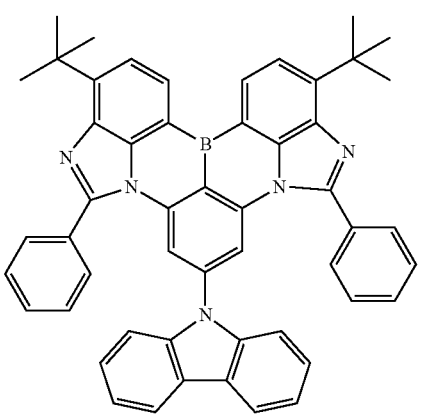
24
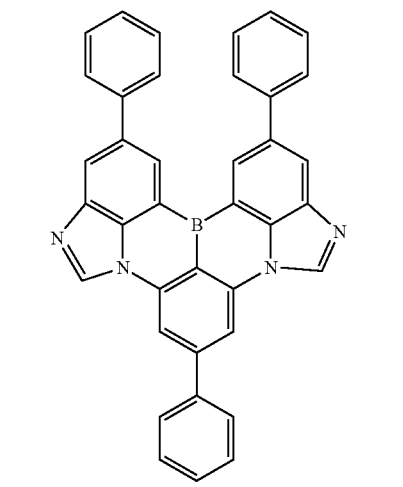
25
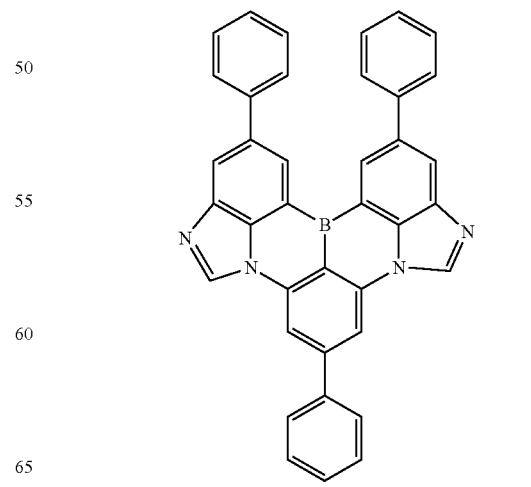

26
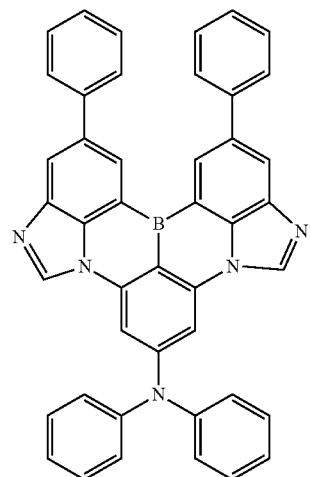
27
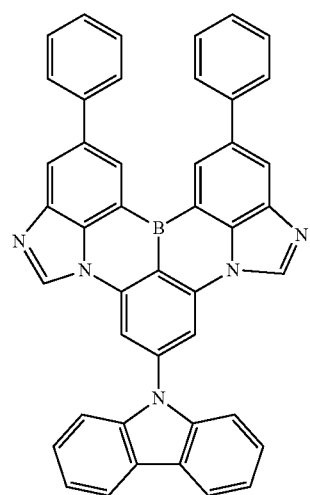
28
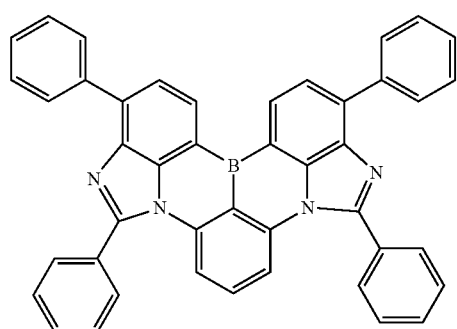
29
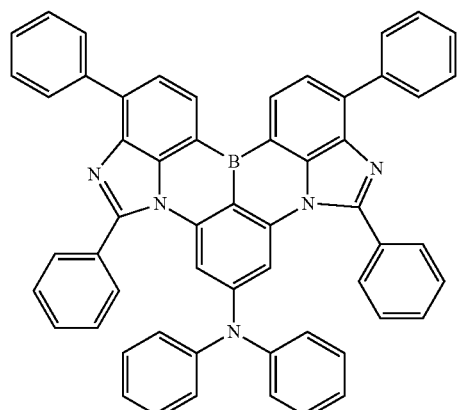
30
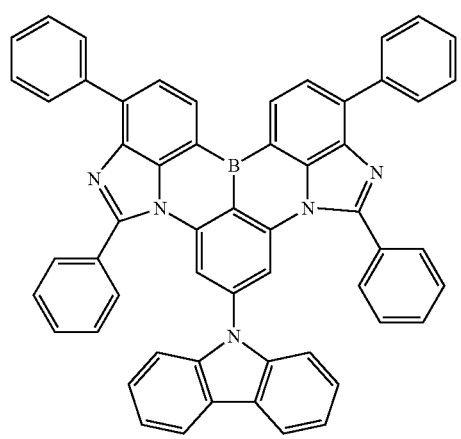
31
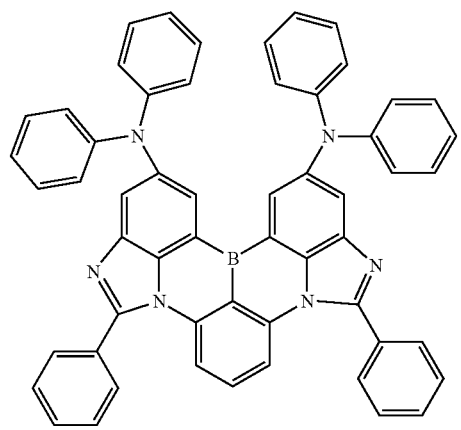

32
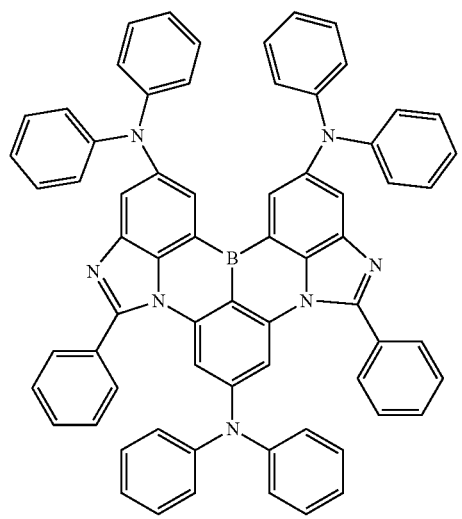
33
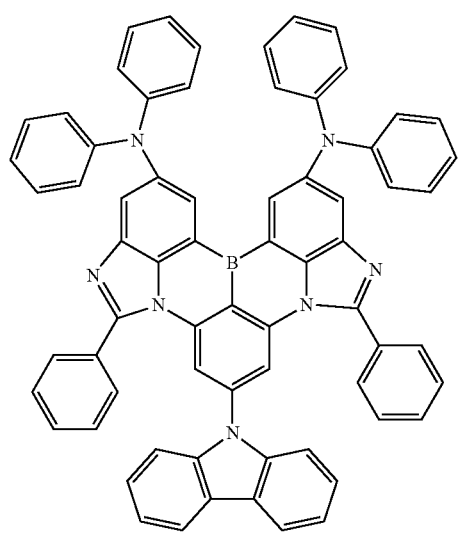
34
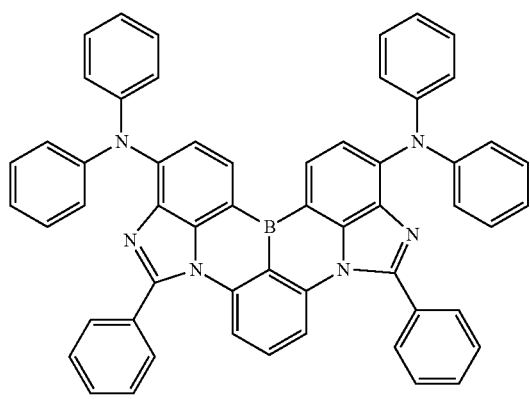
35
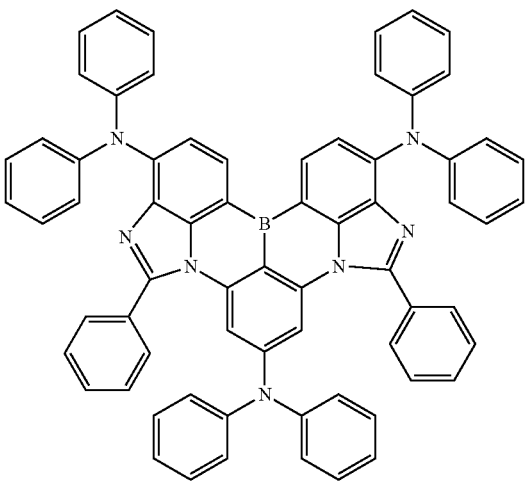
36
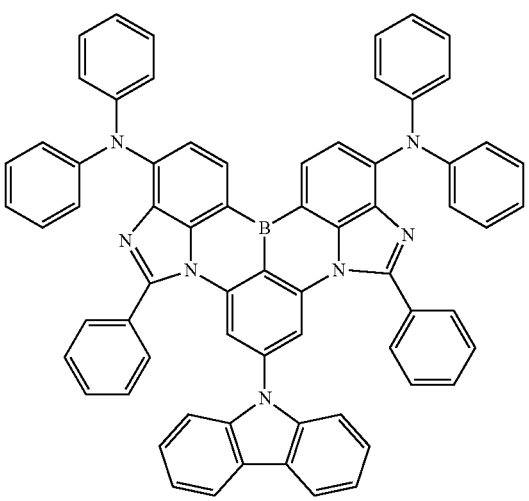
37
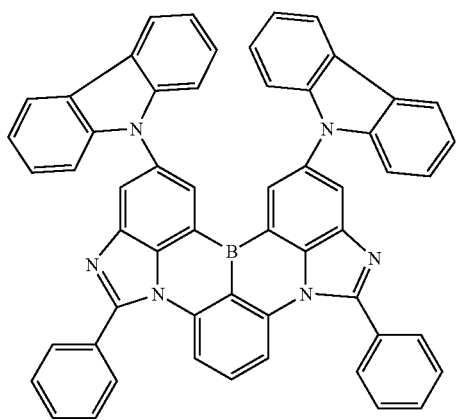

38
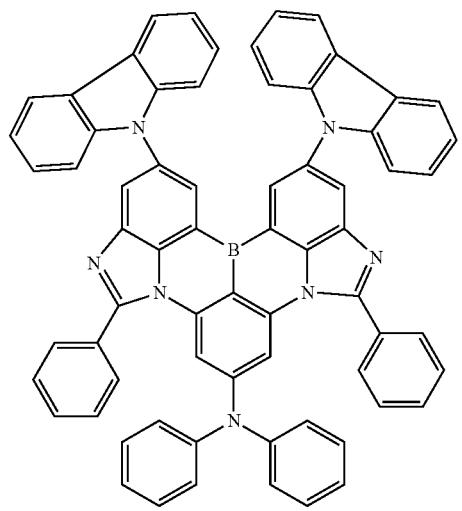
39
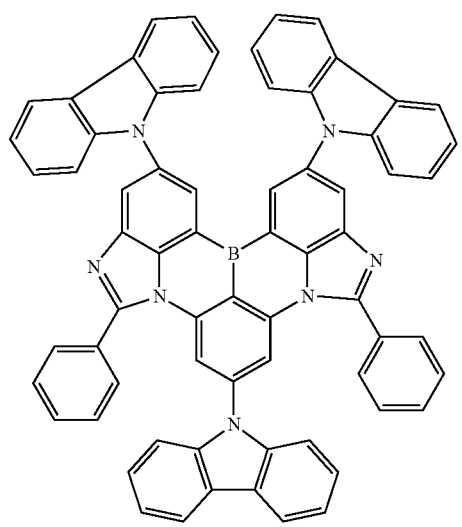
40
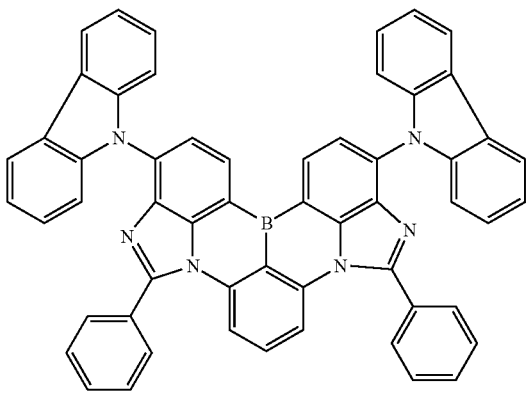
41
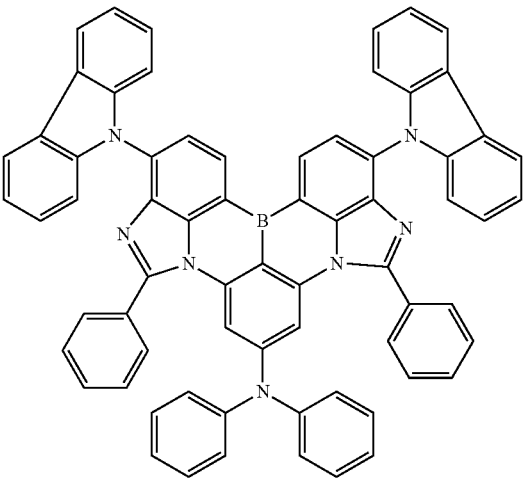
42
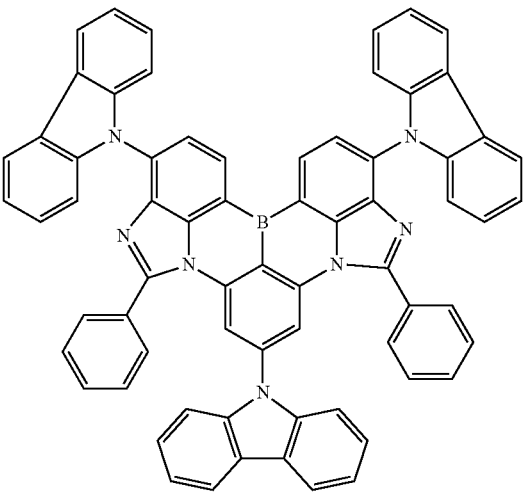
43
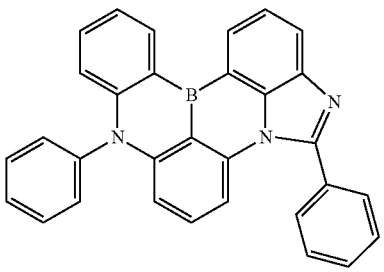
44
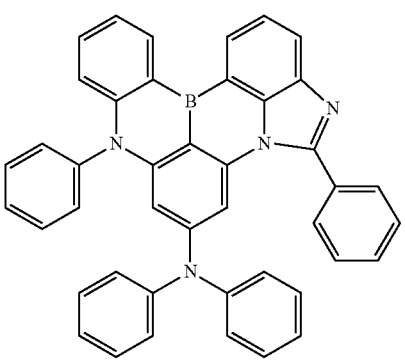

45
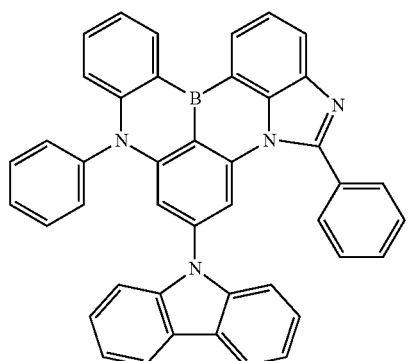
46
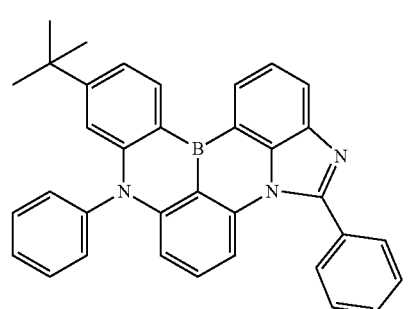
47
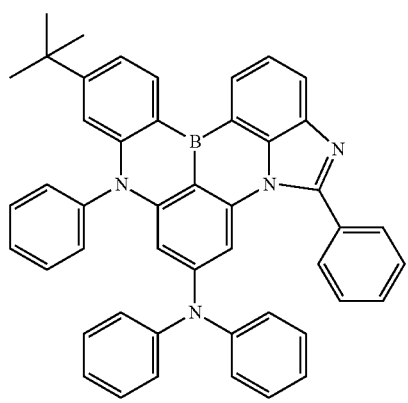
48
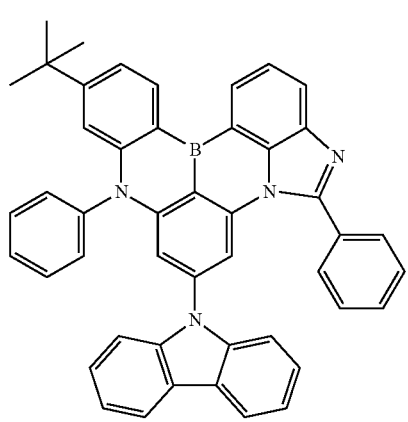
49
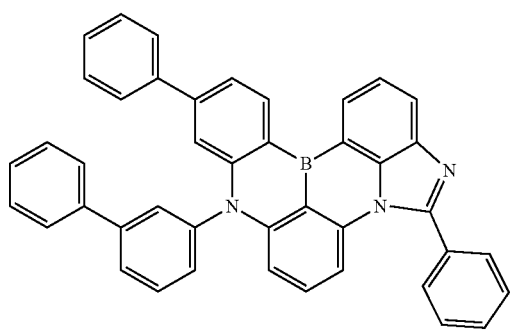
50
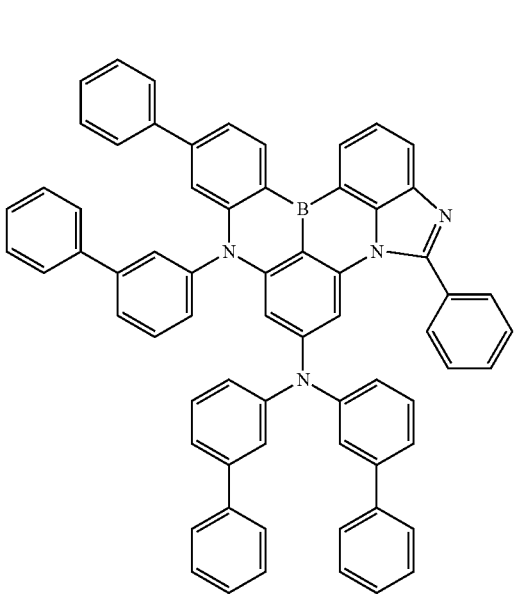
51
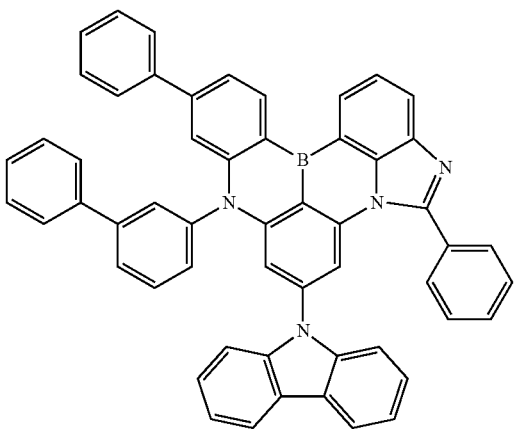

52
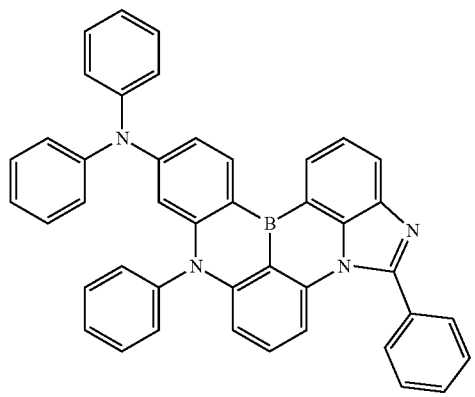
53
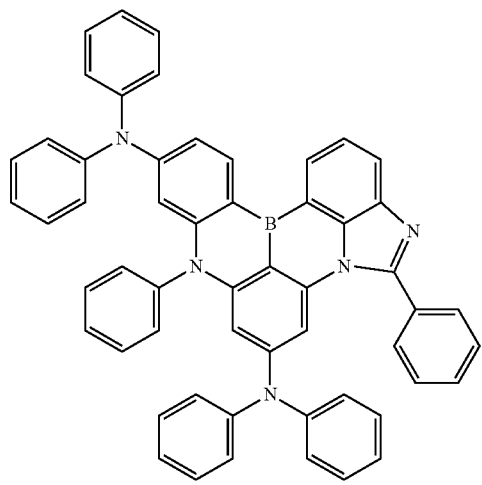
54
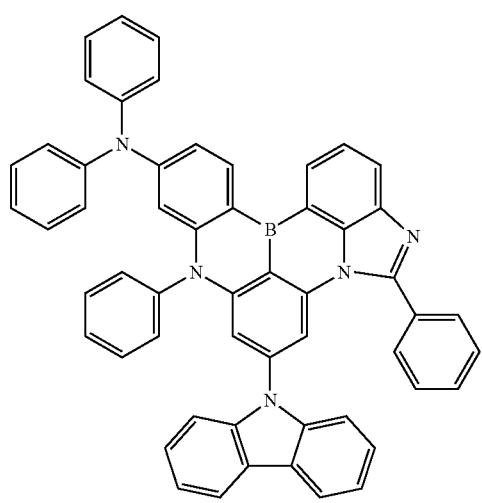
55
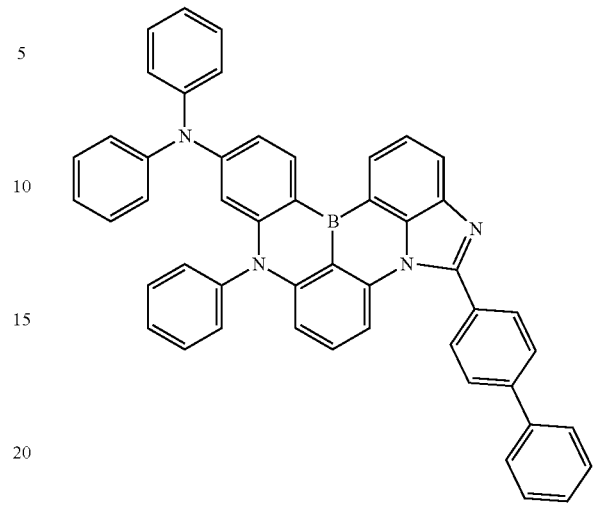
56
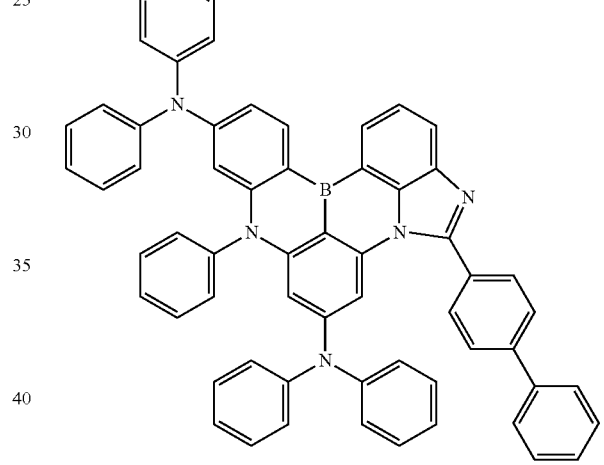
57
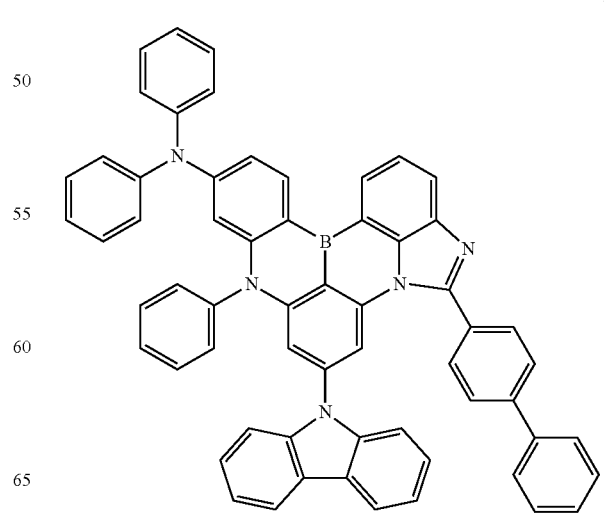

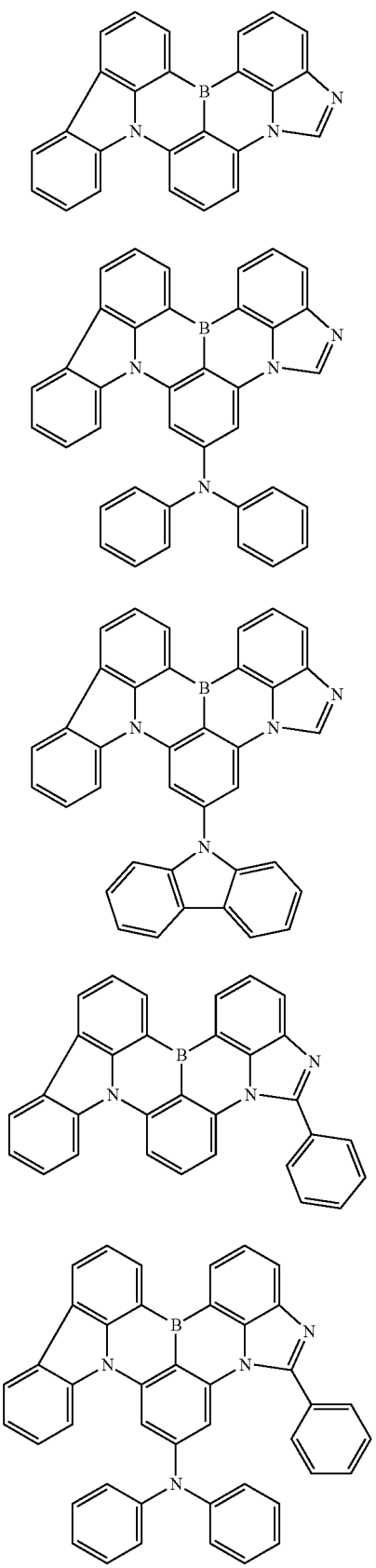
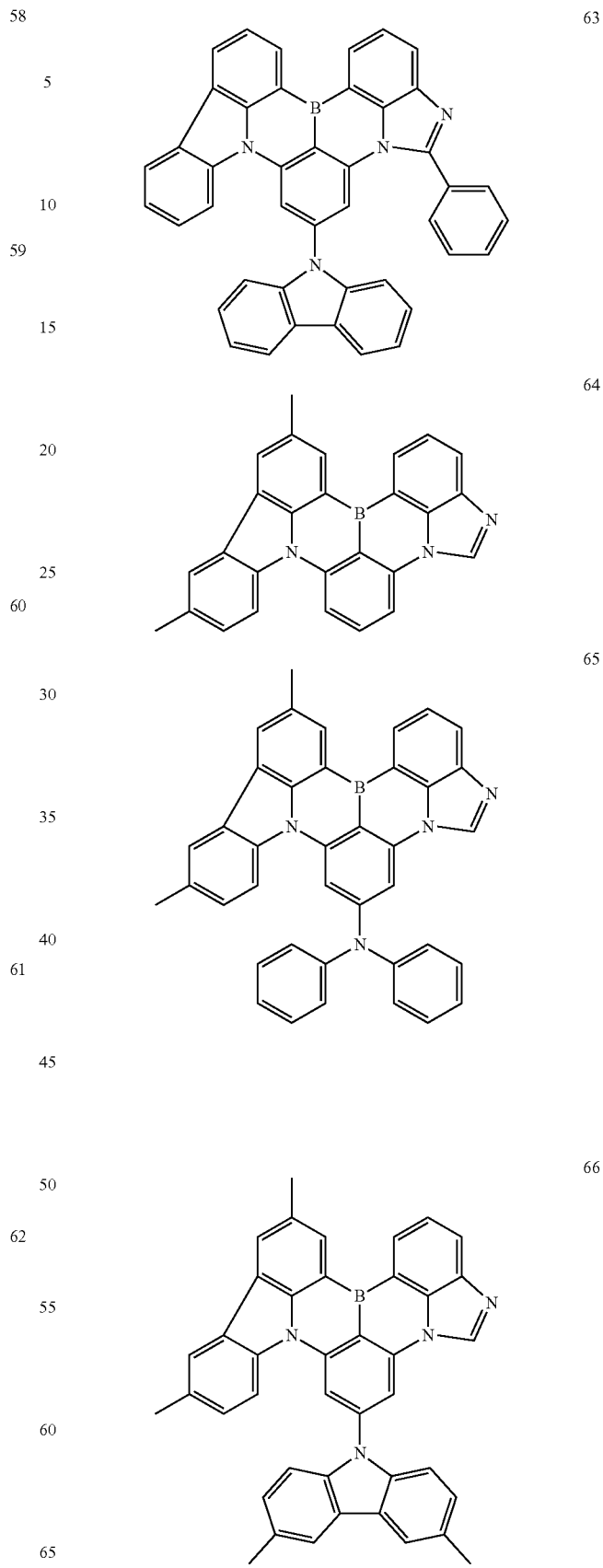

35
-continued
67
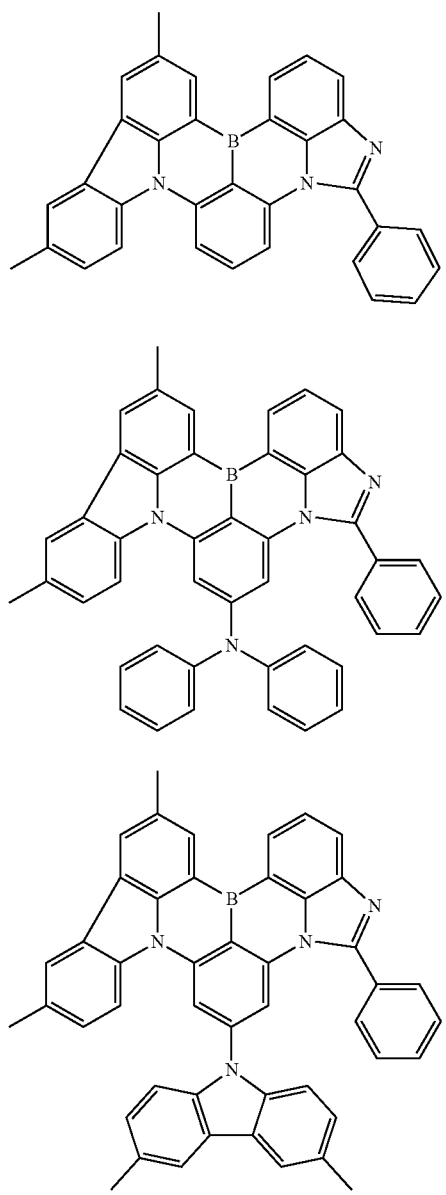
68
69
36
-continued
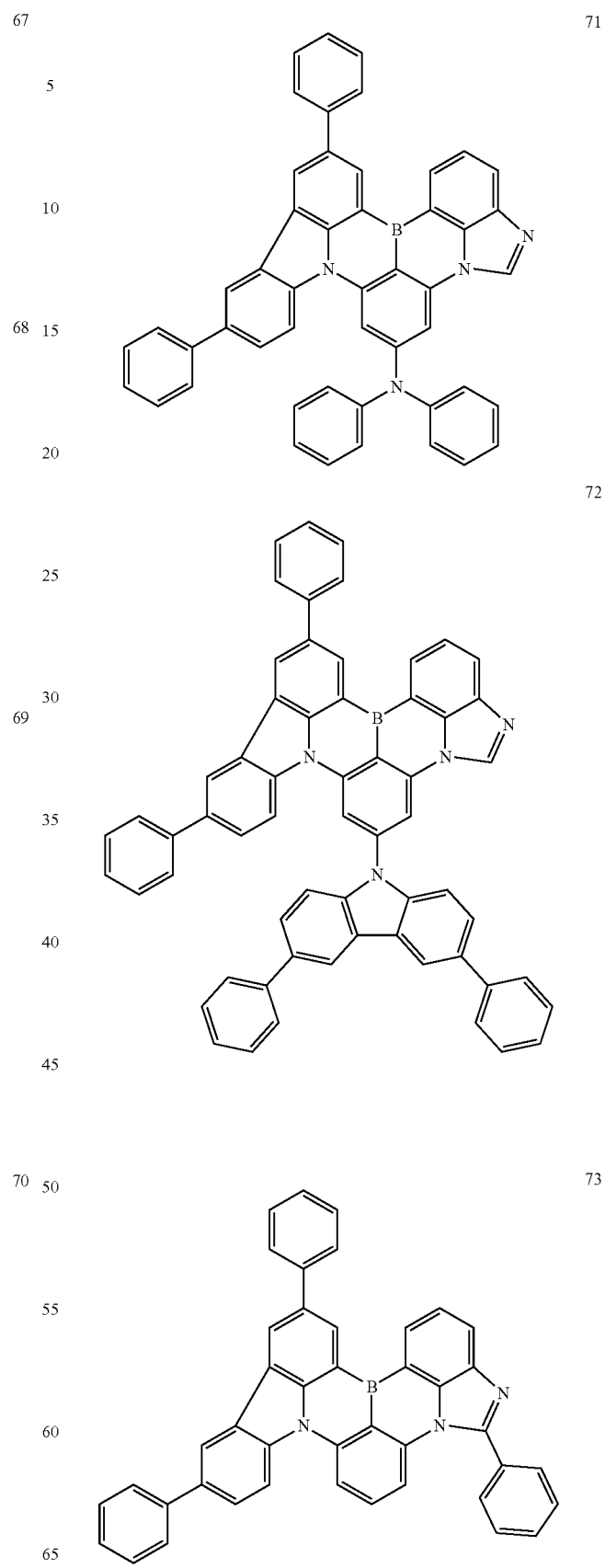
71
72
70
73

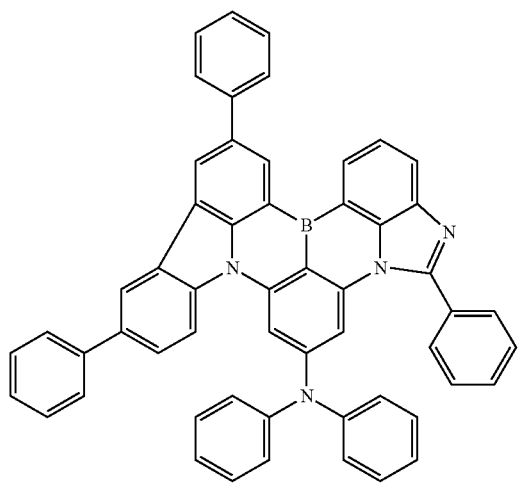
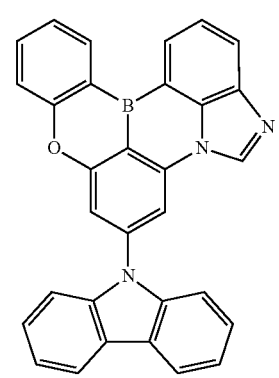
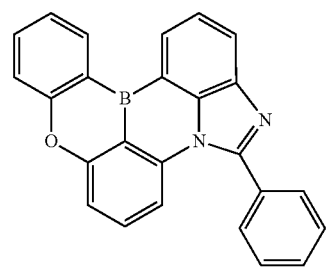
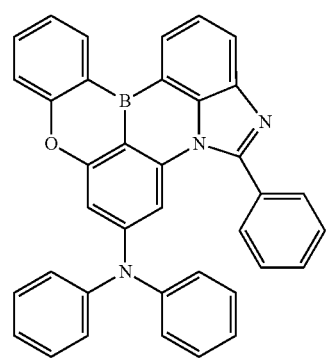
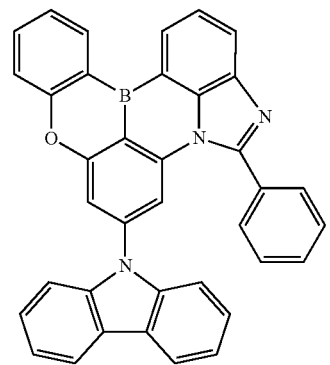

-continued
82
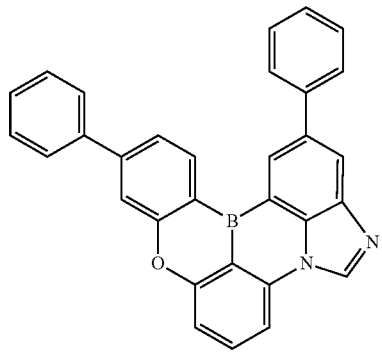
83
85
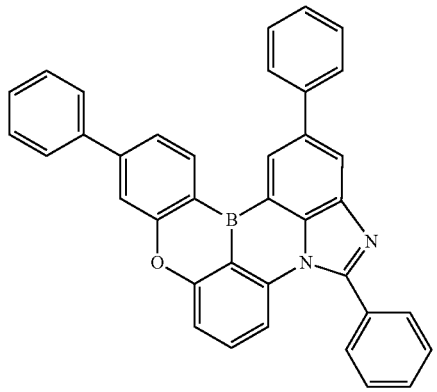
86
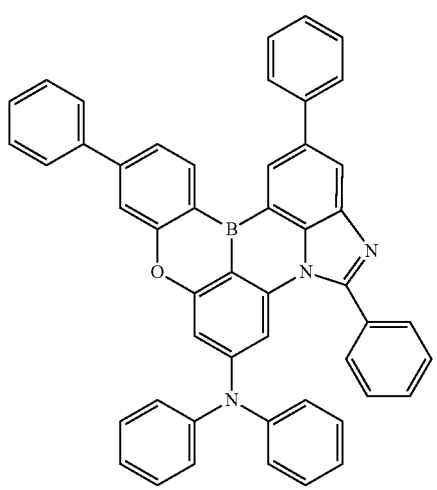
84
87
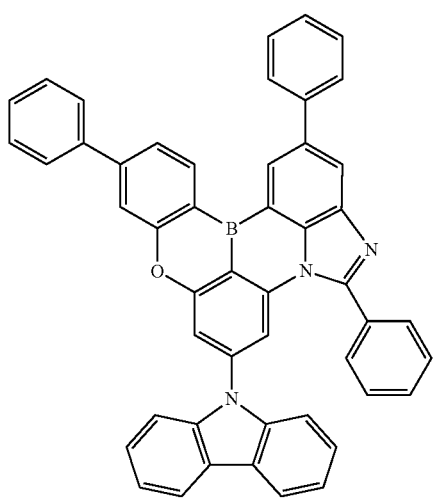

88
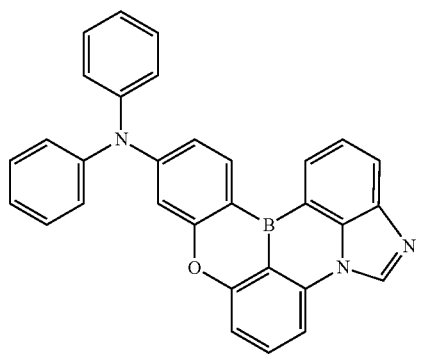
89
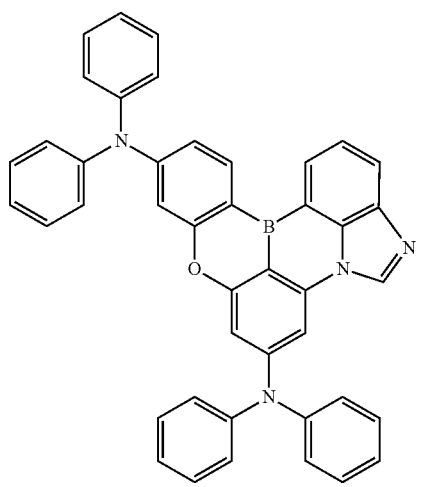
90
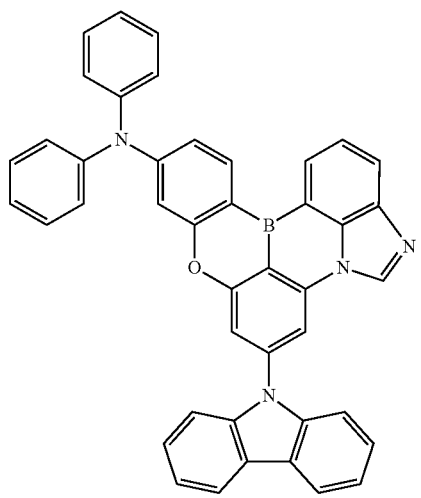
91
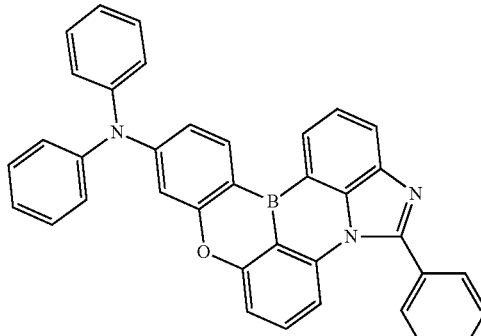
92
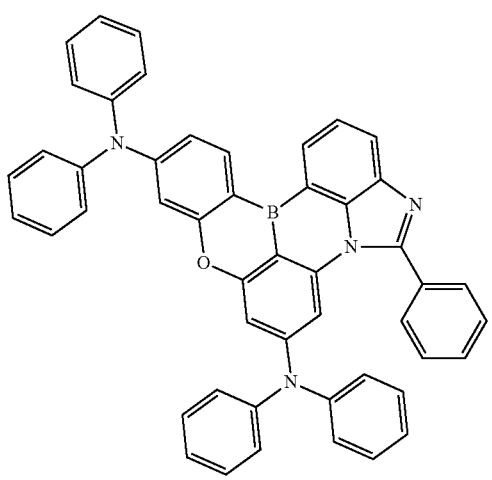
93
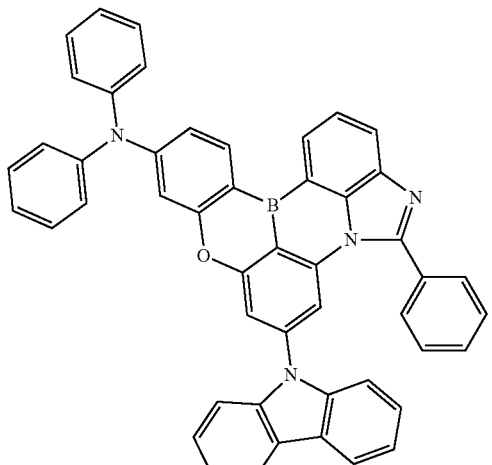
94
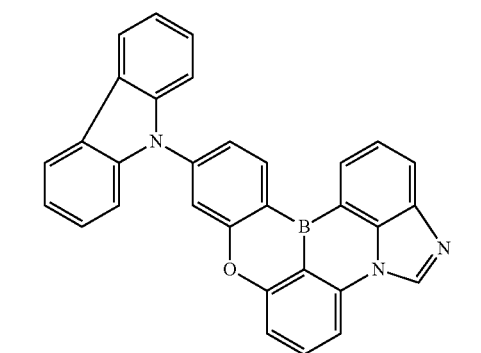

95
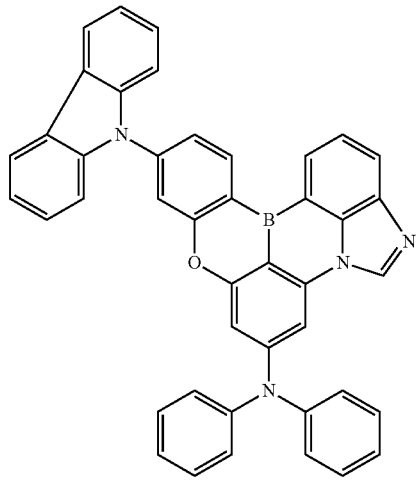
96
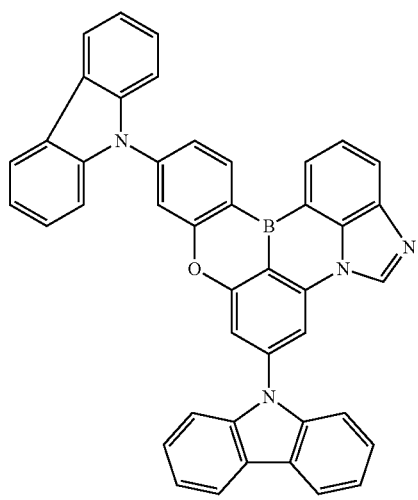
97
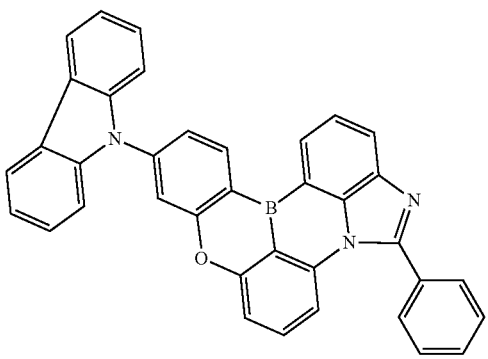
98
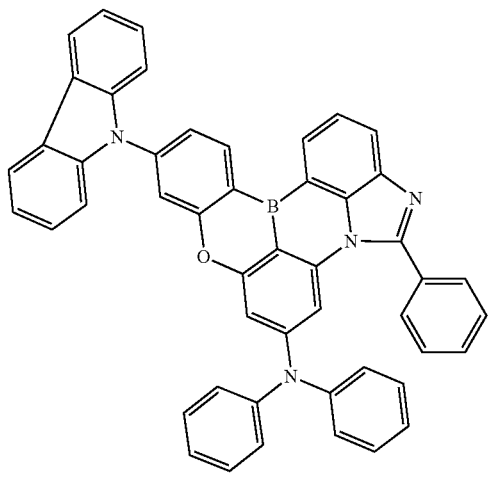
99
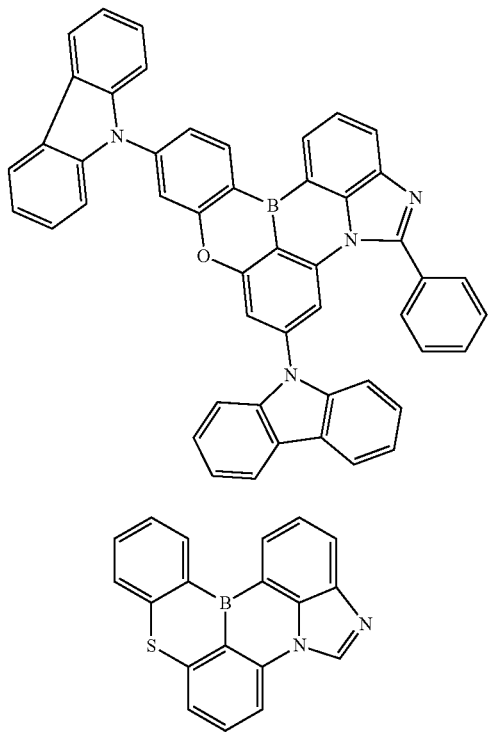
100
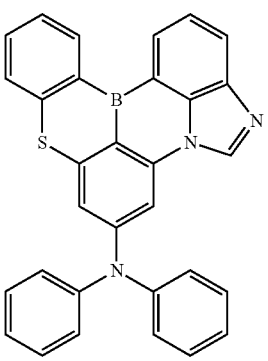
101

102
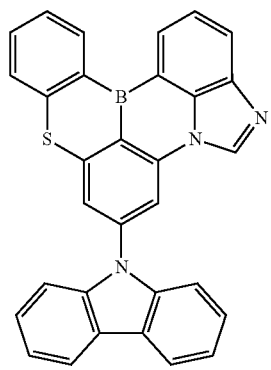
103
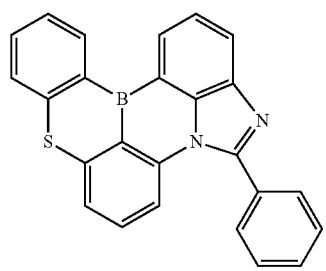
104
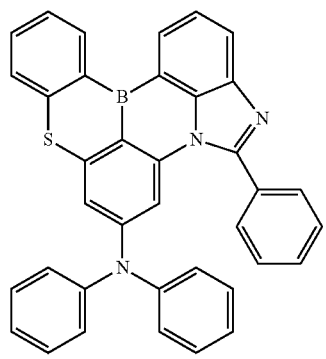
105
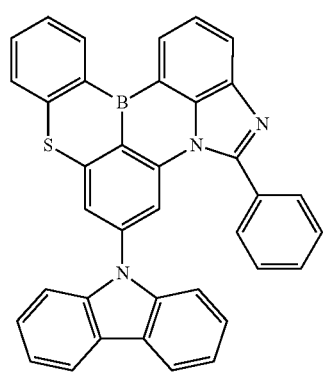
106
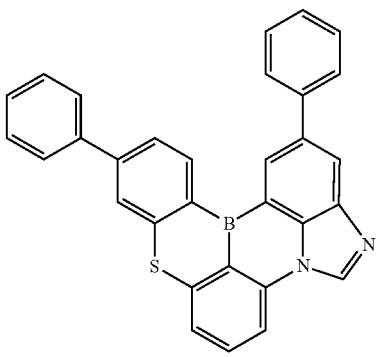
107
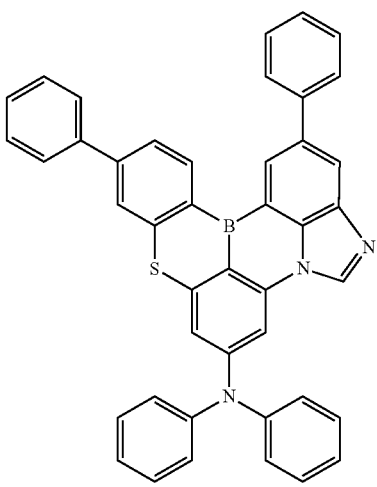
108
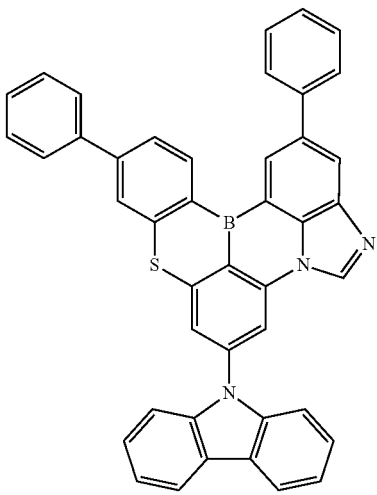

109
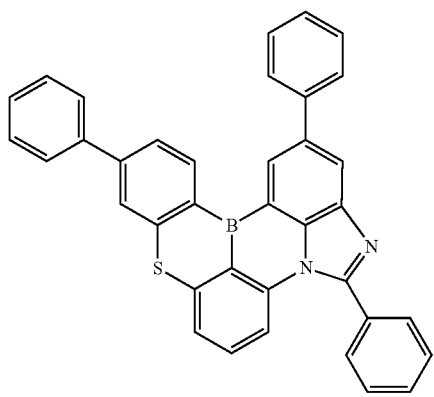
110
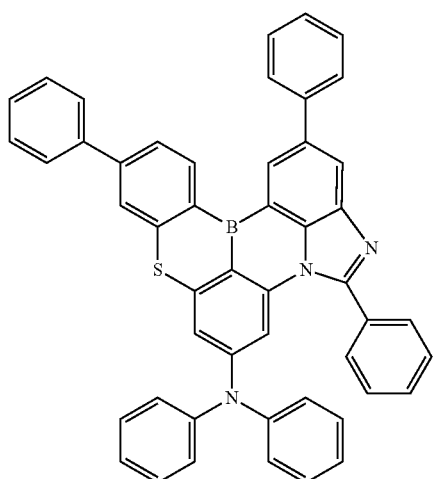
111
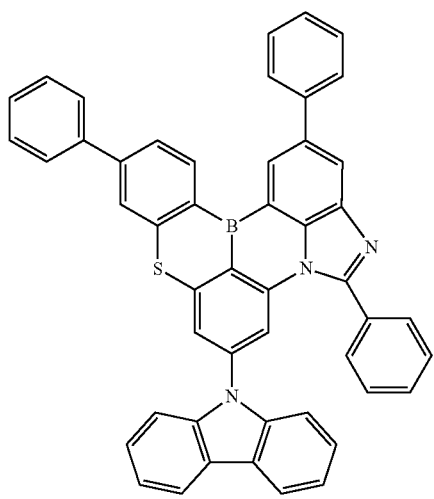
112
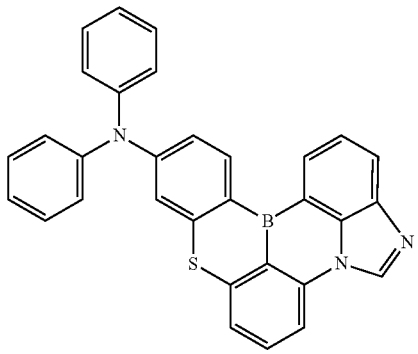
113
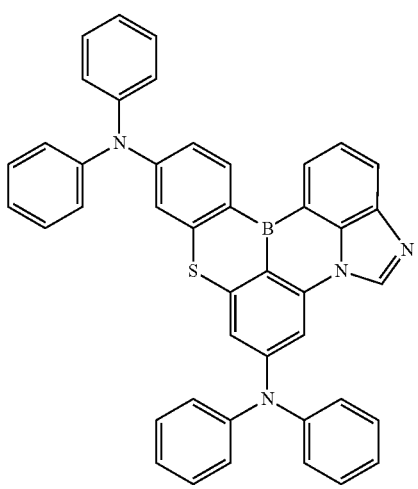
114
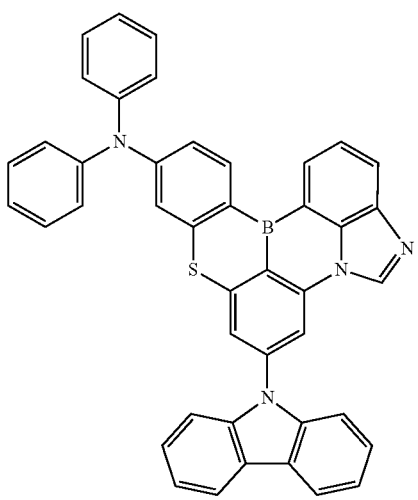

115
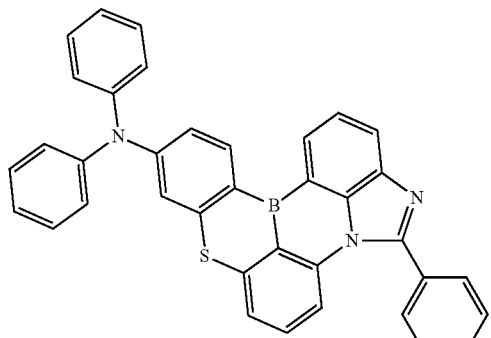
116
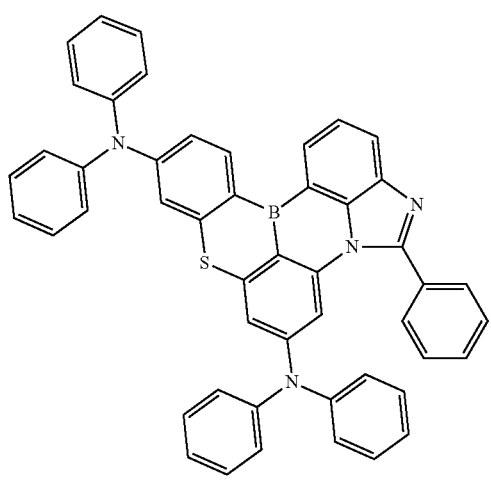
117
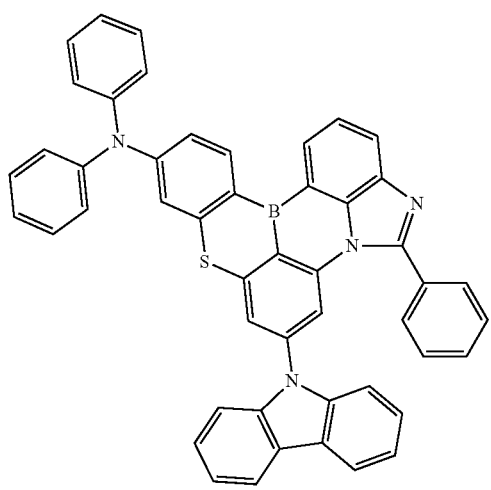
118
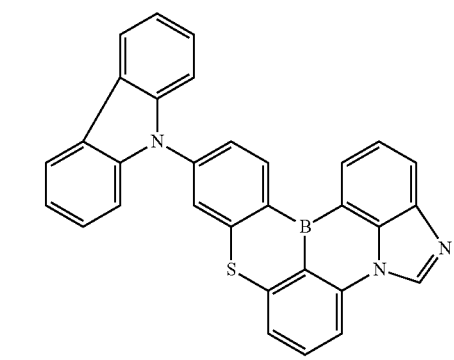
119
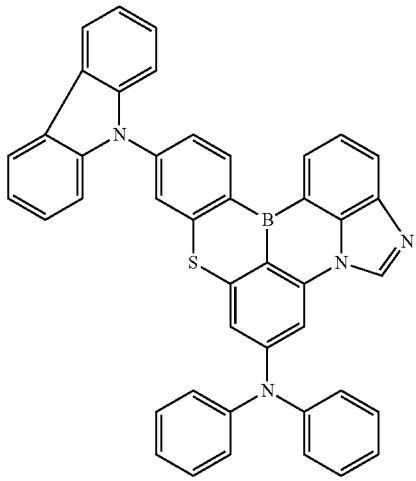
120
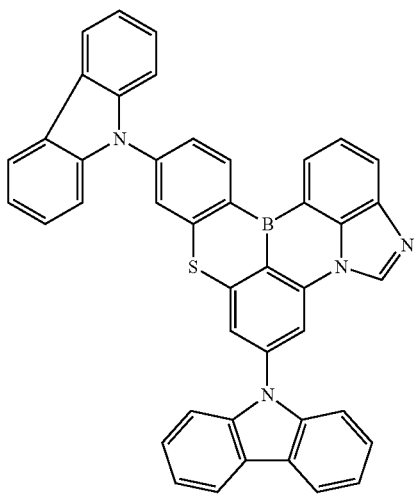
121
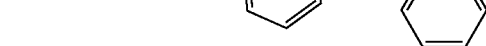

122
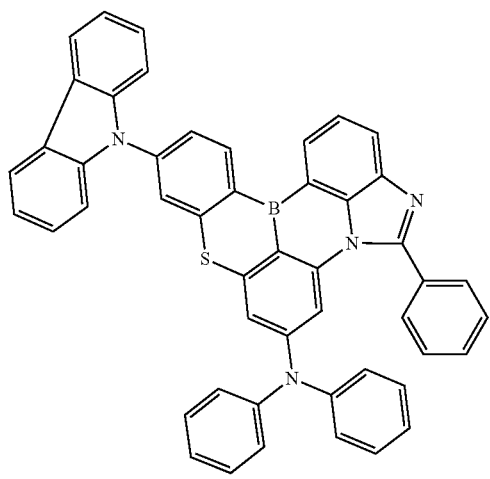
123
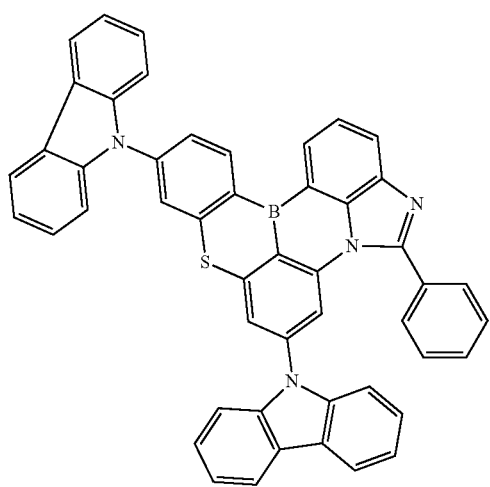
124
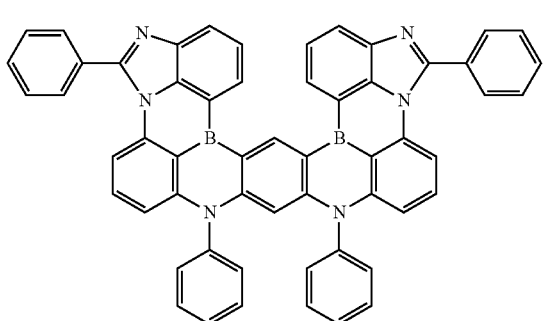
125
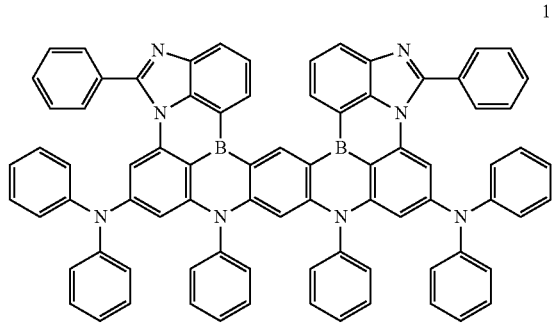
126
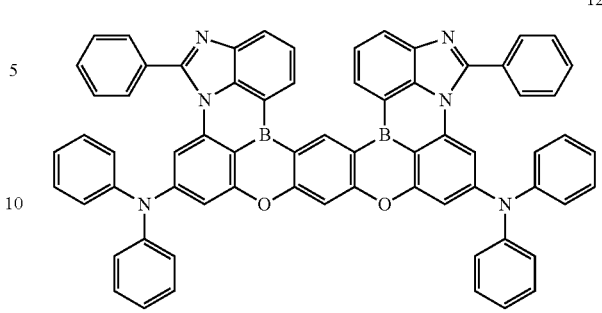
127
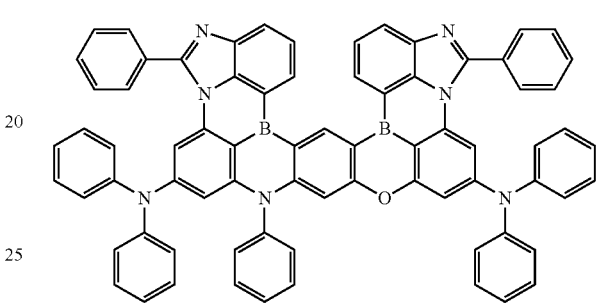
128
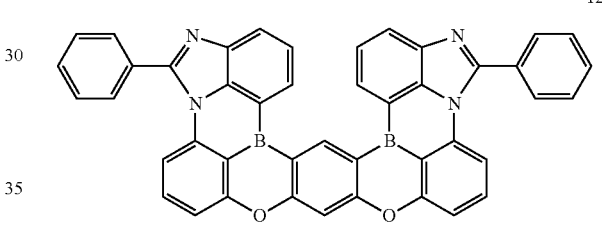
129
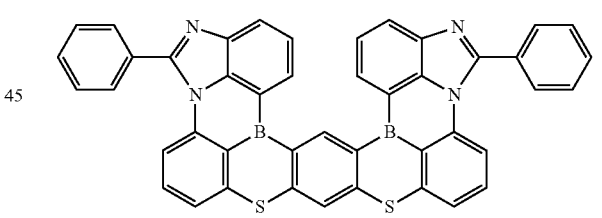
130
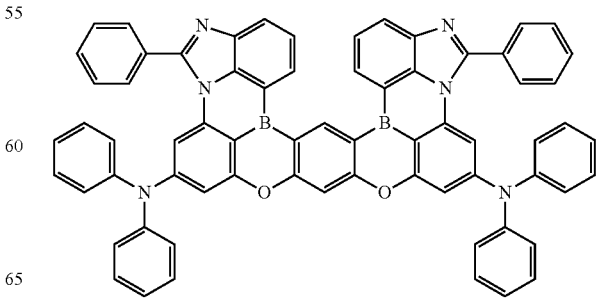

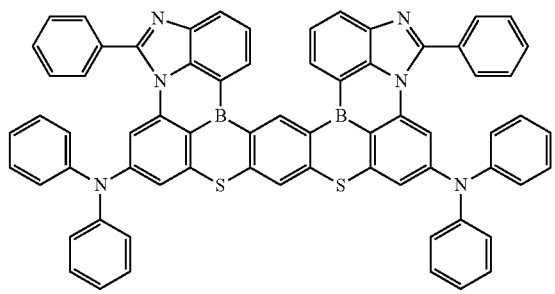
131
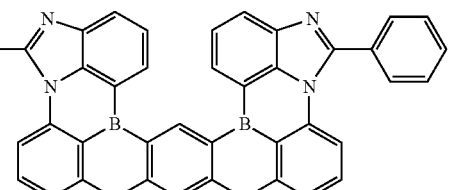
136
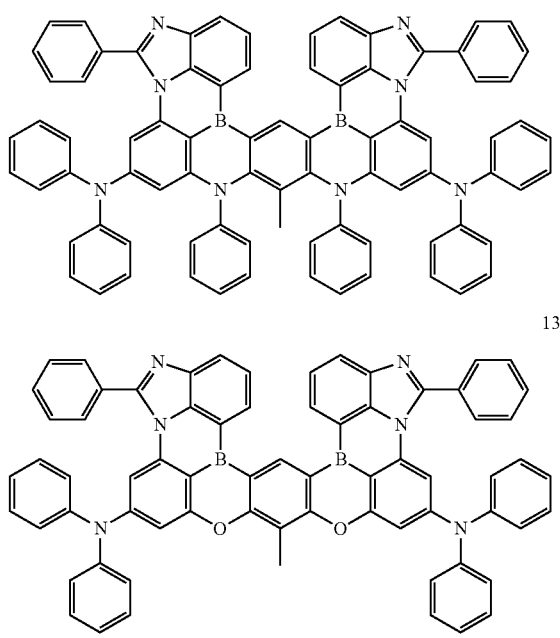
132
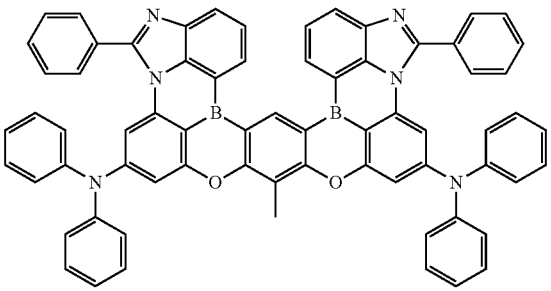
137
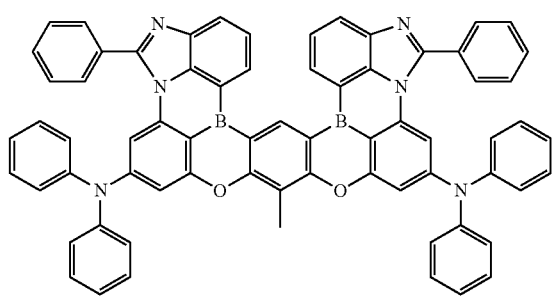
133
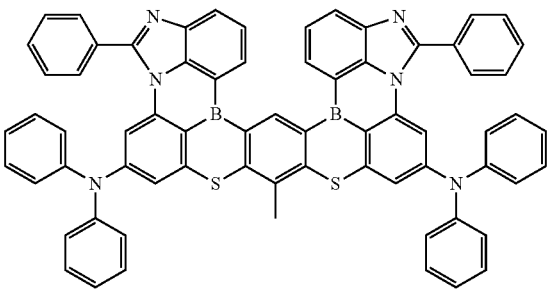
138
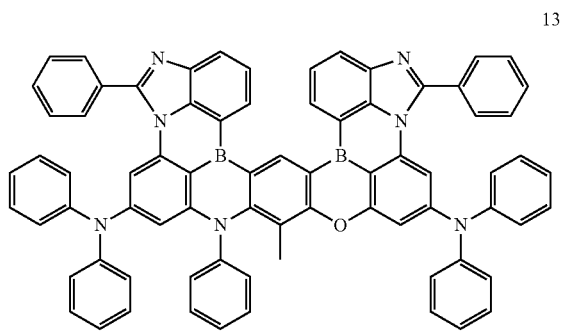
134
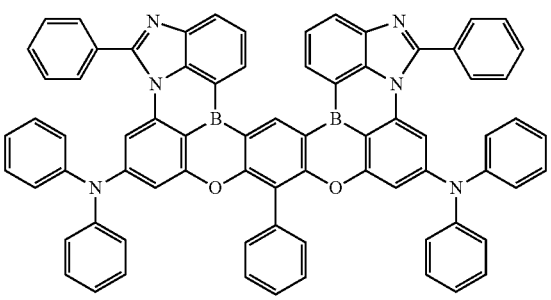
139
135
140

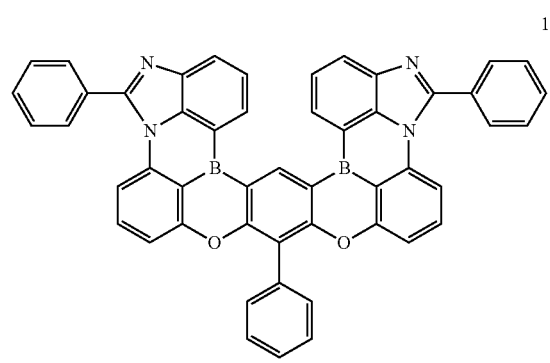
141
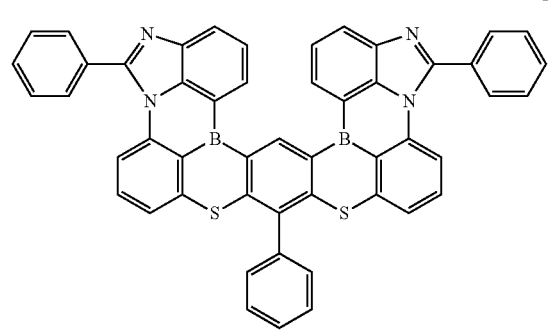
142
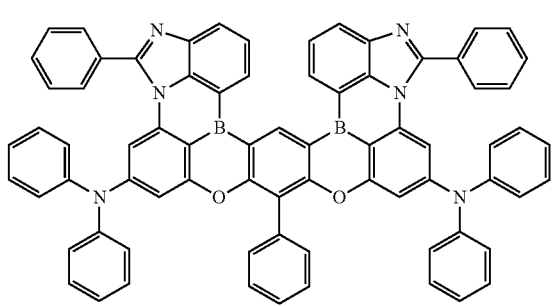
143
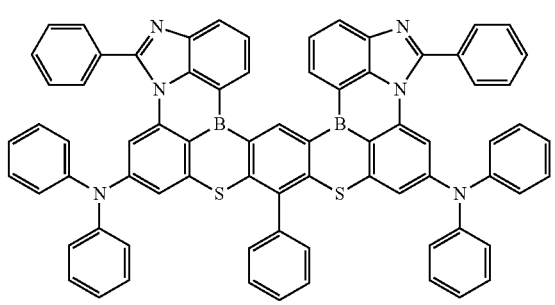
144
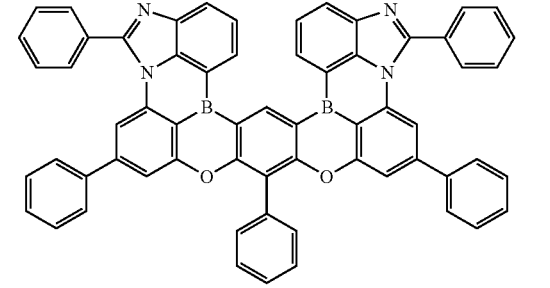
145
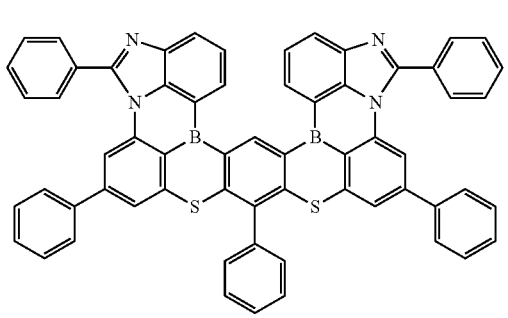
146
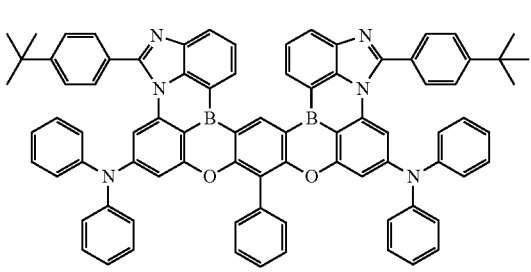
147
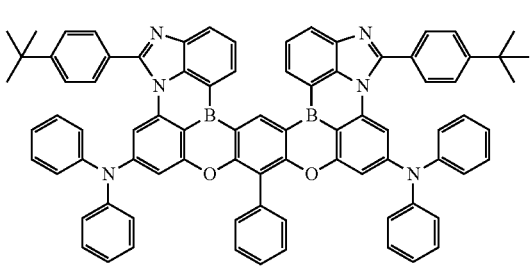
148
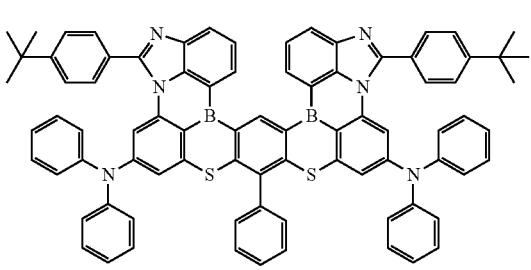
149
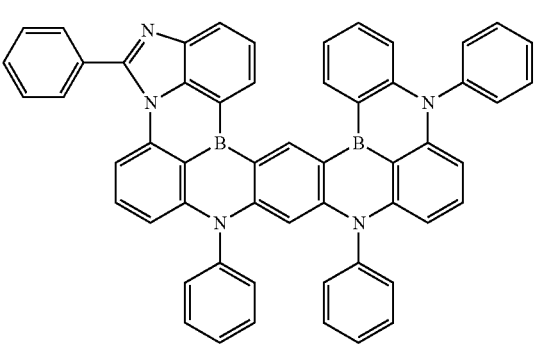
150

151
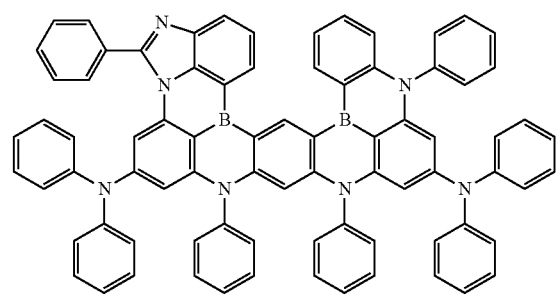
152
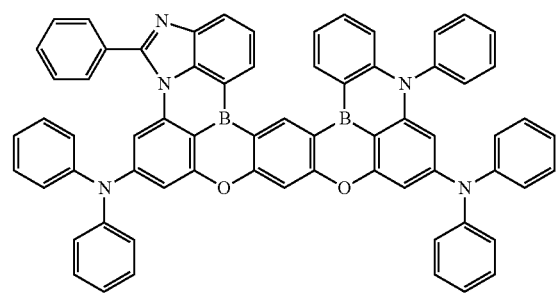
153
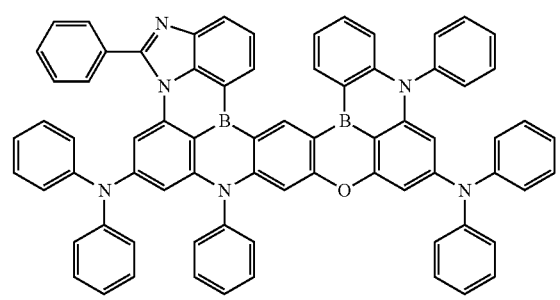
154
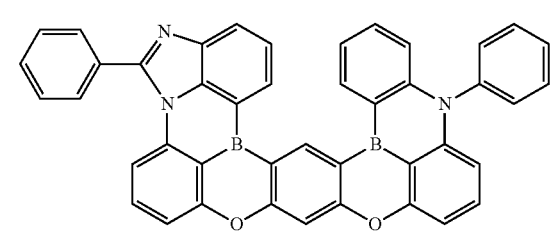
155
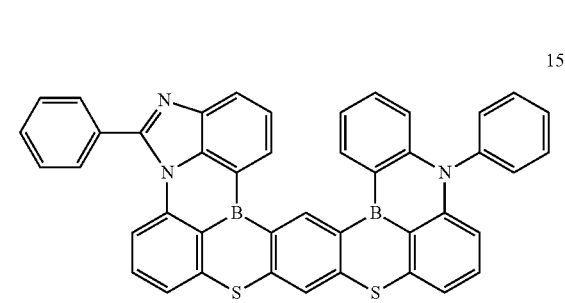
156
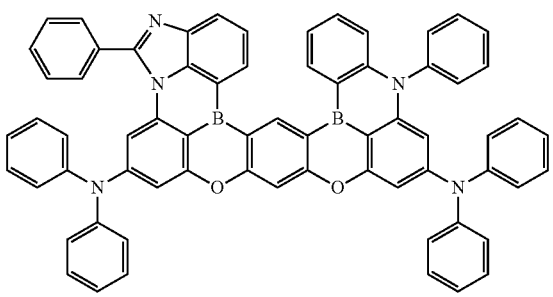
157
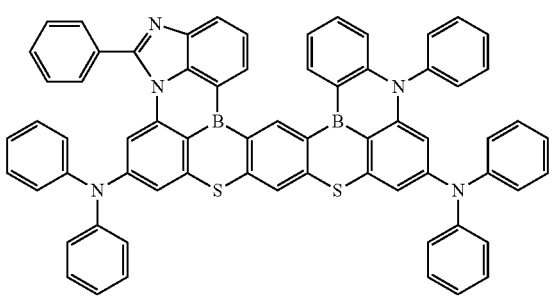
158
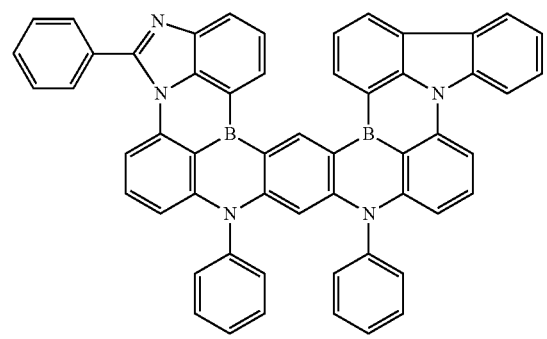
159

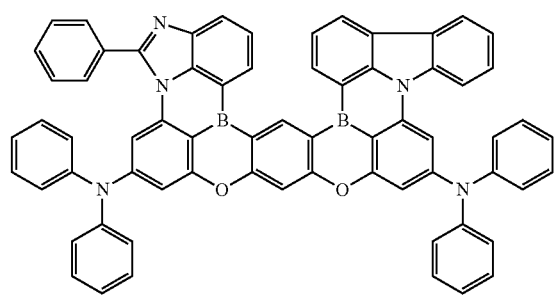
160
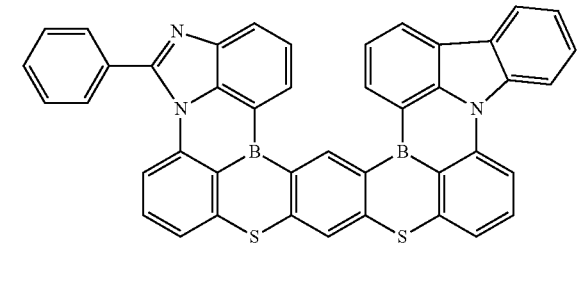
163
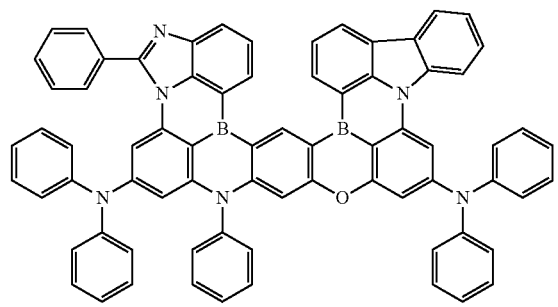
161
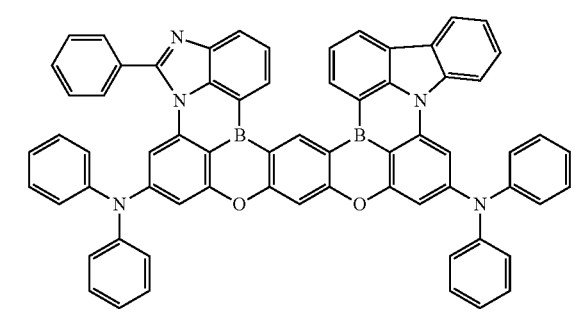
164
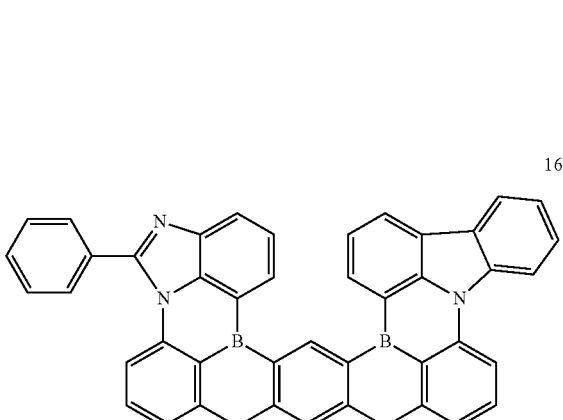
162
165
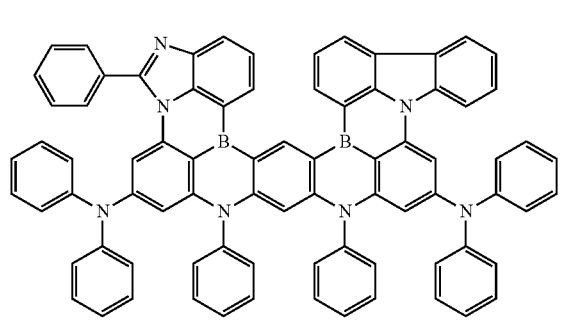
167
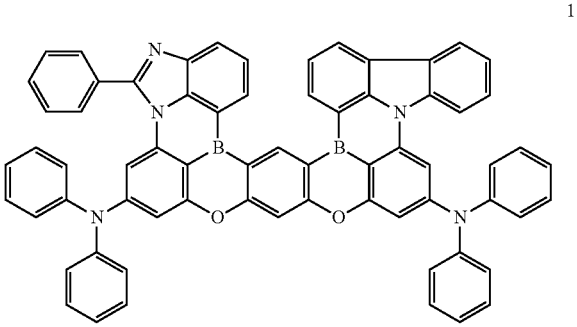
168

-continued
169
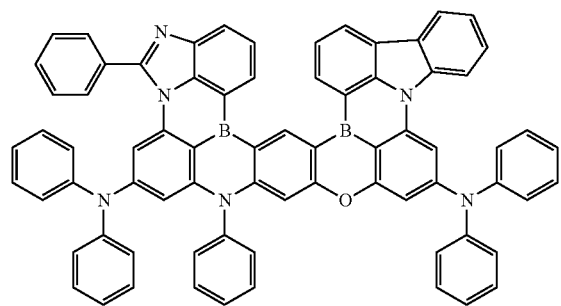
170
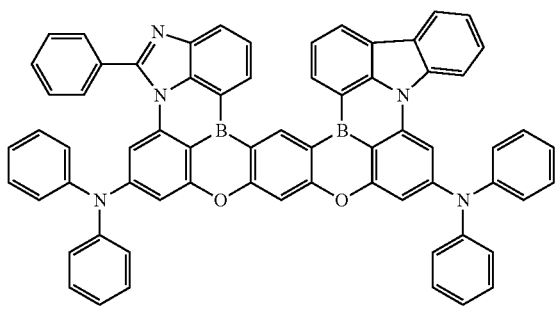
171
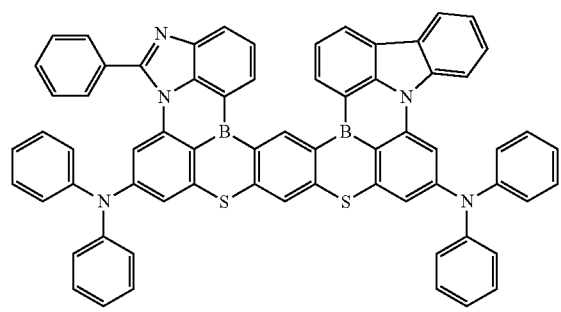
172
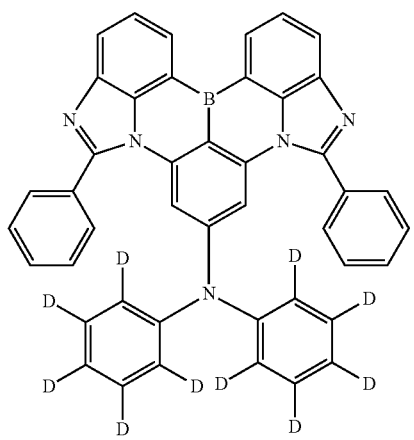
173
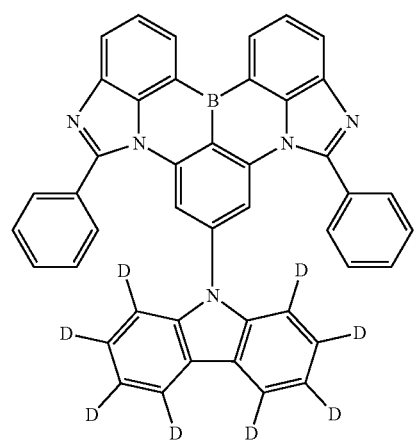
174
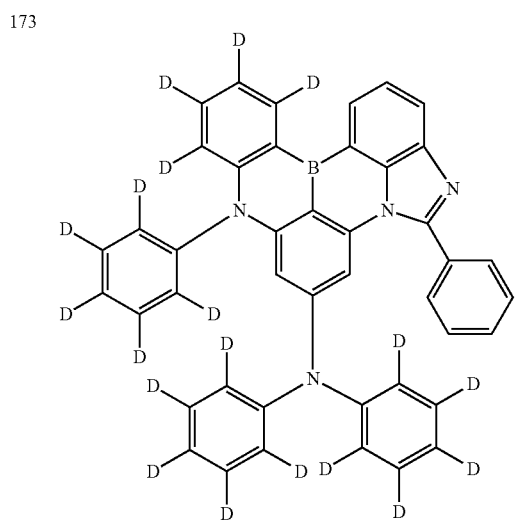

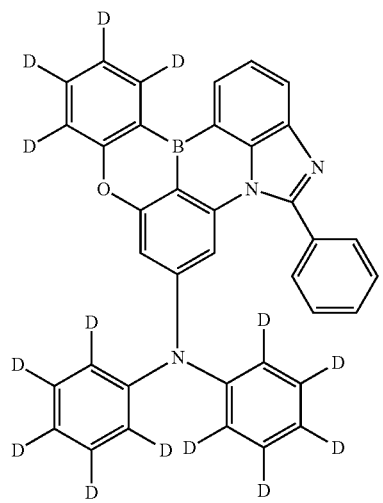
175
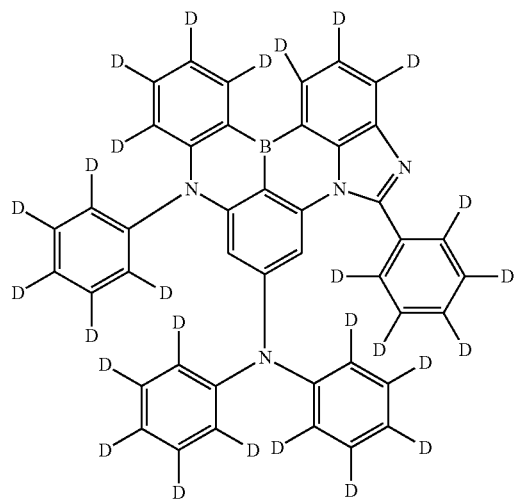
176
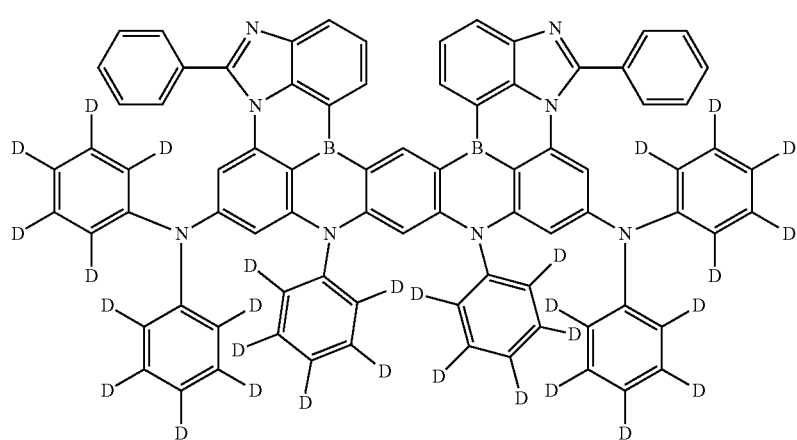
177
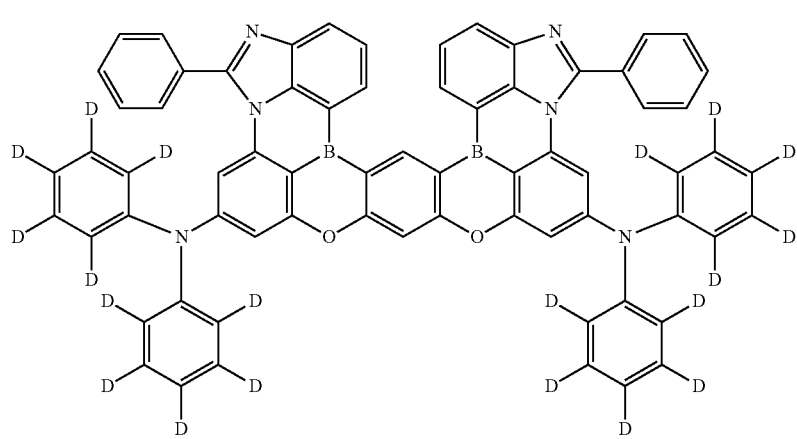
178

-continued

179

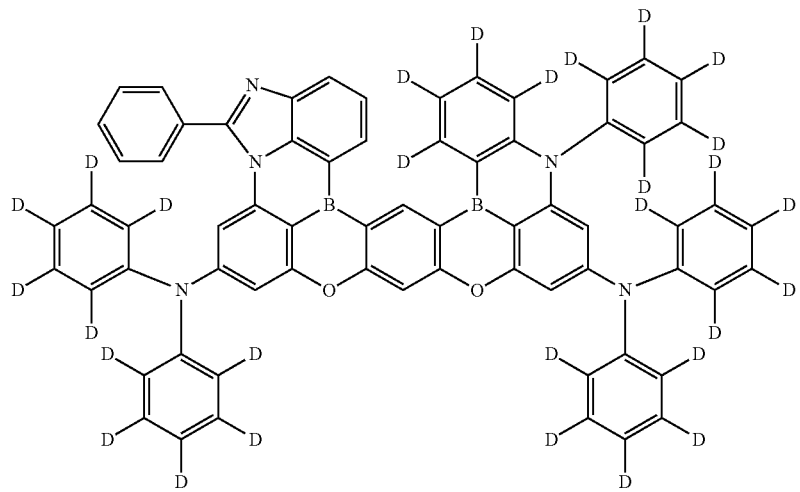

The above-described nitrogen-containing compound may be used in the organic electroluminescence device 10 of an embodiment to improve light emission efficiency and service life of the organic electroluminescence device. The above-described nitrogen-containing compound may be used in the emission layer EML of the organic electroluminescence device 10 of an embodiment to improve light emission efficiency and service life of the organic electroluminescence device.

In an embodiment, the emission layer EML may be a delayed fluorescence emission layer including a first compound and a second compound, and the nitrogen-containing compound of an embodiment represented by Formula 1 may be included in the first compound of the emission layer EML. For example, the first compound may be a dopant, and the second compound may be a host.

In an embodiment, the host may be a host for emitting delayed fluorescence, and the dopant may be a dopant for emitting delayed fluorescence. The nitrogen-containing compound of an embodiment represented by Formula 1 may be included as a dopant material in the emission layer EML. For example, the nitrogen-containing compound, of an embodiment represented by Formula 1 may be used as a TADF dopant.

Although not shown in the drawings, the organic electroluminescence device 10 of an embodiment may include multiple emission layers. The emission layers may be sequentially stacked. For example, the organic electroluminescence device 10 including multiple emission layers may emit white light. The organic electroluminescence device including multiple emission layers may be an organic electroluminescence device having a tandem structure. When the organic electroluminescence device 10 includes multiple emission layers, at least one emission layer EML may include the nitrogen-containing compound according to the inventive concept as described above.

The emission layer EML may further include a dopant, and a known material may be used as the dopant. For example, at least any one of styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and the derivatives thereof (for example, 2,5,8,11-tetra-t-butylperylene (TBPe)), pyrene and the derivatives thereof (for example, 1,1-dipyrene, 1,4-dipyrenylbenzene, 1,4-bis(N,N-diphenylamino)pyrene, and 1,6-bis(N,N-diphenylamino)pyrene), 2,5,8,11-tetra-t-butylperylene (TBP), or 1,3,5-tris(N-phenylbenzimidazole-2-yl)benzene (TPBi) may be used as a dopant, but is not limited thereto.

The emission layer EML may further include a general material known in the art as a host material. For example, the emission layer EML may include, but is not limited to as a host material, at least one of tris(8-hydroxyquinolino)aluminum (Alq$_3$), bis[2-(diphenylphosphino)phenyl]ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), poly(n-vinylcabazole) (PVK), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH-2), hexaphenylcyclotrisiloxane (DPSiO$_3$), octaphenylcyclotetra siloxane (DPSiO$_4$), 2,8-bis(diphenylphosphoryl)dibenzofuran (PPF), and 1,3,5-tris(1-phenyl-1H-benzo[d]imidazole-2-yl)benzene (TPBi).

When the emission layer EML emits red light, the emission layer EML may further include, for example, a fluorescent material including tris(dibenzoylmethanato) phenanthoroline europium (PBD:Eu(DBM)$_3$(Phen)) or perylene. When the emission layer EML emits red light, a dopant included in the emission layer EML may be, for example, a metal complex such as bis(1-phenylisoquinoline) acetylacetonate iridium (PIQIr(acac)), bis(1-phenylquinoline) acetylacetonate iridium (PQIr(acac)), tris(1-phenylquinoline) iridium (PQIr) and octaethylporphyrin platinum (PtOEP), or an organometallic complex, rubrene and derivatives thereof, and 4-dicyanomethylene-2-(p-dimethylaminostyryl)-6-methyl-4H-pyran (DCM) and derivatives thereof.

When the emission layer EML emits green light, the emission layer EML may further include, for example, a fluorescent material including tris(8-hydroxyquinolino)aluminum (Alq$_3$). When the emission layer EML emits green light, a dopant included in the emission layer EML may be, for example, selected from among a metal complex such as fac-tris(2-phenylpyridine) iridium (Ir(ppy)$_3$) or an organometallic complex, and coumarins and derivatives thereof.

When the emission layer EML emits blue light, the emission layer EML may further include, for example, a fluorescent material including any one selected from the group consisting of spiro-DPVBi, spiro-6P, distyryl-benzene (DSB), distyryl-arylene (DSA), polyfluorene (PFO)-based polymer and poly(p-phenylene vinylene (PPV)-based polymer. When the emission layer EML emits blue light, a dopant included in the emission layer EML may be, for example, selected from among a metal complex such as (4,6-F2ppy) 2Irpic or an organometallic complex, perylene and derivatives thereof.

In the organic electroluminescence device 10 of an embodiment illustrated in FIGS. 1 to 4, the electron transport region ETR is disposed on the emission layer EML. The electron transport region ETR may include at least one of a hole blocking layer HBL, an electron transport layer ETL, or an electron injection layer EIL, but an embodiment is not limited thereto.

The electron transport region ETR may have a single layer formed of a single material, a single layer formed of different materials, or a multilayer structure including multiple layers formed of different materials.

For example, the electron transport region ETR may have a single layer structure of an electron injection layer EIL or an electron transport layer ETL, and may have a single layer structure formed of an electron injection material and an electron transport material. The electron transport region ETR may have a single layer structure formed of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, in a range of about 1000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the inventive concept is not limited thereto, and the electron transport region may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), or a mixture thereof. The thickness of the electron transport layers ETL may be in a range of about 100 Å to about 1,000 Å. For example, the thickness of the electron transport layers ETL may be in a range of about 150 Å to about 500 Å. If the thickness of the electron transport layers ETL satisfies the above-described range, satisfactory electron transport characteristics may be obtained without a substantial increase in driving voltage.

If the electron transport region ETR includes the electron injection layer EIL, the electron transport region ETR may be formed using a metal halide such as LiF, NaCl, CsF, RbCl, and RbI, a lanthanide metal such as Yb, a metal oxide such as Li$_2$O and BaO, or lithium quinolate (LiQ), etc., but the inventive concept is not limited thereto. The electron injection layer EIL may also be formed of a mixture material of an electron transport material and an insulating organometal salt. The organo-metal salt may be a material having an energy band gap of about 4 eV or more. Specifically, the organo-metal salt may include, for example, metal acetates, metal benzoates, metal acetoacetates, metal acetylacetonates or metal stearates. The thickness of the electron injection layers EIL may be in a range of about 1 Å to about 100 Å. For example, the thickness of the electron injection layers EIL may be in a range of about 3 Å to about 90 Å. If the thickness of the electron injection layers EIL satisfies the above-described range, satisfactory electron injection properties may be obtained without a substantial increase in driving voltage.

The electron transport region ETR may include a hole blocking layer HBL as described above. The hole blocking layer HBL may include, but is not limited to, for example, at least one of 2,9-dimethyl-4,7-diphenyl-1,10-phenanthroline (BCP), bis[2-(diphenylphosphino)phenyl]ether oxide (DPEPO), or 4,7-diphenyl-1,10-phenanthroline (Bphen).

The second electrode EL2 is provided on the electron transport region ETR. The second electrode EL2 may be a common electrode or a negative electrode. The second electrode EL2 may be a transmissive electrode, a transflective electrode, or a reflective electrode. When the second electrode EL2 is the transmissive electrode, the second electrode EL2 may be formed of transparent metal oxides, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, In, Sn, Zn, an oxide thereof, a compound thereof, or a mixture thereof (e.g., a mixture of Ag and Mg). The second electrode EL2 may have a multi-layer structure including a reflective layer or a transflective layer formed of the above-described materials, and a transparent conductive layer formed of ITO, IZO, ZnO, ITZO, etc.

Although not shown, the second electrode EL2 may be connected to an auxiliary electrode. When the second electrode EL2 is connected to the auxiliary electrode, the resistance of the second electrode EL2 may decrease.

Referring to FIG. 4, the organic electroluminescence device 10 according to an embodiment may further include a capping layer CPL on the second electrode EL2. The capping layer CPL may include, for example, α-NPD, NPB, TPD, m-MTDATA, Alq$_3$, CuPc, N4,N4,N4',N4'-tetra (biphenyl-4-yl) biphenyl-4,4'-diamine (TPD15), 4,4',4"-Tris (carbazol sol-9-yl) triphenylamine (TCTA), N, N'-bis(naphthalen-1-yl), etc.

The organic electroluminescence device 10 according to an embodiment of the inventive concept may include the nitrogen-containing compound represented by Formula 1 as described above to thereby exhibit excellent luminous light emission efficiency and long service life characteristics. The organic electroluminescence device 10 of an embodiment may achieve high efficiency and long service life characteristics in a blue wavelength region.

Hereinafter, with reference to Examples and Comparative Examples, a compound according to an embodiment of this inventive concept and an organic electroluminescence device of an embodiment will be described in detail. The Examples shown below are illustrated only for the understanding of this inventive concept, and the scope of the inventive concept is not limited thereto.

EXAMPLES

Synthesis of Nitrogen-Containing Compound

In the following descriptions, a synthesis method of a nitrogen-containing compound is one example, but the synthesis method of the nitrogen-containing compound according to an embodiment of the inventive concept is not limited to the Examples below.

1. Synthesis of Compound 5

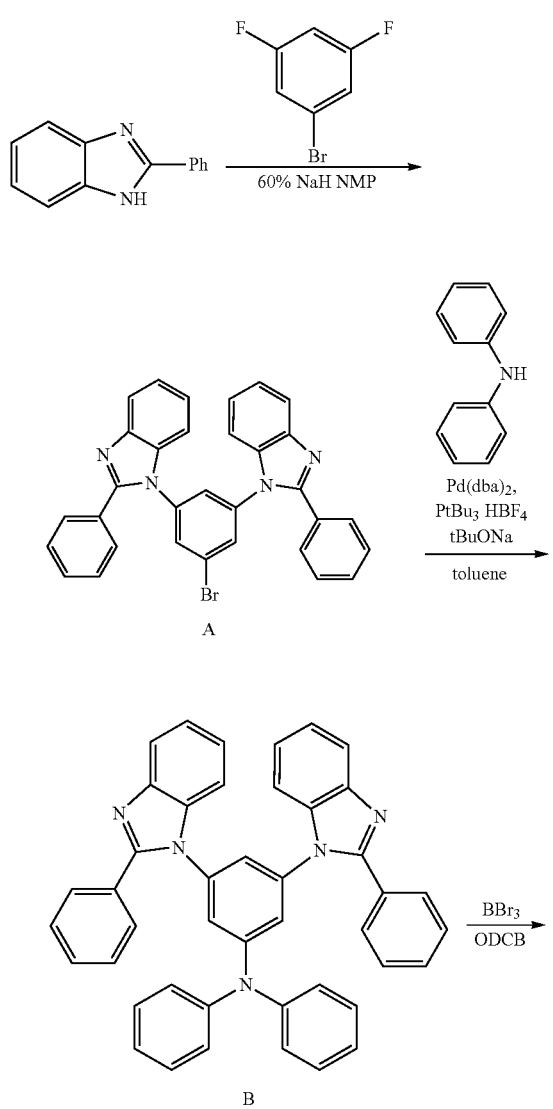

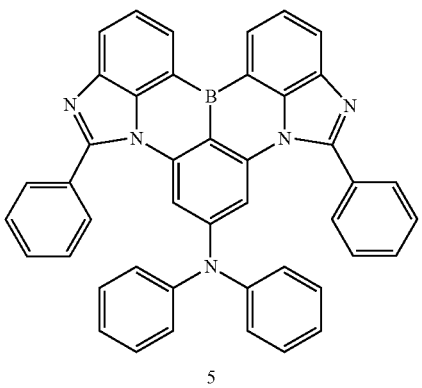

5

Synthesis of Compound A 2-phenyl-1H-benzo[d]imidazole (15.1 g, 77.7 mmol) and 1-bromo-3,5-difluorobenzene (5.0 g, 25.9 mmol) were added to 1-methyl-2-pyrrolidinone (NMP, 200 ml), and 60% NaH (5.18 g, 130 mmol) were added thereto under argon at room temperature. When generation of hydrogen was stopped, the mixture was stirred at about 130° C. for about 8 hours. The mixture was standing to cool and liquid-separated by adding water and toluene. The organic layer was concentrated, purified by column chromatography (silica gel), concentrated, filtered out and washed with hexane to obtain Compound A (10.8 g, yield 77%).

Synthesis of Compound B

Compound A (10.0 g, 18 mmol), bis(dibenzylideneacetone)palladium(0) (Pd(dba)$_2$, 0.64 g, 1.1 mmol), tri-tert-butylphosphonium tetrafluorobora (P(tBu)$_3$HBF$_4$, 0.27 g, 1.48 mmol), and sodium tert-butoxide (tBuONa, 5.33 g, 55 mmol) were added to toluene (120 ml) and stirred at about 90° C. for about 6 hours. The mixture was standing to cool and liquid-separated by adding toluene and water. The organic layer was concentrated, purified by column chromatography (silica gel), concentrated, filtered out and washed with hexane to obtain Compound B (9.30 g, yield 80%).

Synthesis of Compound 5

Compound B (8.00 g, 13 mmol) was added to 1,2-dichlorobenzene (ODCB, 127 ml), and BBr$_3$ (12.7 g) was added thereto, and stirred at about 150° C. for about 20 hours. After standing to cool, triethylamine (TEA, 38.6 g) and toluene were added thereto, dissolved, and the resultant mixture was liquid-separated by adding water to concentrate an organic layer. The concentrated organic layer was purified by column chromatography (silica gel) to obtain Compound 5 (6.30 g, yield 78%). Sublimation purification (320° C., 3.7×10$^{-3}$ Pa) was carried out and device evaluation was performed. FAB-MS m/z=637 (M$^+$+1)

2. Synthesis of Compound 6

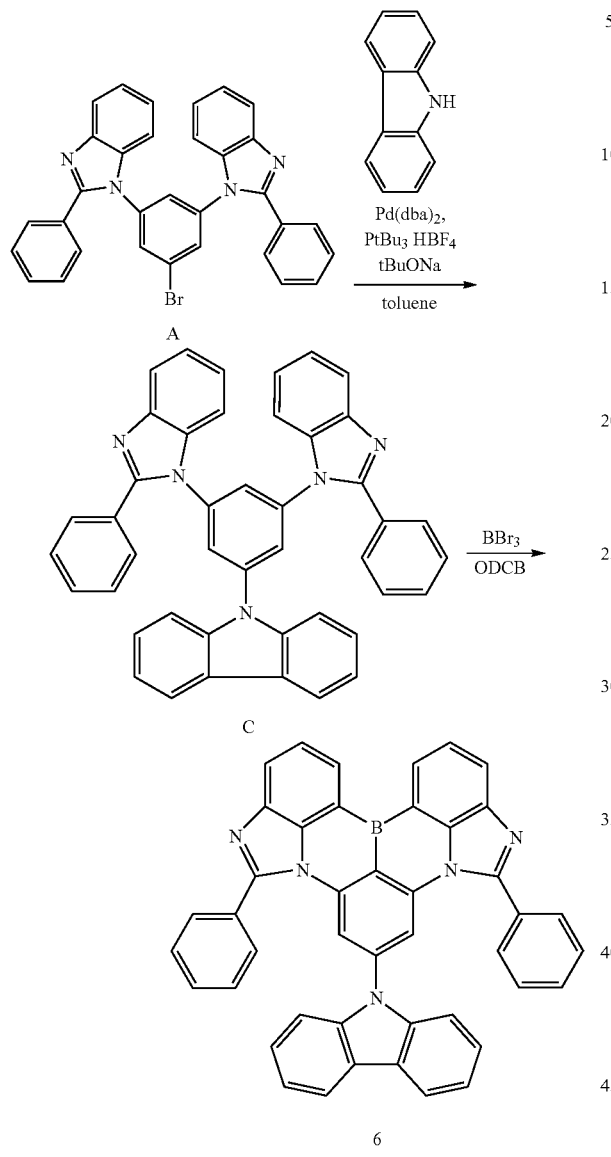

Synthesis of Compound C

As the reaction formula, Compound A (10.0 g, 18 mmol) and carbazole (6.67 g, 22 mmol) were reacted in the same manner as the synthesis of Compound B to synthesize Compound C (8.34 g, yield 72%).

Synthesis of Compound 6

As the reaction formula, Compound C (10.0 g, 15.9 mmol) was reacted in the same manner as the synthesis of Compound 5 to synthesize Compound 6 (3.54 g, yield 35%). Sublimation purification (320° C., 3.0×10$^{-3}$ Pa) was carried out and device evaluation was performed. FAB-MS m/z=635 (M$^+$+1)

3. Synthesis of Compound 44

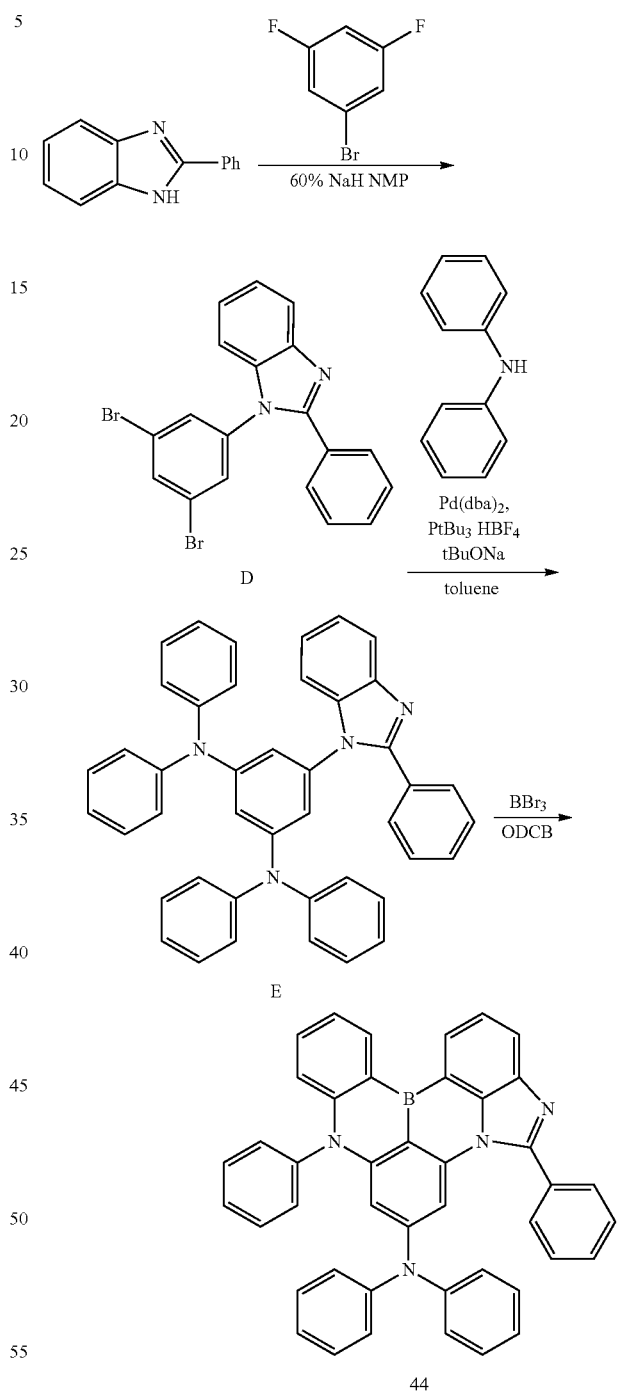

Synthesis of Compound D

As the reaction formula, 2-phenylbenzimidazole (10.0 g, 51 mmol) and 1,3-dibromo-5-fluorobenzene (15.6 g, 62 mmol) were reacted in the same manner as the synthesis of Compound A to synthesize Compound D (14.3 g, yield 65%).

Synthesis of Compound E

As the reaction formula, Compound D (14.0 g, 33 mmol) was reacted in the same manner as the synthesis of Compound B to synthesize Compound E (17.4 g, yield 88%).

Synthesis of Compound 44

As the reaction formula, Compound E (17.0 g, 28 mmol) was reacted in the same conditions as the synthesis of Compound 5 to synthesize Compound 44 (5.5 g, yield 32%). Sublimation purification (330° C., 5.0×10⁻³ Pa) was carried out and device evaluation was performed. FAB-MS m/z=613 (M⁺+1)

4. Synthesis of Compound 80

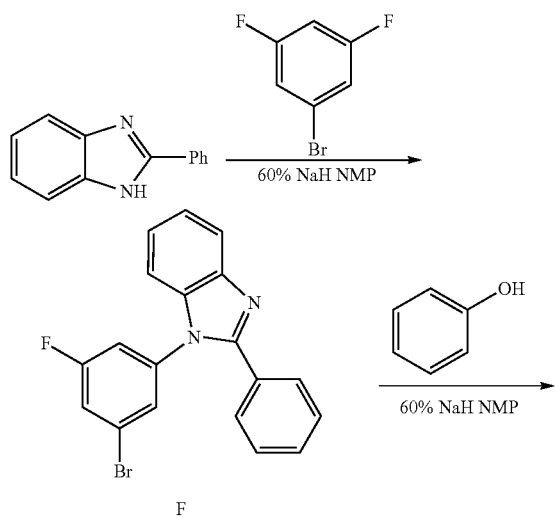

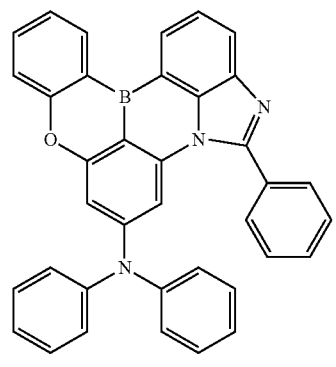

80

Synthesis of Compound E

As the reaction formula, 2-phenyl-1H-benzo[d]imidazole (10.0 g, 51 mmol) were reacted in the same manner as the synthesis of Compound A to synthesize Compound F (16.8 g, yield 89%).

Synthesis of Compound G

As the reaction formula, Compound F (16.0 g, 44 mmol) was reacted in the same manner as the synthesis of Compound A to synthesize Compound G (14.4 g, yield 75%).

Synthesis of Compound H

As the reaction formula, Compound G (14.0 g, 32 mmol) was reacted in the same manner as the synthesis of Compound B to synthesize Compound H (14.1 g, yield 84%).

Synthesis of Compound 80

As the reaction formula, Compound H (14.0 g, 26 mmol) was reacted in the same conditions as the synthesis of Compound 5 to synthesize Compound 80 (3.1 g, yield 22%). Sublimation purification (270° C., 4.5×10⁻³ Pa) was carried out and device evaluation was performed. FAB-MS m/z=537 (M⁺+1)

5. Synthesis of Compound 92

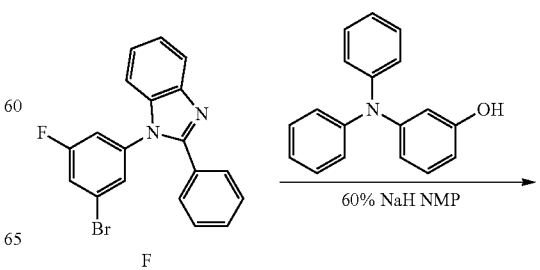

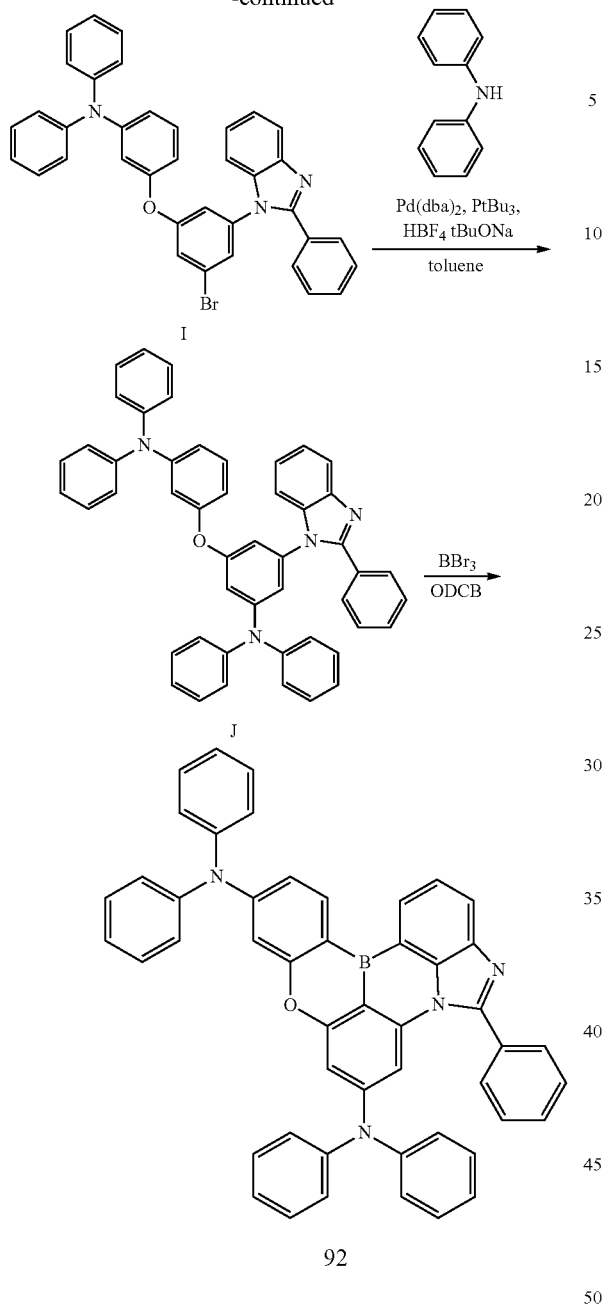

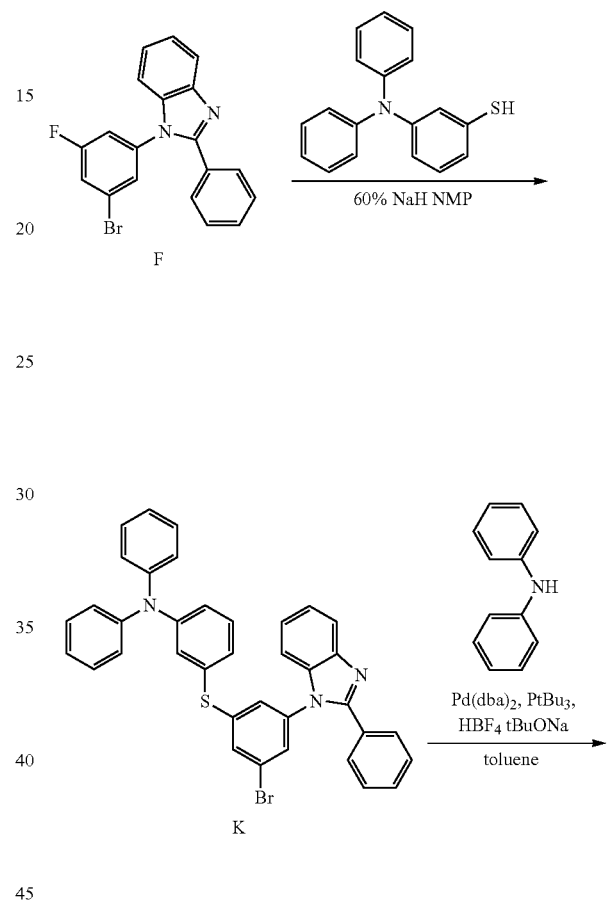

Compound 5 to synthesize Compound 92 (2.0 g, yield 15%). Sublimation purification (330° C., 3.2×10$^{-3}$ Pa) was carried out and device evaluation was performed. FAB-MS m/z=704 (M$^+$+1)

6. Synthesis of Compound 116

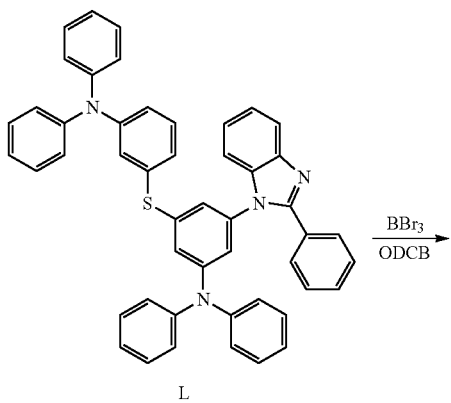

Synthesis of Compound I

As the reaction formula, Compound F (10.0 g, 27 mmol) was reacted in the same manner as the synthesis of Compound A to synthesize Compound I (13.8 g, yield 83%).

Synthesis of Compound J

As the reaction formula, Compound I (13.2 g, 22 mmol) was reacted in the same manner as the synthesis of Compound B to synthesize Compound J (13.2 g, yield 87%).

Synthesis of Compound 92

As the reaction formula, Compound J (13.0 g, 19 mmol) was reacted in the same conditions as the synthesis of

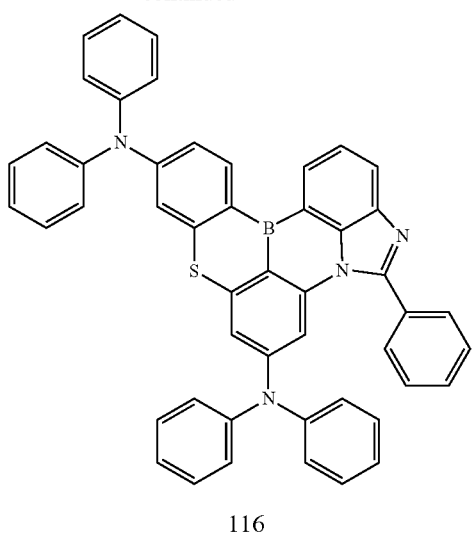

116

Synthesis of Compound K

As the reaction formula, Compound F (10.0 g, 27 mmol) was reacted in the same manner as the synthesis of Compound A to synthesize Compound K (13.6 g, yield 80%).

Synthesis of Compound L

As the reaction formula, Compound K (13.0 g, 21 mmol) was reacted in the same manner as the synthesis of Compound B to synthesize Compound L (12.7 g, 86%).

Synthesis of Compound 116

As the reaction formula, Compound L (12.0 g, 17 mmol) was reacted in the same manner as the synthesis of Compound 5 to synthesize Compound 116 (2.80 g, yield 23%). Sublimation purification (340° C., 3.8×10$^{-3}$ Pa) was carried out and device evaluation was performed. FAB-MS m/z=720 (M$^+$+1)

7. Synthesis of Compound 125

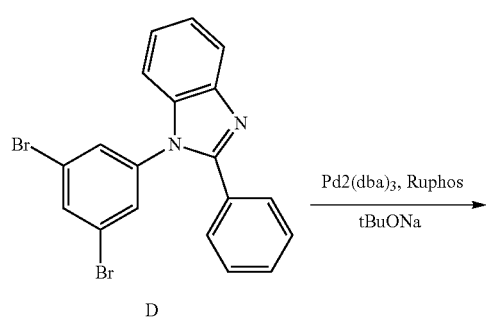

D

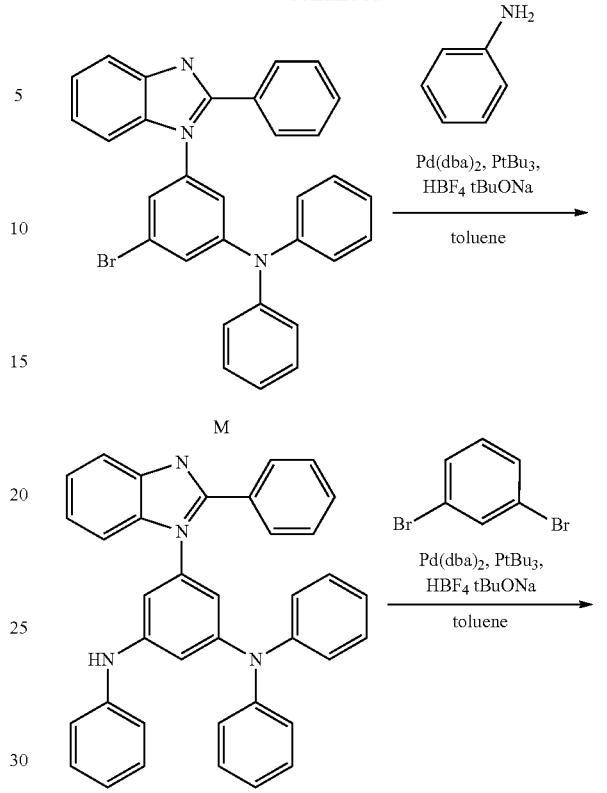

M

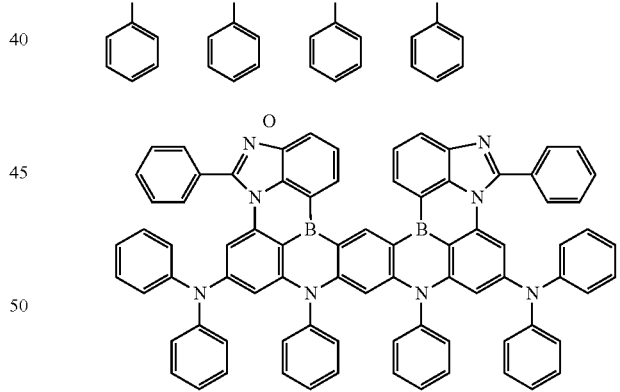

125

Synthesis of Compound M

Compound D (15.0 g, 35 mmol), tris(dibenzylideneacetone)dipalladium(0) (Pd$_2$(dba)$_3$, 0.81 g, 0.88 mmol), 2-dicyclohexylphosphino-2',6'-diisopropoxybiphenyl (Ruphos, 0.69 g, 1.48 mmol), tBuONa (4.01 g, 42 mmol) were added to toluene (80 ml) and stirred at 60° C. for 24 hours. The mixture was standing to cool and liquid-separated by adding toluene and water. The organic layer was concentrated, purified by column chromatography (silica gel), concentrated, filtered out and washed with hexane to obtain Compound M (12.3 g, yield 68%).

Synthesis of Compound N

As the reaction formula, Compound M (12.0 g, 23 mmol) was reacted in the same manner as the synthesis of Compound B to synthesize Compound N (9.3 g, yield 76%).

Synthesis of Compound O

As the reaction formula, Compound N (9.0 g, 17 mmol) was reacted in the same manner as the synthesis of Compound B to synthesize Compound O (6.7 g, yield 70%).

Synthesis of Compound 125

As the reaction formula, Compound O (6.5 g, 12 mmol) was reacted in the same manner as the synthesis of Compound 5 to synthesize Compound 125 (3.0 g, yield 21%). Sublimation purification (400° C., 3.6×10$^{-3}$ Pa) was carried out and device evaluation was performed. FAB-MS m/z=1146 (M$^{+}$+1)

8. Synthesis of Compound 126

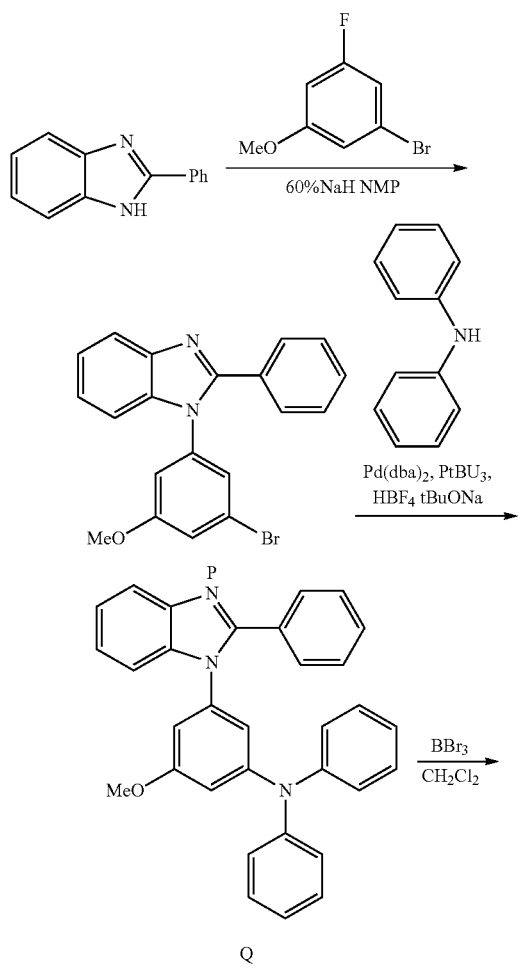

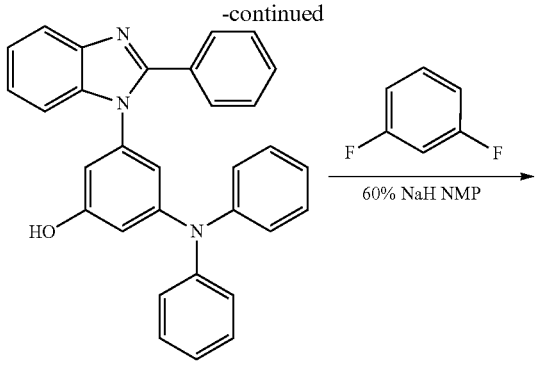

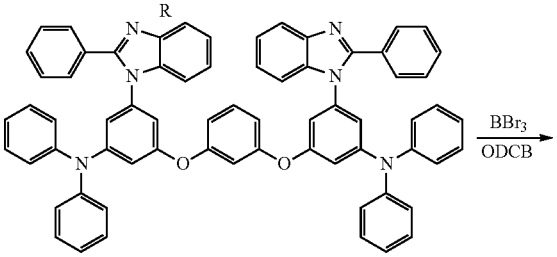

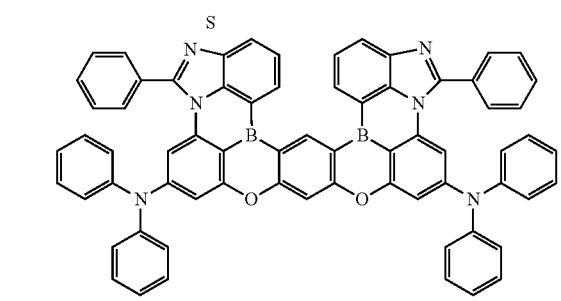

126

Synthesis of Compound P

As the reaction formula, 2-phenyl-1H-benzo[d]imidazole (15.0 g, 77 mmol) were reacted in the same manner as the synthesis of Compound A to synthesize Compound P (19.0 g, yield 65%).

Synthesis of Compound Q

As the reaction formula, Compound P (18.0 g, 47 mmol) was reacted in the same manner as the synthesis of Compound B to synthesize Compound Q (20.4 g, yield 92%).

Synthesis of Compound R

Compound Q (20.0 g, 43 mmol) was added to dichloromethane (200 ml), BBr3 (21.5 g, 86 mmol) was dropped at about 0° C., and the mixture was stirred at room temperature for about 48 hours. The reaction solution was poured into ice water and subjected to liquid separation. The organic layer was concentrated, purified by column chromatography (silica gel), concentrated, filtered out and washed with hexane to obtain Compound R (15.7 g, yield 81%).

Synthesis of Compound S

As the reaction formula, Compound R (15.0 g, 33 mmol) was reacted in the same manner as the synthesis of Compound A to synthesize Compound S (13.0 g, yield 80%).

Synthesis of Compound 126

As the reaction formula, Compound S (12.5 g, 13 mmol) was reacted in the same manner as the synthesis of Compound 5 to synthesize Compound 126 (2.5 g, yield 20%). Sublimation purification (370° C., 7.7×10⁻³ Pa) was carried out and device evaluation was performed. FAB-MS m/z=996 (M⁺+1)

9. Synthesis of Compound 152

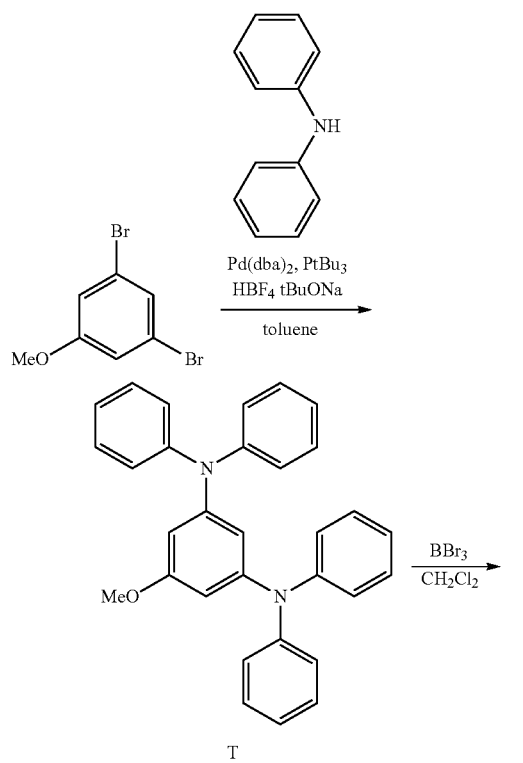

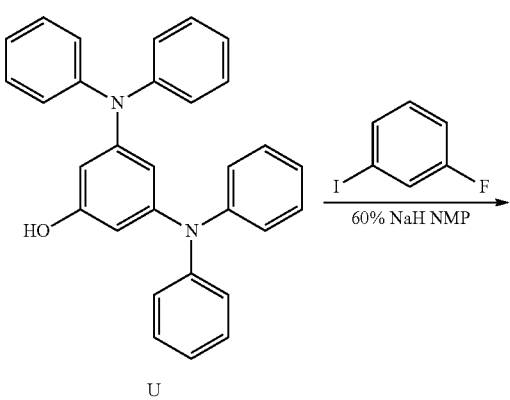

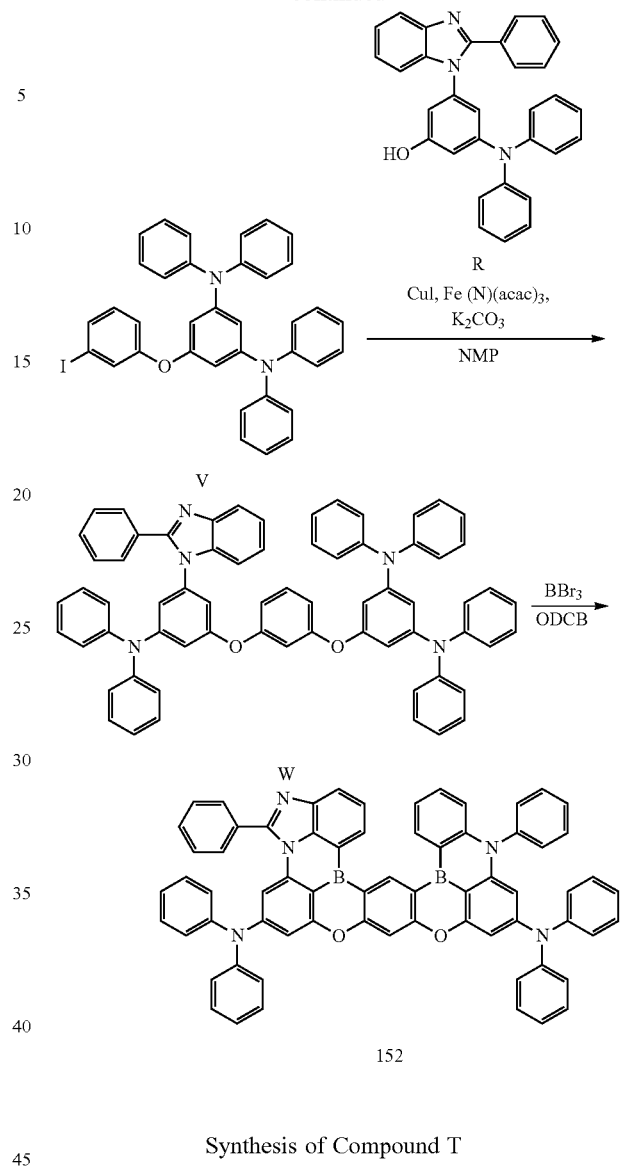

Synthesis of Compound T

As the reaction formula, 1,3-dibromo-5-methoxybenzene (12.0 g, 45 mmol) was reacted in the same manner as the synthesis of Compound B to synthesize Compound T (16.0 g, yield 80%).

Synthesis of Compound U

As the reaction formula, Compound T (15.0 g, 34 mmol) was reacted in the same manner as the synthesis of Compound R to synthesize Compound U (10.9 g, yield 75%).

Synthesis of Compound V

As the reaction formula, Compound U (10.0 g, 23 mmol) was reacted in the same manner as the synthesis of Compound A to synthesize Compound V (10.6 g, yield 72%).

Synthesis of Compound W

Compound B (10.0 g, 16 mmol), Compound R (9.34 g, 21 mmol), CuI (0.15 g, 0.79 mmol), K₂CO₃ (8.77 g, 63 mmol), and tris(2,4-pentanedionato)iron(III) (Fe(III)(acac)₃, 0.56 g, 1.6 mmol) were added to 1-methyl-2-pyrrolidone (NMP, 36 ml) and heated and stirred at about 180° C. for about 24 hours. The mixture was standing to cool and liquid-separated after celite filtering by adding toluene and water. The organic layer was concentrated, purified by column chromatography (silica gel), concentrated, filtered out and washed with hexane to obtain Compound W (9.55 g, yield 63%).

Synthesis of Compound 152

As the reaction formula, Compound W (9.0 g, 9.4 mmol) was reacted in the same manner as the synthesis of Compound 5 to synthesize Compound 152 (2.9 g, yield 32%). Sublimation purification (370° C., $3.2 \times 10^{-3}$ Pa) was carried out and device evaluation was performed. FAB-MS m/z=971 (M$^+$+1)

(Manufacture of Organic Electroluminescence Device)

Organic electroluminescence devices of Examples 1 to 9 were manufactured using the above-described compounds as emission layer materials.

Example Compounds

5

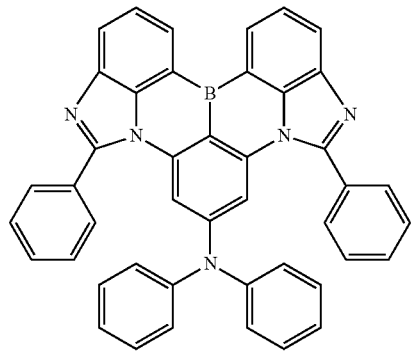

6

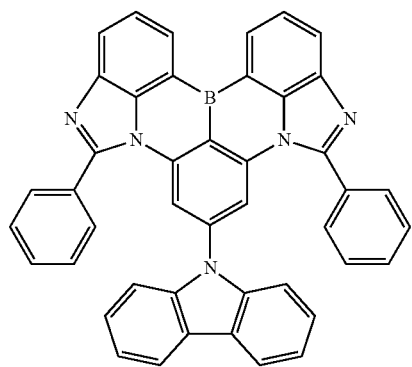

44

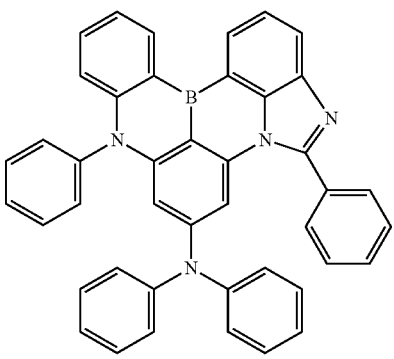

80

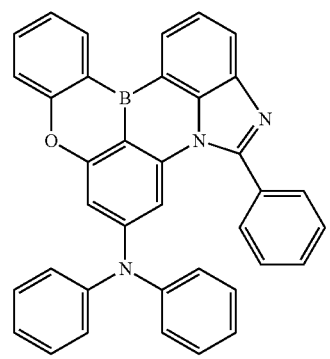

92

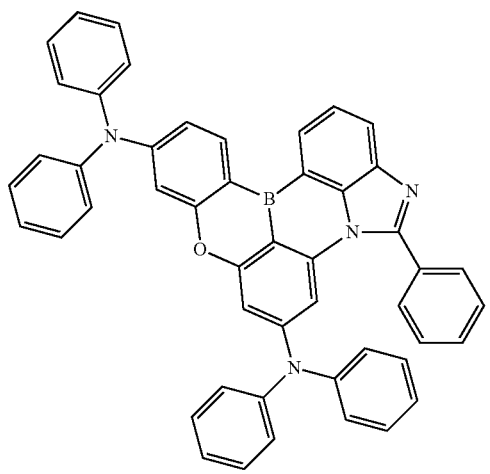

116

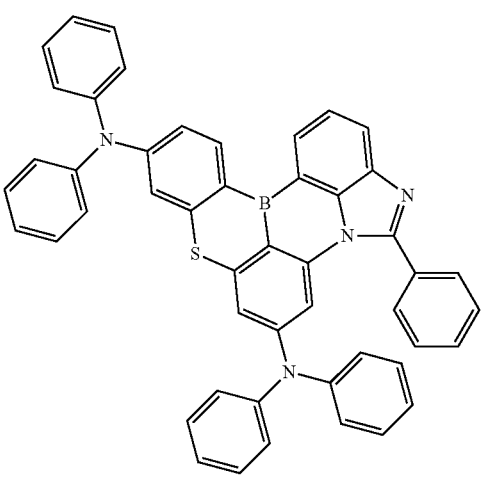

-continued

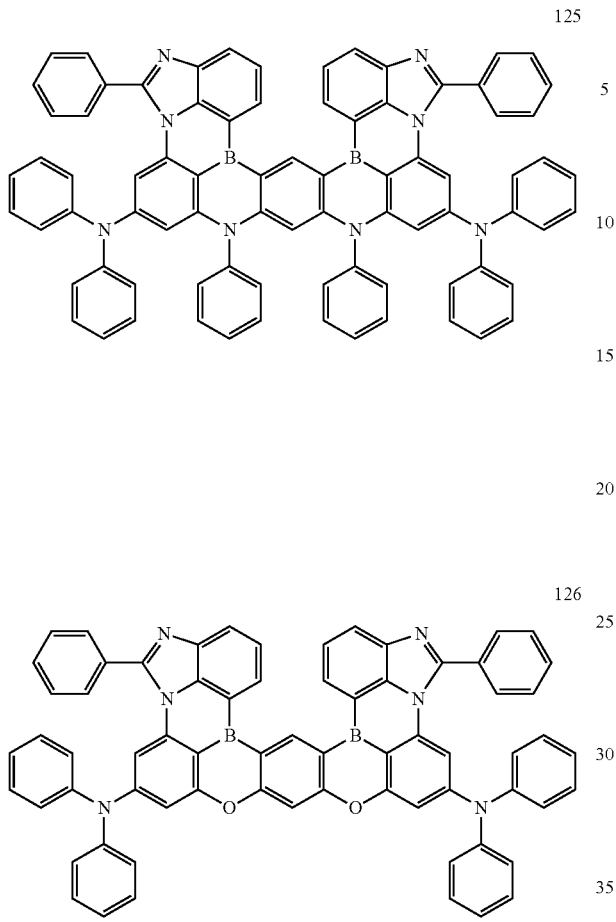

125

126

152

The organic electroluminescence devices of Comparative Examples 1 and 2 were manufactured using Comparative Example Compounds $X_1$ and $X_2$ below as emission layer materials.

Comparative Example Compounds

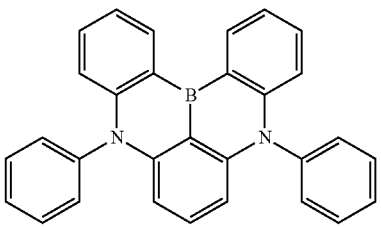

X1

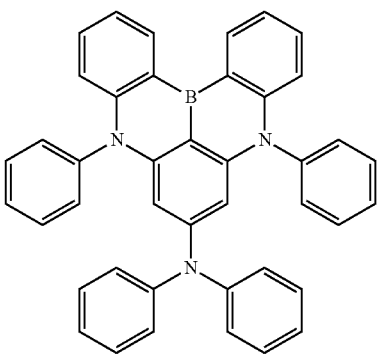

X2

The organic electroluminescence devices of Examples and Comparative Examples were manufactured by the following method.

An ITO having a thickness of about 1,500 Å was patterned on a glass substrate, washed with ultrapure water, and UV ozone-treated for about 10 minutes. Thereafter, HAT-CN was deposited to a thickness of about 100 Å, α-NPD was deposited to a thickness of about 800 Å, and mCP was deposited to a thickness of about 50 Å to form a hole transport region.

When forming an emission layer, a nitrogen-containing compound of an example or a Comparative Example Compound and mCBP were co-deposited in a ratio of about 1:99 to form a 200 Å-thick layer.

A 300 Å-thick layer was formed on the emission layer with TPBi and a 5 Å-thick layer was formed with LiF to form an electron transport region. A second electrode having a thickness of about 1,000 Å was formed with aluminum (Al).

In the Examples, the hole transport region, the emission layer, the electron transport region, and the second electrode were formed using a vacuum deposition apparatus.

(Evaluation of Organic Electroluminescence Device Characteristics)

For the evaluation of the characteristics of an organic electroluminescence device according to the Examples and Comparative Examples, the maximum emission wavelength (nm), the maximum external quantum yield (%), and the external quantum efficiency (%) at a luminance of about 1000 cd/m² were measured, using a brightness light distribution characteristics measurement device, C9920-11 from Hamamatsu Photonics, Inc.

TABLE 1

| | Emission layer dopant | Maximum emission wavelength (nm) | EQE$_{max}$ (%) | EQE$_{1000\,nit}$ (%) | Roll-off EQE$_{1000\,nit}$/EQE$_{max}$ (%) |
| --- | --- | --- | --- | --- | --- |
| Example 1 | Example Compound 5 | 464 | 15.3 | 10.9 | 71.2 |
| Example 2 | Example Compound 6 | 459 | 15.2 | 10.5 | 69.0 |
| Example 3 | Example Compound 44 | 463 | 15.5 | 10.1 | 65.1 |
| Example 4 | Example Compound 80 | 457 | 15.1 | 10.3 | 68.2 |
| Example 5 | Example Compound 92 | 467 | 16.1 | 10.9 | 67.7 |
| Example 6 | Example Compound 116 | 481 | 15.9 | 10.1 | 63.5 |
| Example 7 | Example Compound 125 | 471 | 18.1 | 16.1 | 88.9 |
| Example 8 | Example Compound 126 | 460 | 18.9 | 17.9 | 94.7 |
| Example 9 | Example Compound 152 | 461 | 19.1 | 18.9 | 98.9 |
| Comparative Example 1 | Comparative Example Compound X1 | 459 | 13.2 | 5.4 | 40.9 |
| Comparative Example 2 | Comparative Example Compound X2 | 467 | 14.2 | 6.4 | 45.0 |

Referring to the results of Table 1, when the nitrogen-containing compound according to an embodiment was included in the emission layer, it is confirmed that the maximum external quantum efficiency (EQE$_{max}$), the external quantum efficiency (EQE$_{1000nit}$), and a roll-off value were all improved compared to Comparative Examples.

It is determined that this is because the nitrogen-containing compound according to the inventive concept had improved characteristics as an electron acceptor by including a structure in which benzimidazole, a heterocycle, was condensed. It is determined that the condensation of the benzimidazole solved a structural twist of the compound, and the improvement of resonance effect increased molecular stability.

The organic electroluminescence device of an example may implement high light emission efficiency in a blue light wavelength region by using the nitrogen-containing compound represented by Formula 1 as an emission layer material.

The organic electroluminescence device according to an embodiment of the inventive concept may achieve high efficiency and long service life.

The nitrogen-containing compound according to an embodiment of the inventive concept may improve efficiency and service life of the organic electroluminescence device.

Although the inventive concept has been described with reference to embodiments of the inventive concept, it will be understood that the inventive concept should not be limited to these embodiments but that various changes and modifications can be made by those skilled in the art without departing from the spirit and scope of the inventive concept.

Accordingly, the technical scope of the inventive concept is not intended to be limited to the contents set forth in the detailed description of the specification, but is intended to be defined by the appended claims.

US 11,430,960 B2
-continued
63
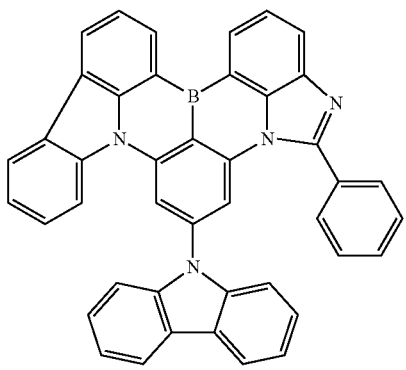
64
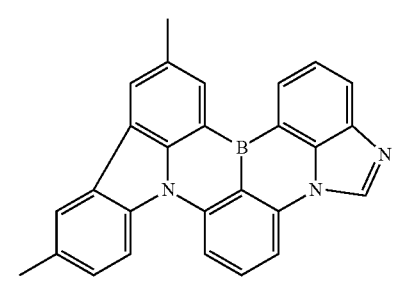
65
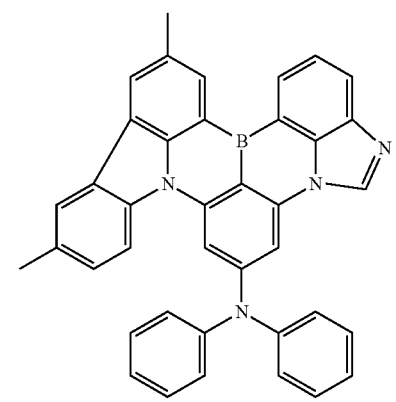
66
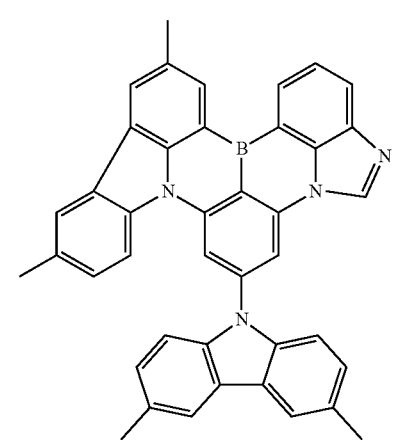
-continued
67
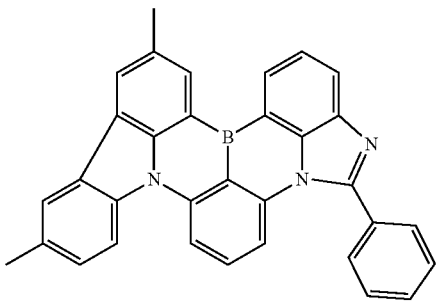
68
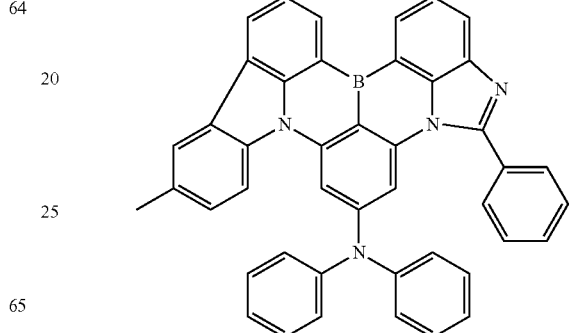
69
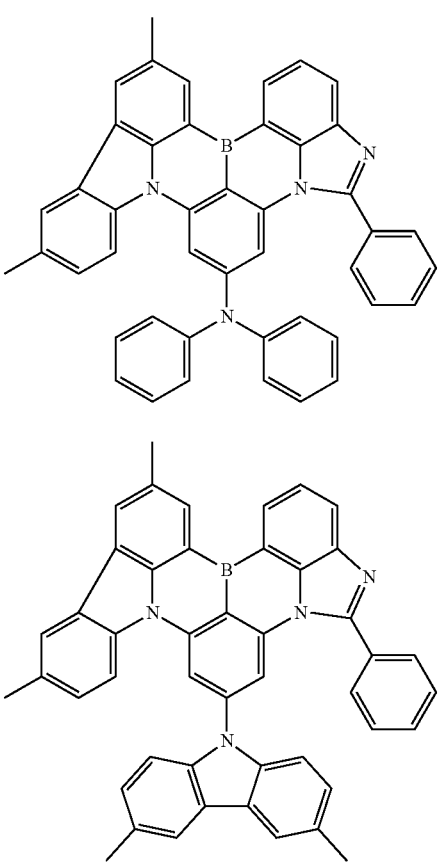
70
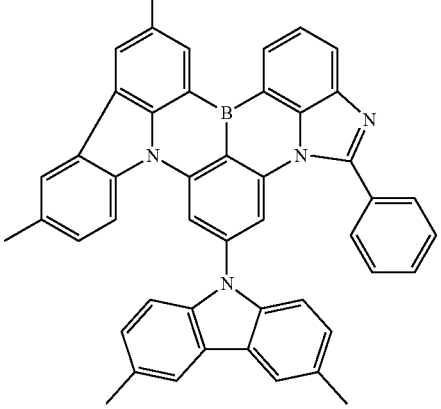

-continued
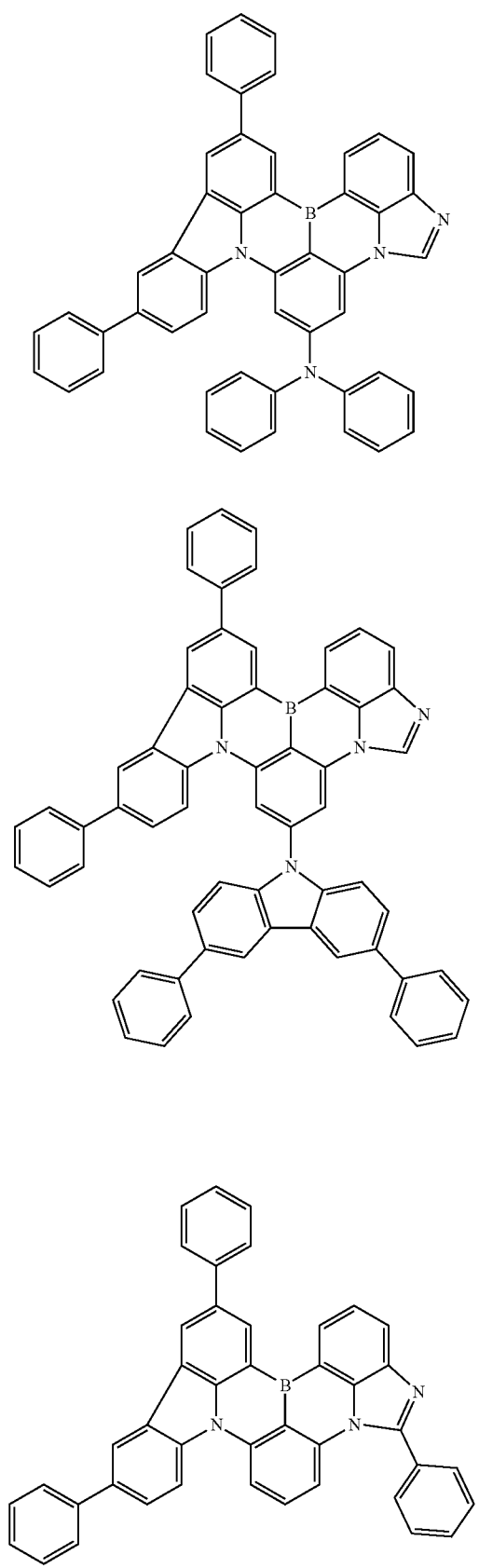
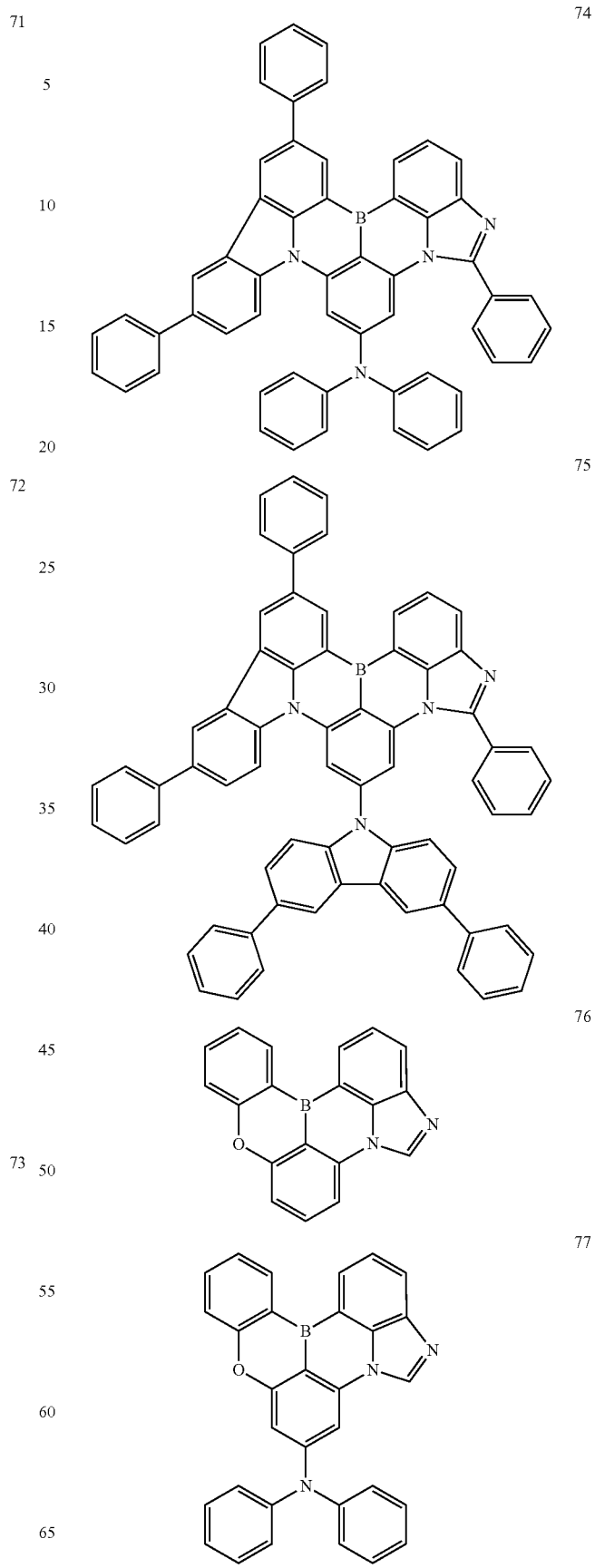

-continued
78
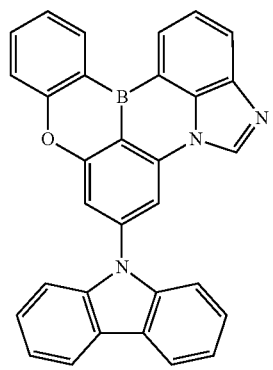
79
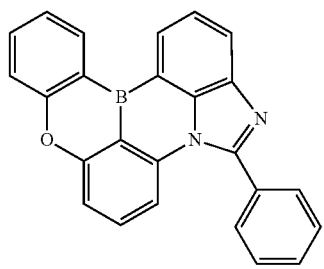
80
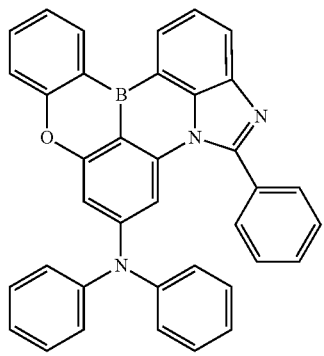
81
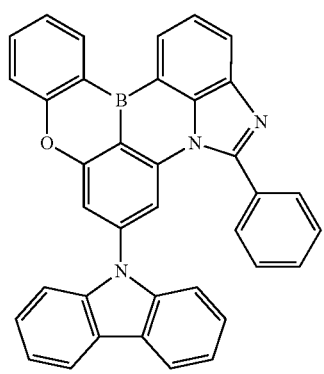
-continued
82
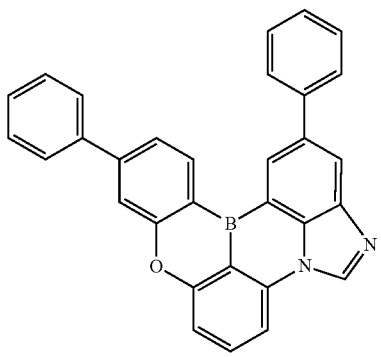
83
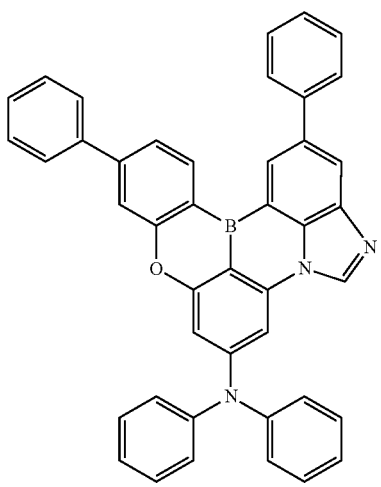
84
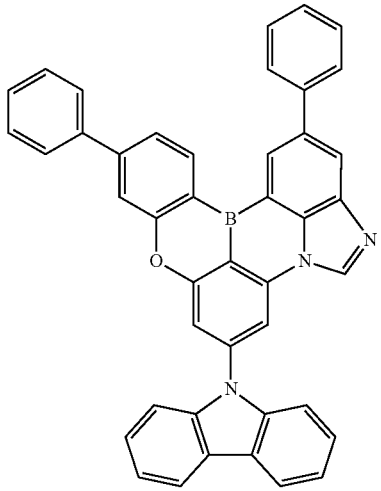

85
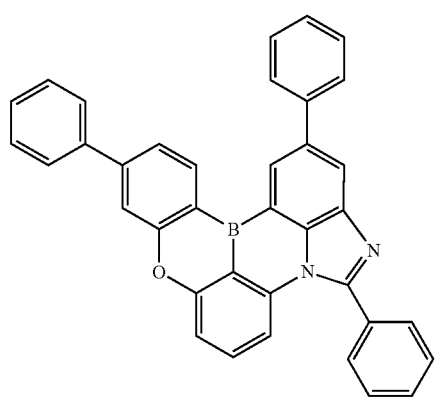
86
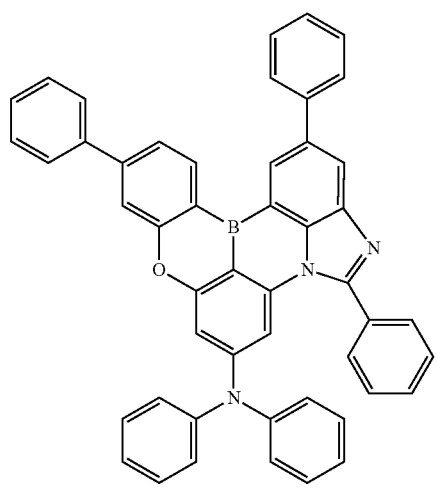
87
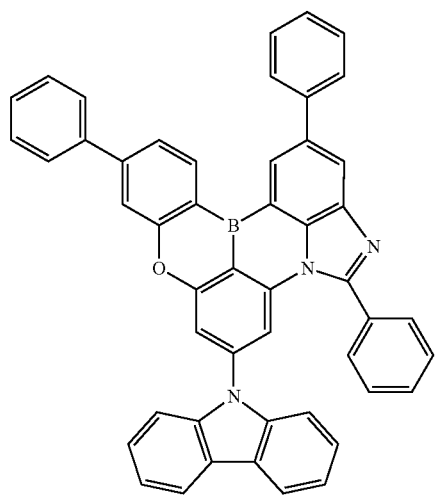
88
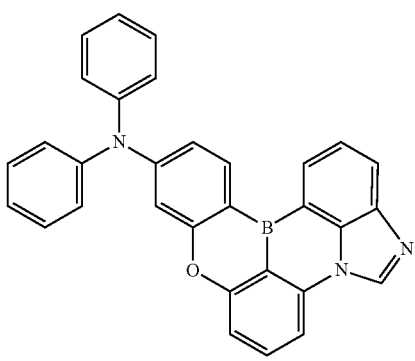
89
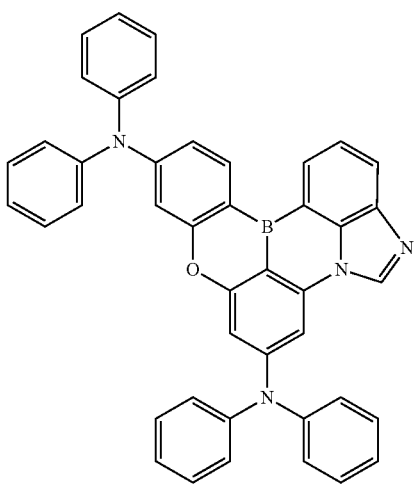
90
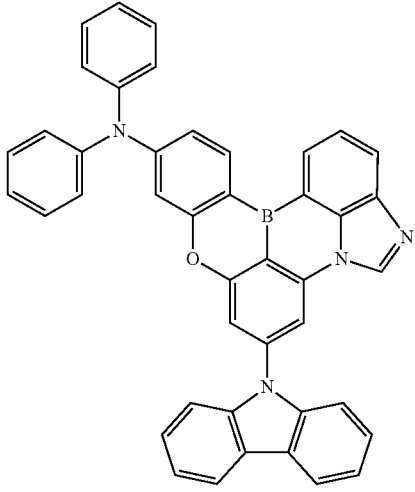

91
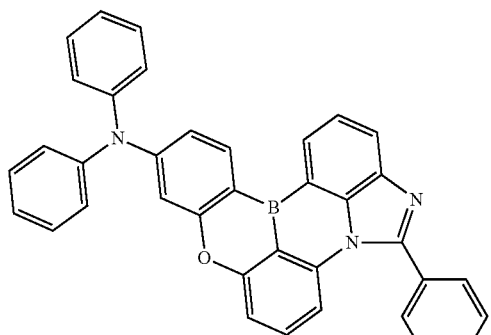
92
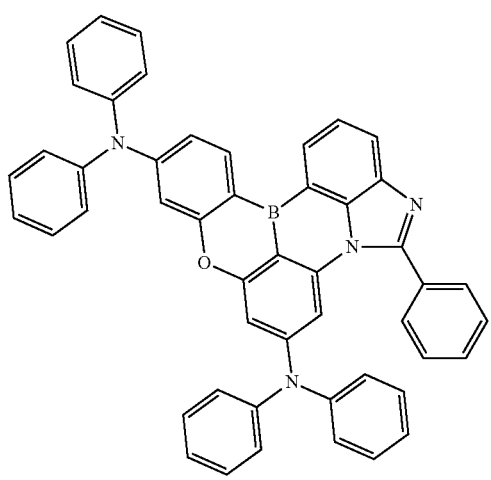
93
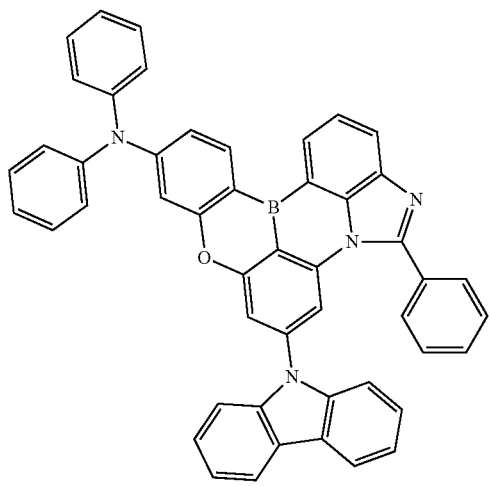
94
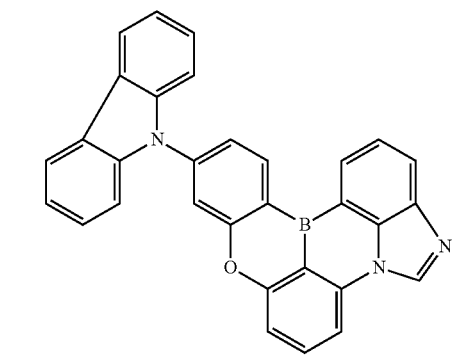
95
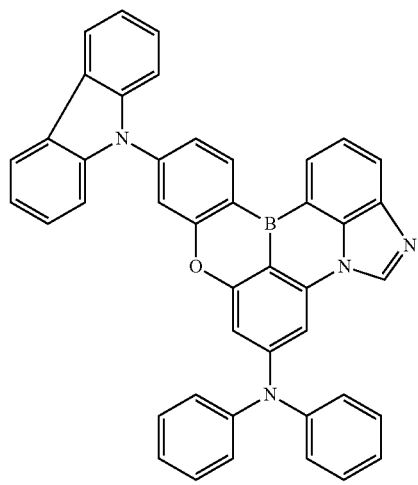
96
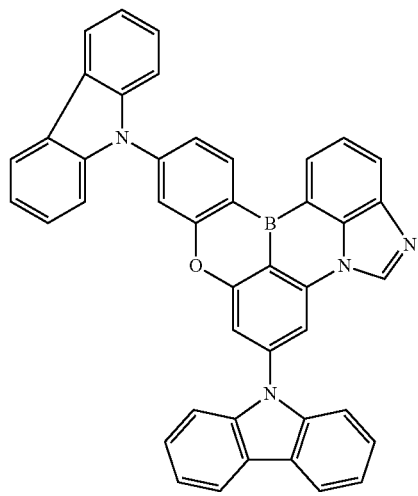
97
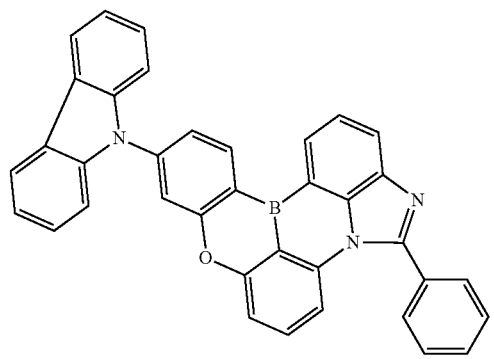

98
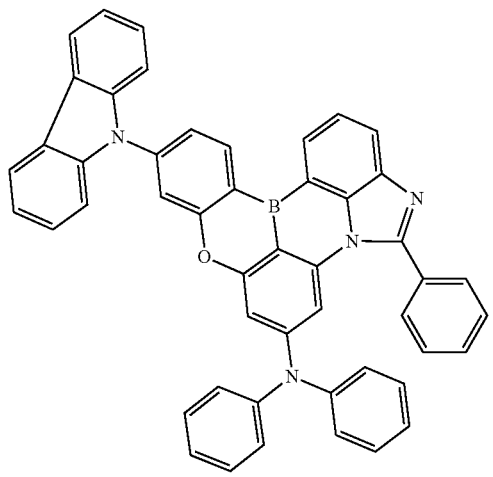
99
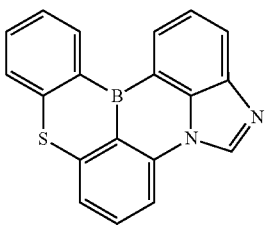
100
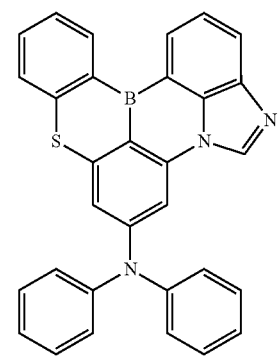
101
102
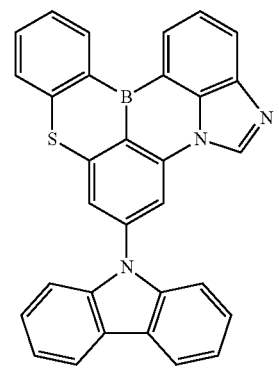
103
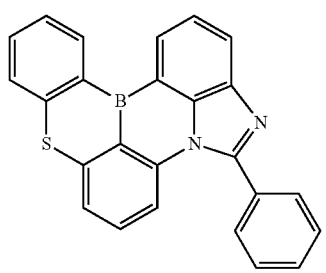
104
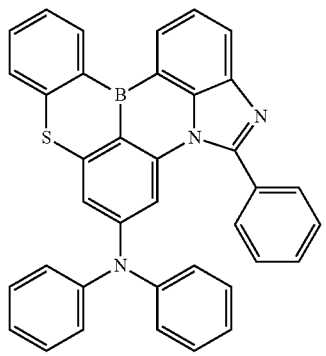
105
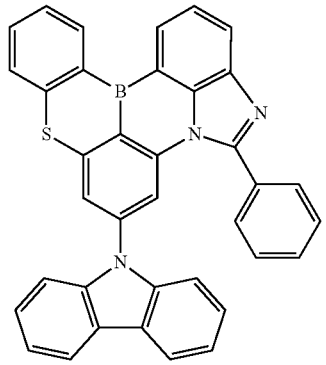

106
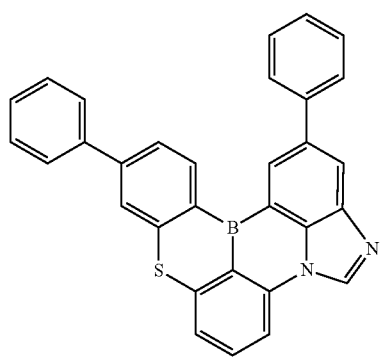
107
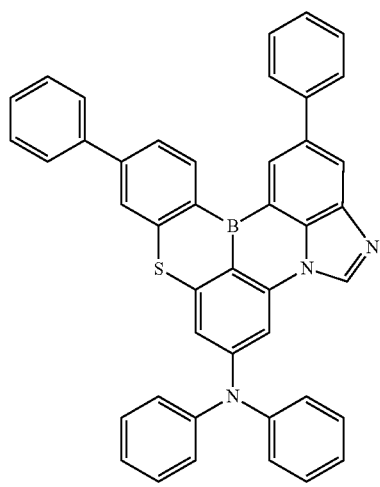
108
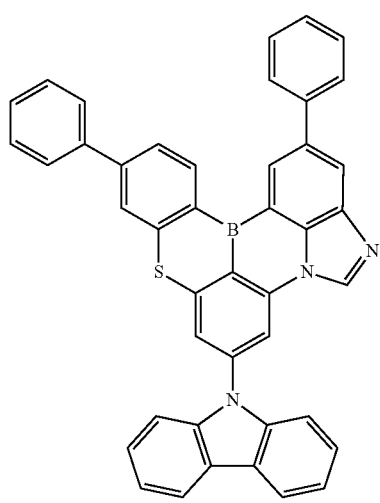
109
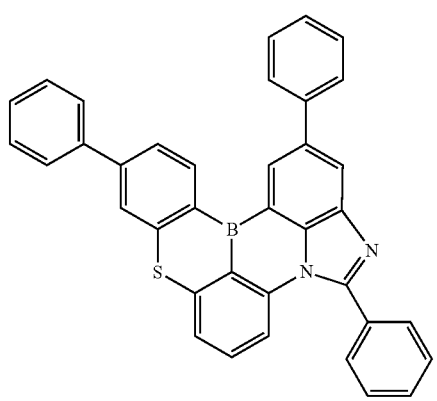
110
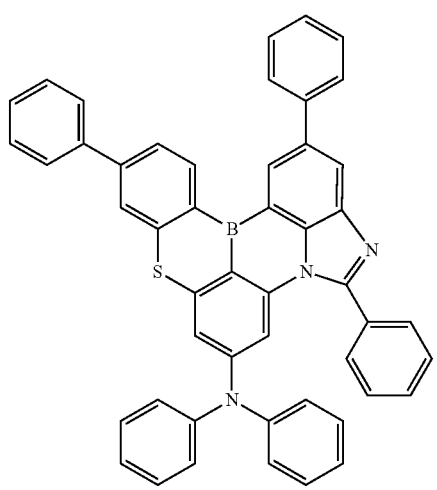
111
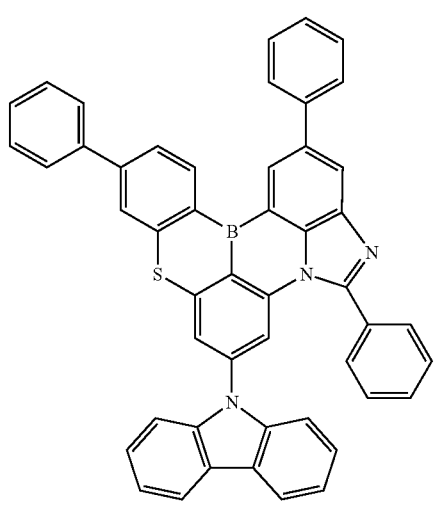

112
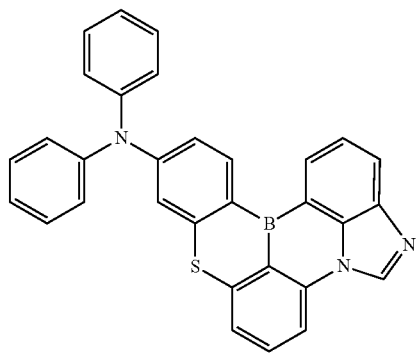
113
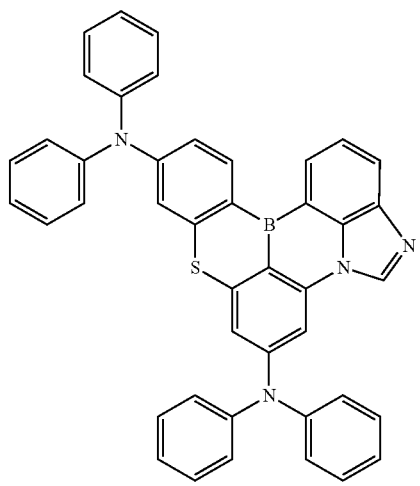
114
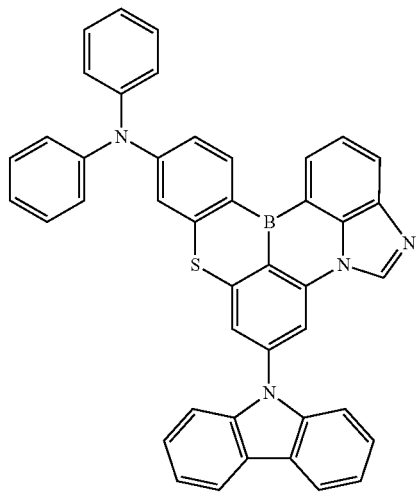
115
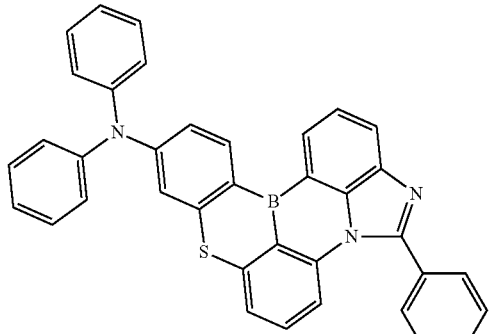
116
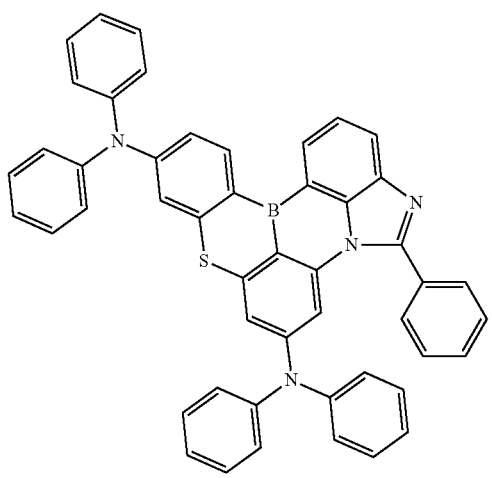
117
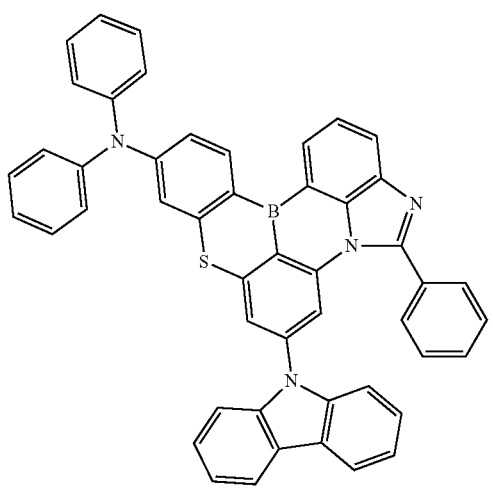
118
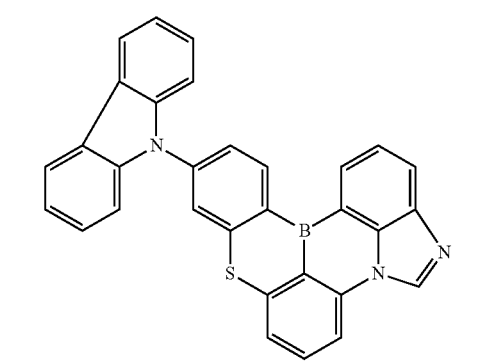

119
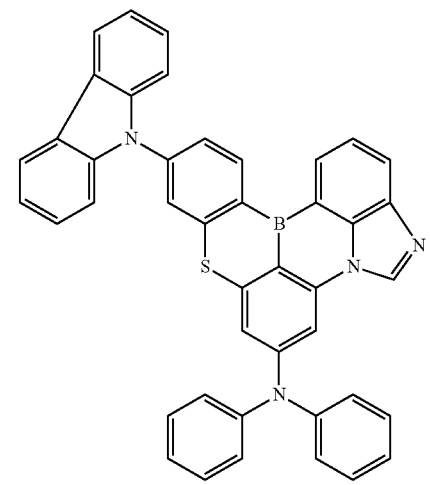
120
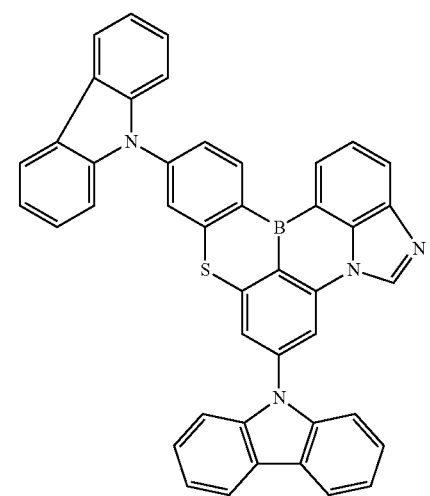
121
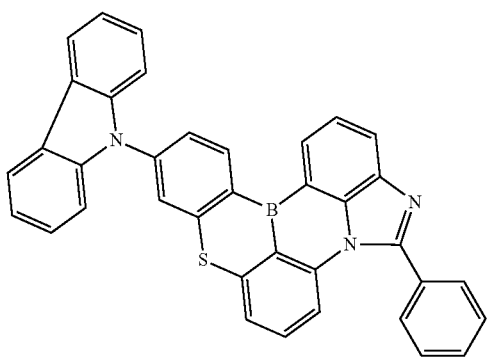
122
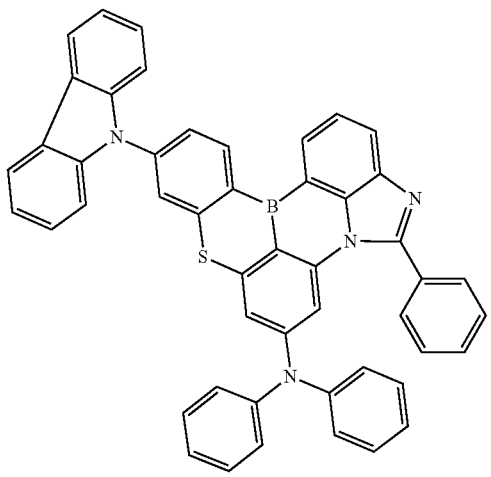
123
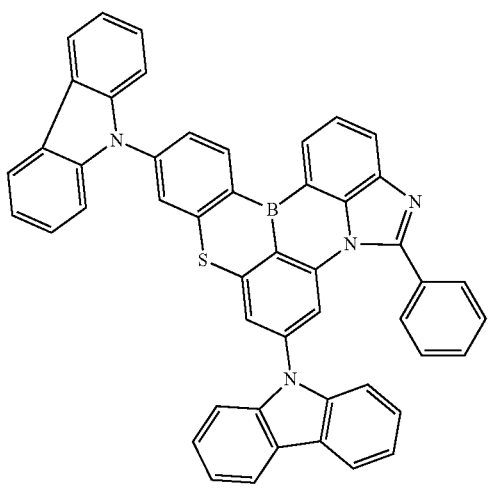
124
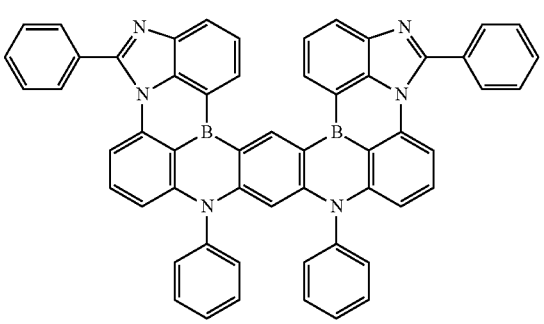
125
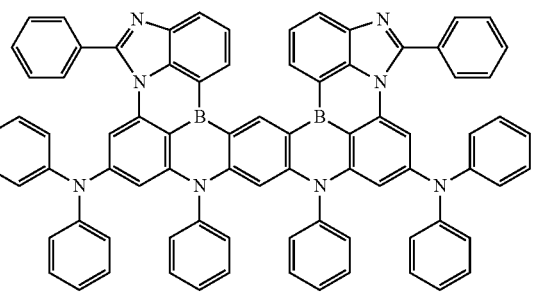

126
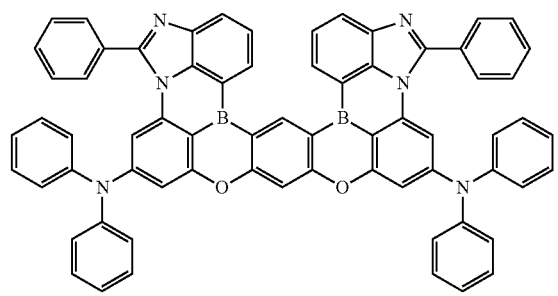
127
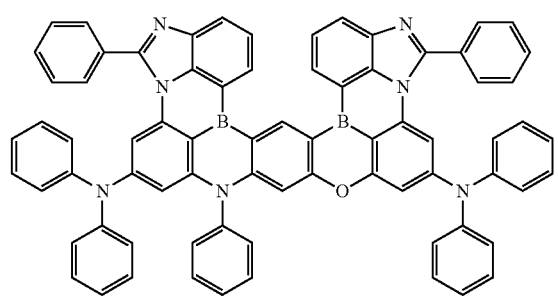
128
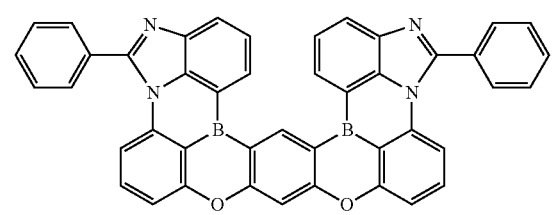
129
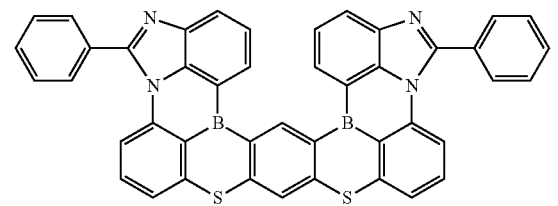
130
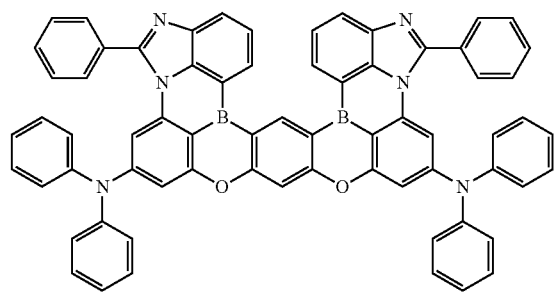
131
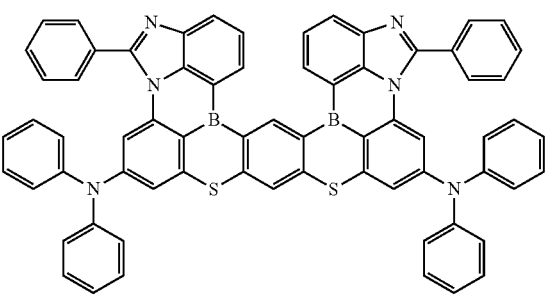
132
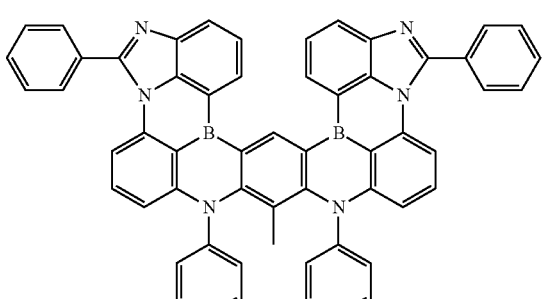
133
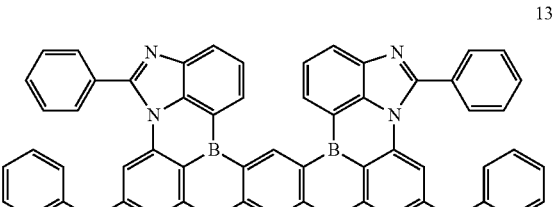
134
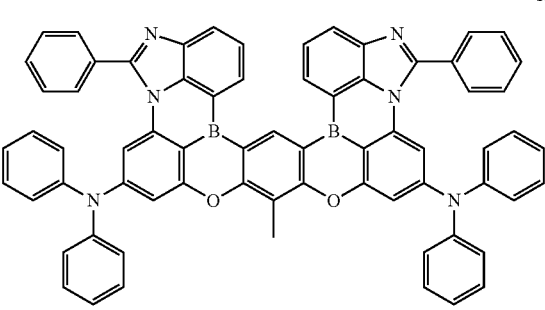
135
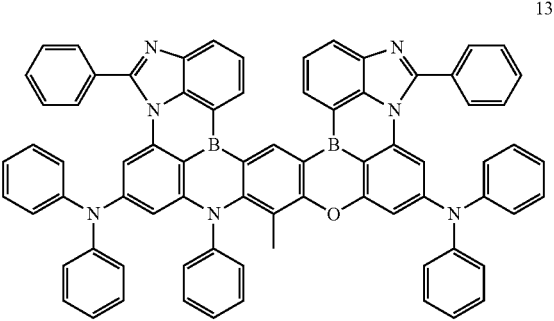

136
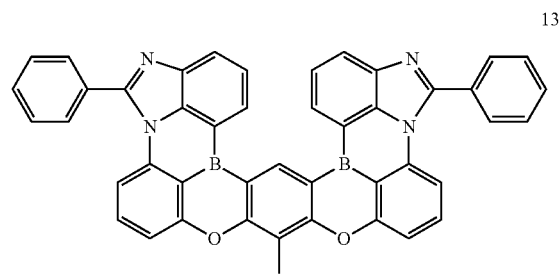
137
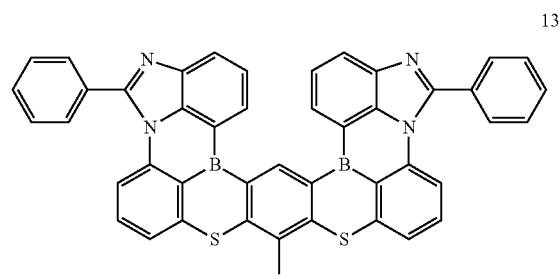
138
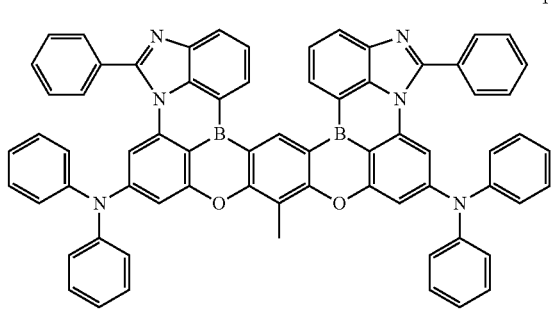
139
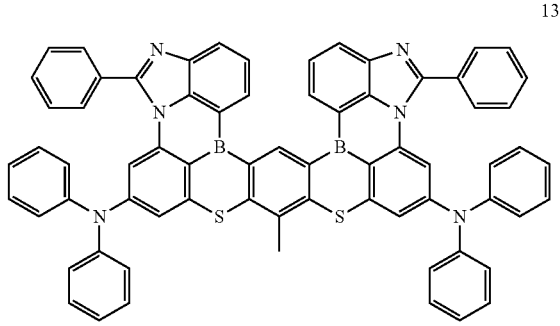
140
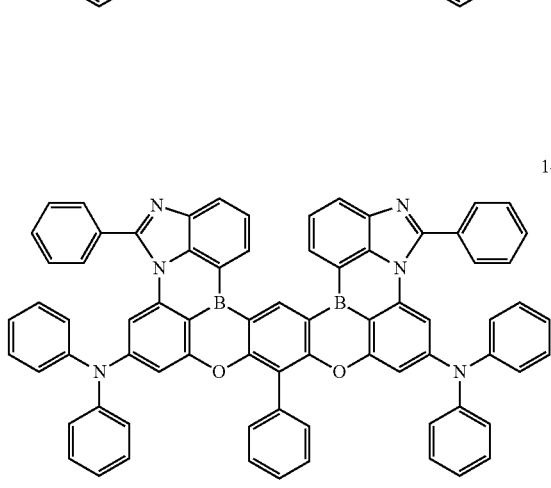
141
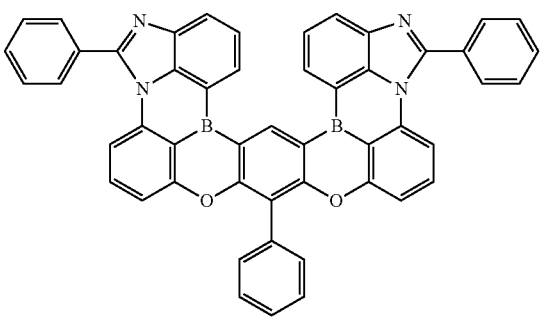
142
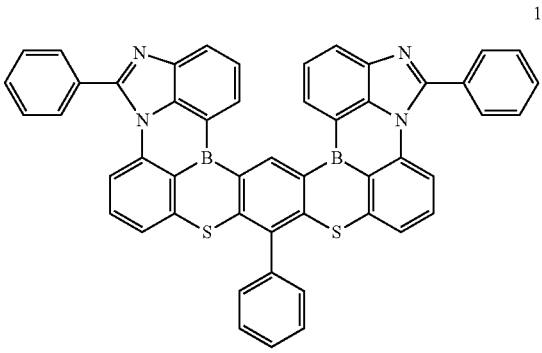
143
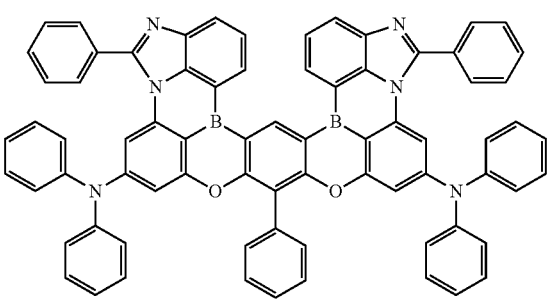
144
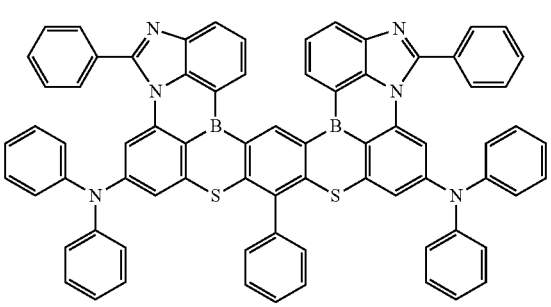
145
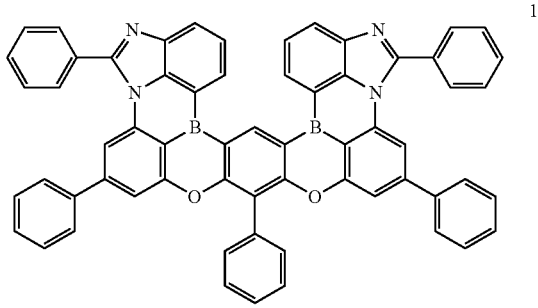

146
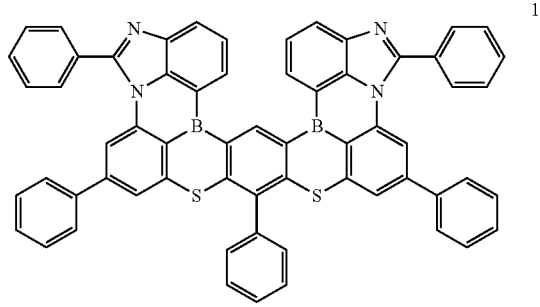
147
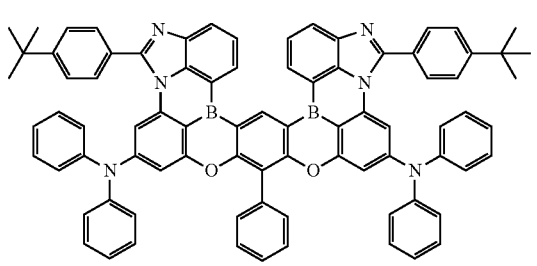
148
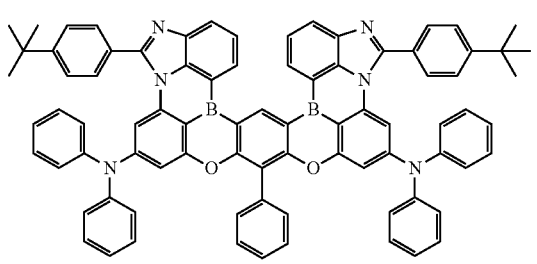
149
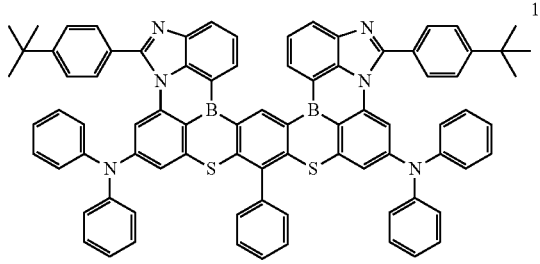
150
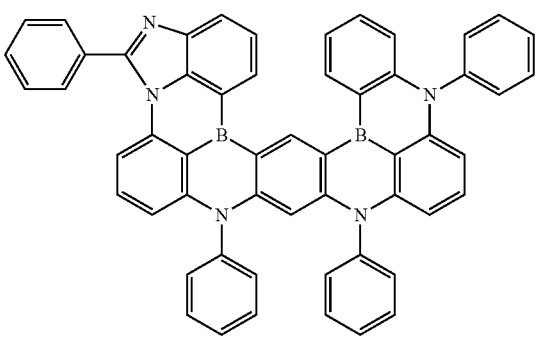
151
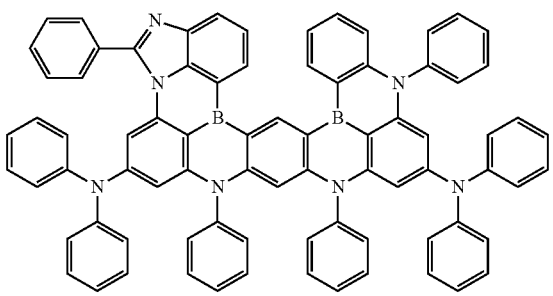
152
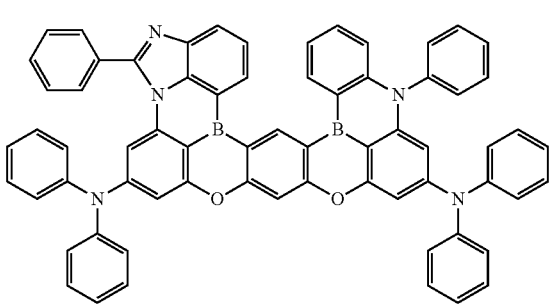
153
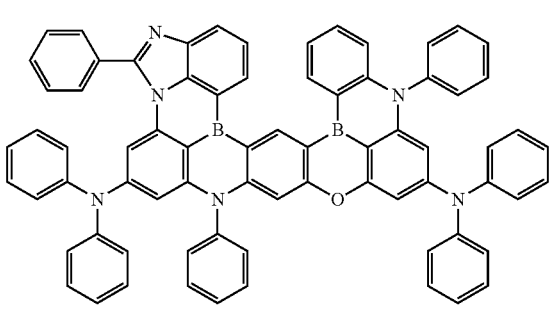
154
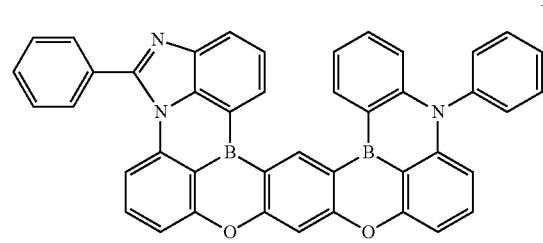
155
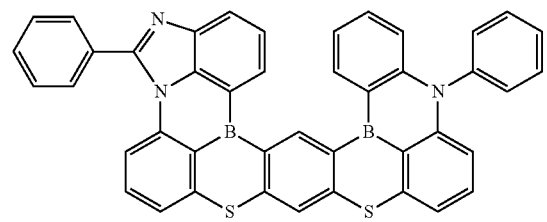

156
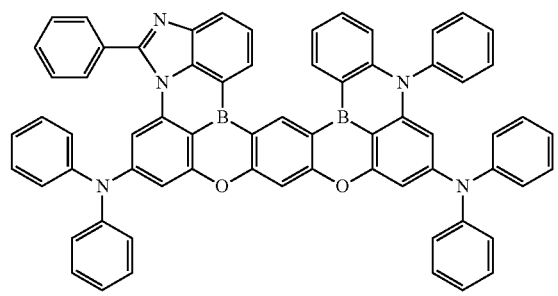
157
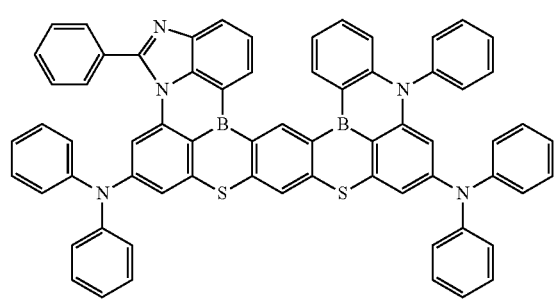
158
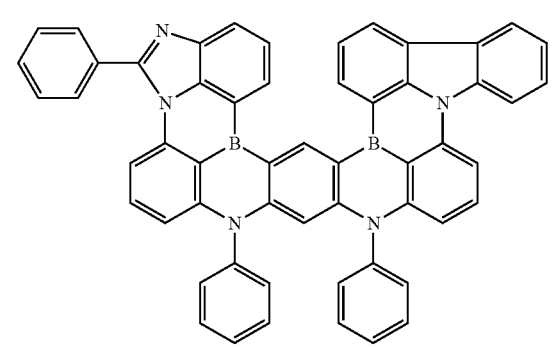
159
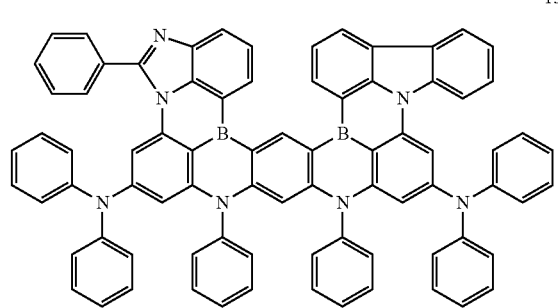
160
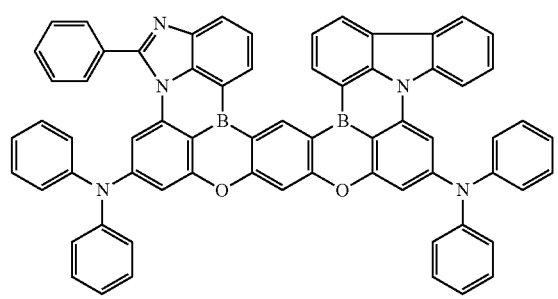
161
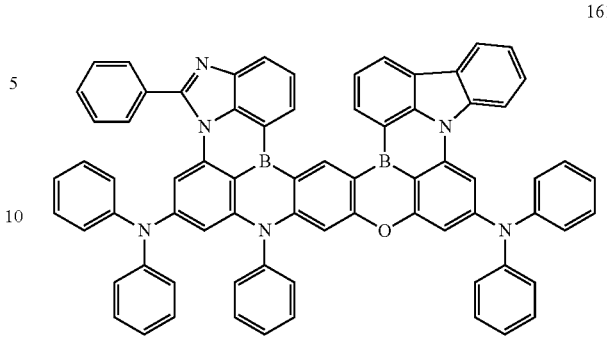
162
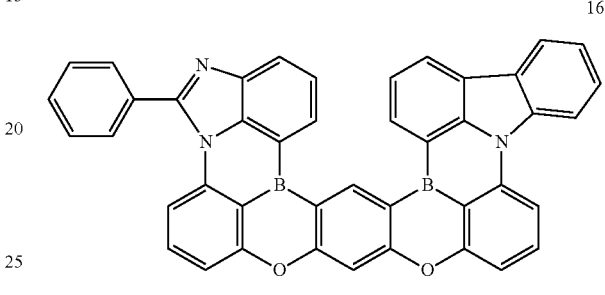
163
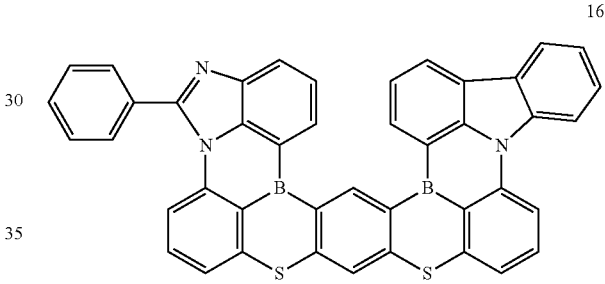
164
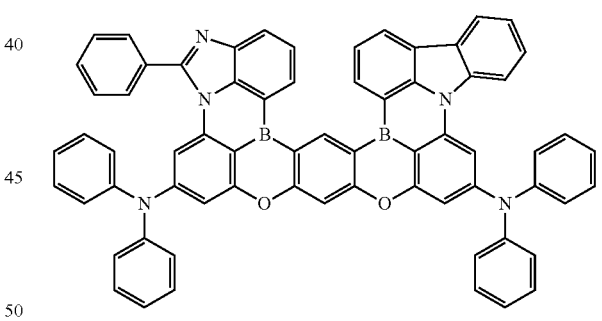
165
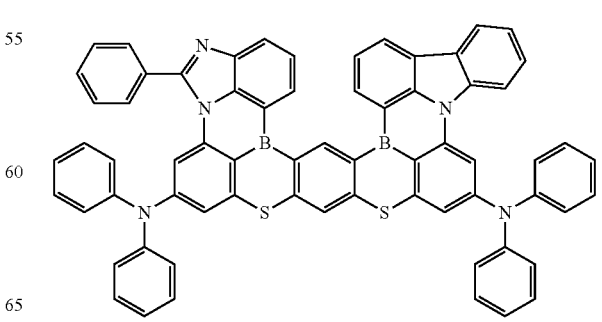

187 188
167
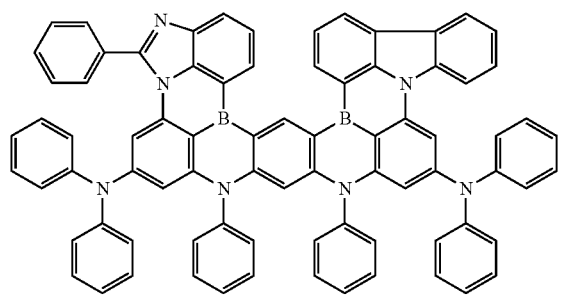
168
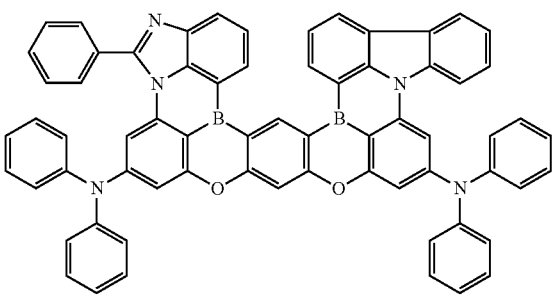
169
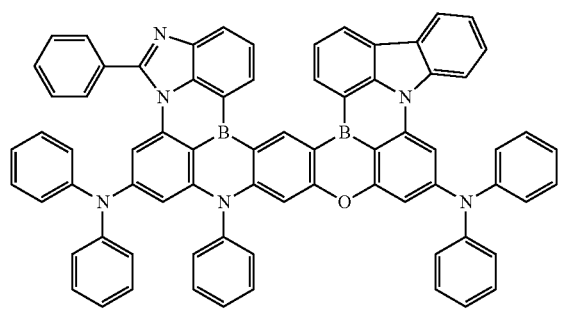
170
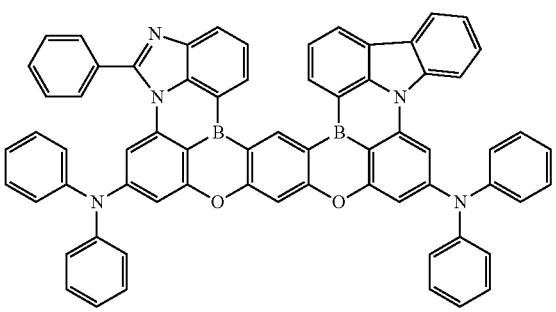
171
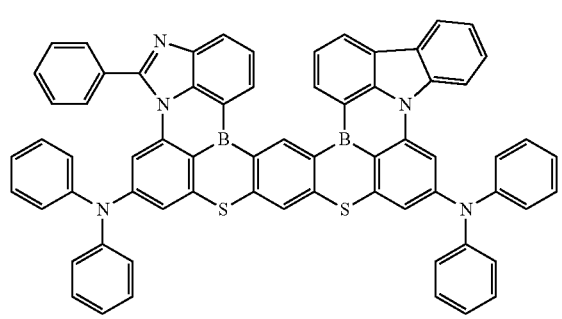
172
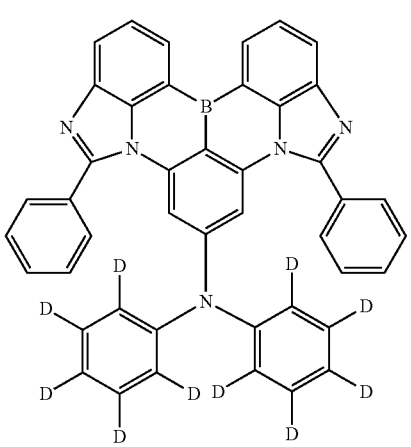
173
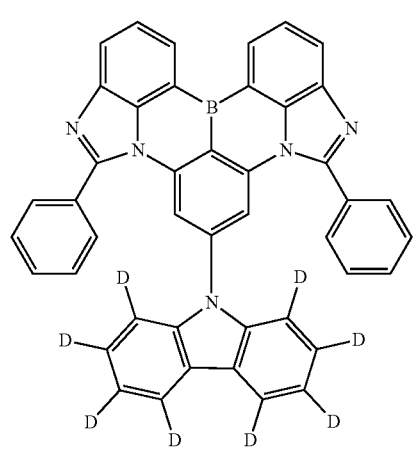
174
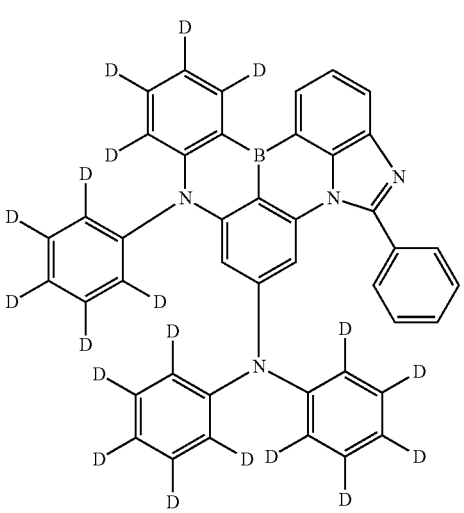

189                                                                                                                  190
-continued
175 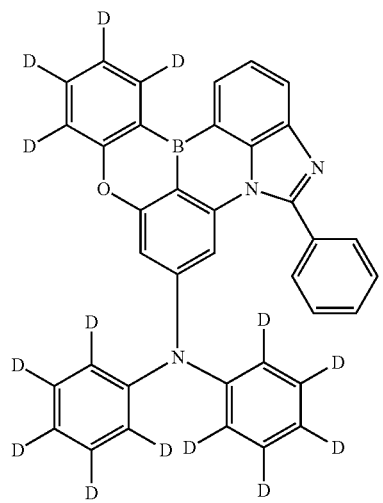
176 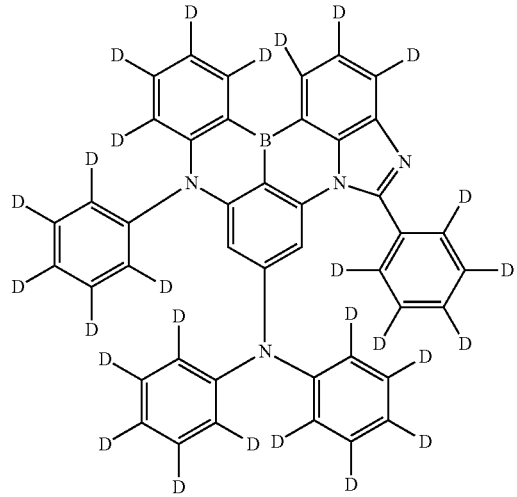
177 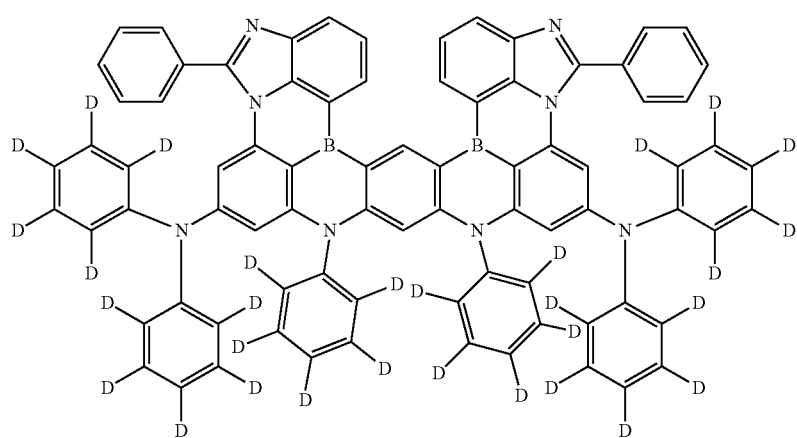
178 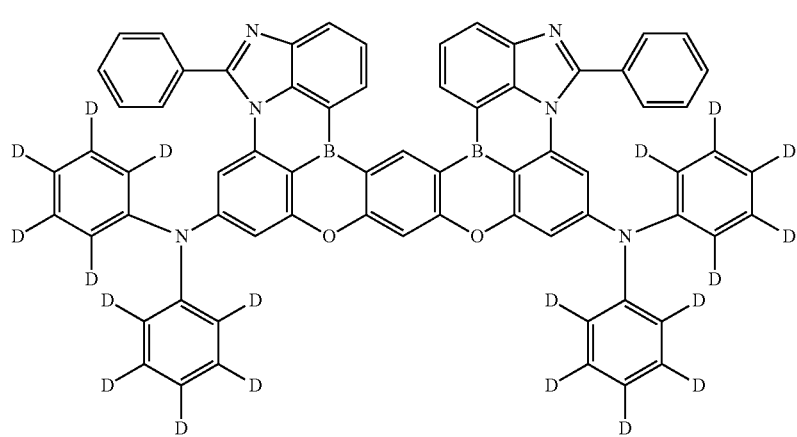

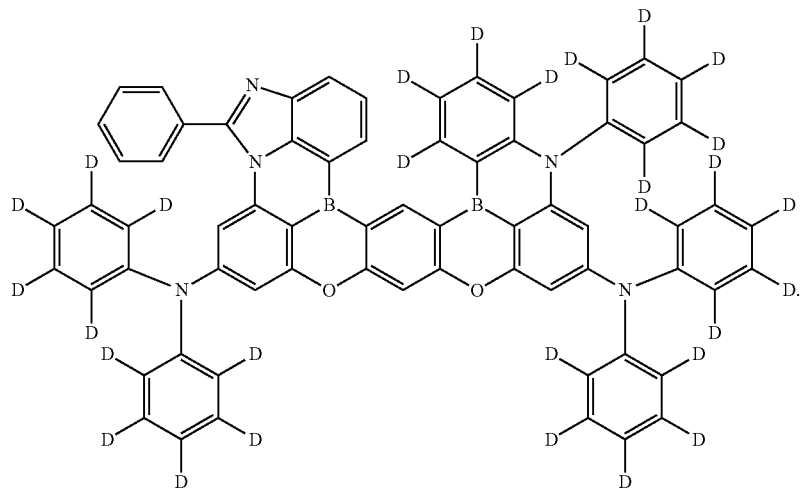

What is claimed is:

1. An organic electroluminescence device comprising:
a first electrode;
a hole transport region disposed on the first electrode;
an emission layer disposed on the hole transport region;
an electron transport region disposed on the emission layer; and
a second electrode disposed on the electron transport region, wherein
the first electrode and the second electrode each comprise at least one material selected from the group consisting of Ag, Mg, Cu, Al, Pt, Pd, Au, Ni, Nd, Ir, Cr, Li, Ca, LiF/Ca, LiF/Al, Mo, Ti, In, Sn, Zn, an oxide thereof, a compound thereof, and a mixture thereof, and
the emission layer comprises a nitrogen-containing compound represented by Formula 1:

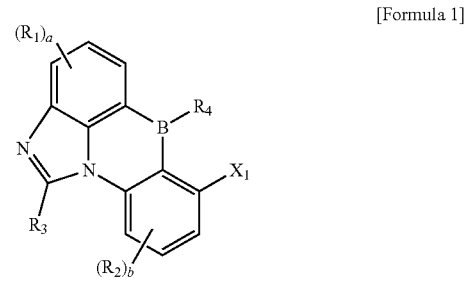

[Formula 1]

wherein in Formula 1,
X$_1$ is NAr$_1$Ar$_2$, OAr$_3$, or SAr$_4$,
Ar$_1$ to Ar$_4$ are each independently a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring,
R$_1$ to R$_4$ are each independently a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 1 to 30 ring-forming carbon atoms, or bonded to an adjacent group to form a ring, and
a and b are each independently an integer from 0 to 3.

2. The organic electroluminescence device of claim 1, wherein the emission layer emits delayed fluorescence.

3. The organic electroluminescence device of claim 1, wherein
the emission layer is a delayed fluorescence emission layer comprising a first compound and a second compound, and
the first compound comprises the nitrogen-containing compound.

4. The organic electroluminescence device of claim 1, wherein the emission layer is a thermally activated delayed fluorescence emission layer which emits blue light.

5. The organic electroluminescence device of claim 1, wherein Formula 1 is represented by Formula 2:

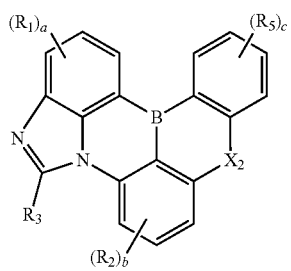

[Formula 2]

wherein in Formula 2, $X_2$ is $NAr_1$, O, or S, $R_5$ is a hydrogen atom, a deuterium atom, a halogen atom, a substituted or unsubstituted amine group, a substituted or unsubstituted boron group, a substituted or unsubstituted thiol group, a substituted or unsubstituted oxy group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, c is an integer from 0 to 4, and $Ar_1$, $R_1$ to $R_3$, and a and b are the same as defined in Formula 1.

6. The organic electroluminescence device of claim 5, wherein Formula 2 is represented by Formula 3:

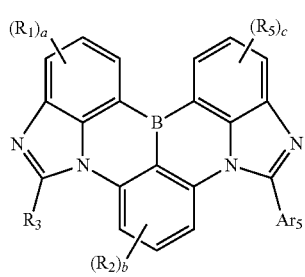

[Formula 3]

wherein in Formula 3, $Ar_5$ is a hydrogen atom, a deuterium atom, a substituted or unsubstituted aryl group having 6 to 30 ring-forming carbon atoms, or a substituted or unsubstituted heteroaryl group having 2 to 30 ring-forming carbon atoms, and $R_1$ to $R_3$, $R_5$, and a to c are the same as defined in Formula 2.

7. The organic electroluminescence device of claim 5, wherein Formula 2 is represented by Formula 4-1 or Formula 4-2:

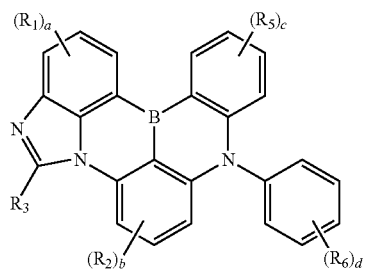

[Formula 4-1]

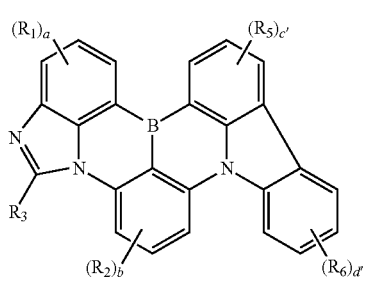

[Formula 4-2]

wherein in Formula 4-1 and Formula 4-2, $R_6$ is a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, c' is an integer from 0 to 3, d is an integer from 0 to 5, d' is an integer from 0 to 4, and $R_1$ to $R_3$, $R_5$, and a to c are the same as defined in Formula 2.

8. The organic electroluminescence device of claim 5, wherein Formula 2 is represented by Formula 5-1 or Formula 5-2:

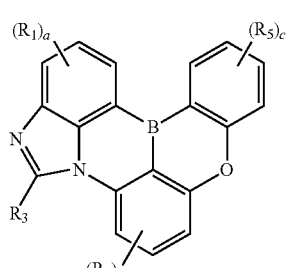

[Formula 5-1]

-continued

[Formula 5-2]

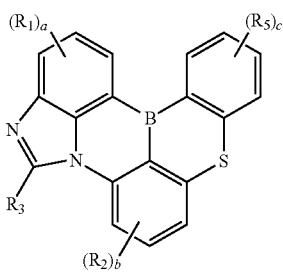

wherein in Formula 5-1 and Formula 5-2, $R_1$ to $R_3$, $R_5$, and a to c are the same as defined in Formula 2.

9. The organic electroluminescence device of claim 5, wherein Formula 2 is represented by Formula 6:

[Formula 6]

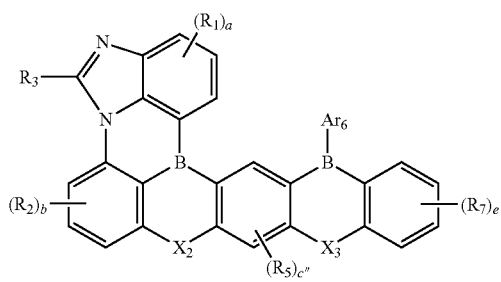

wherein in Formula 6, $X_3$ is $NAr_1$, O, or S, $Ar_6$ is a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, $R_7$ is a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, c" is an integer from 0 to 2, e is an integer from 0 to 4, and $X_2$, $Ar_1$, $R_1$ to $R_3$, $R_5$, and a and b are the same as defined in Formula 2.

10. The organic electroluminescence device of claim 9, wherein Formula 6 is represented by Formula 7:

[Formula 7]

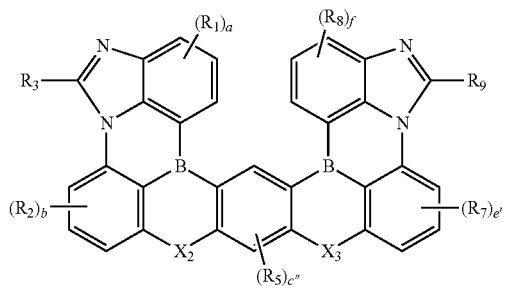

wherein in Formula 7, $R_8$ and $R_9$ are each independently a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, e' and f are each independently an integer from 0 to 3, and $X_2$, $X_3$, $R_1$ to $R_3$, $R_5$, $R_7$, a, b, and c" are the same as defined in Formula 6.

11. The organic electroluminescence device of claim 9, wherein $X_2$ and $X_3$ are the same.

12. The organic electroluminescence device of claim 1, wherein $R_3$ is a hydrogen atom, a deuterium atom, a substituted or unsubstituted phenyl group, or a substituted or unsubstituted biphenyl group.

13. The organic electroluminescence device of claim 1, wherein $R_1$ and $R_2$ are each independently a hydrogen atom, a deuterium atom, a substituted or unsubstituted arylamino group, a substituted or unsubstituted alkyl group having 1 to 6 carbon atoms, a substituted or unsubstituted phenyl group, a substituted or unsubstituted biphenyl group, or a substituted or unsubstituted carbazole group.

14. The organic electroluminescence device of claim 1, wherein the compound represented by Formula 1 is one selected from Compound Group 1:

[Compound Group 1]

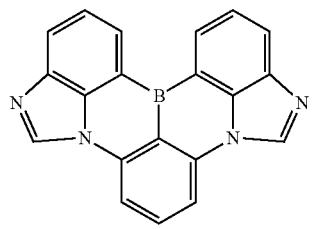

-continued
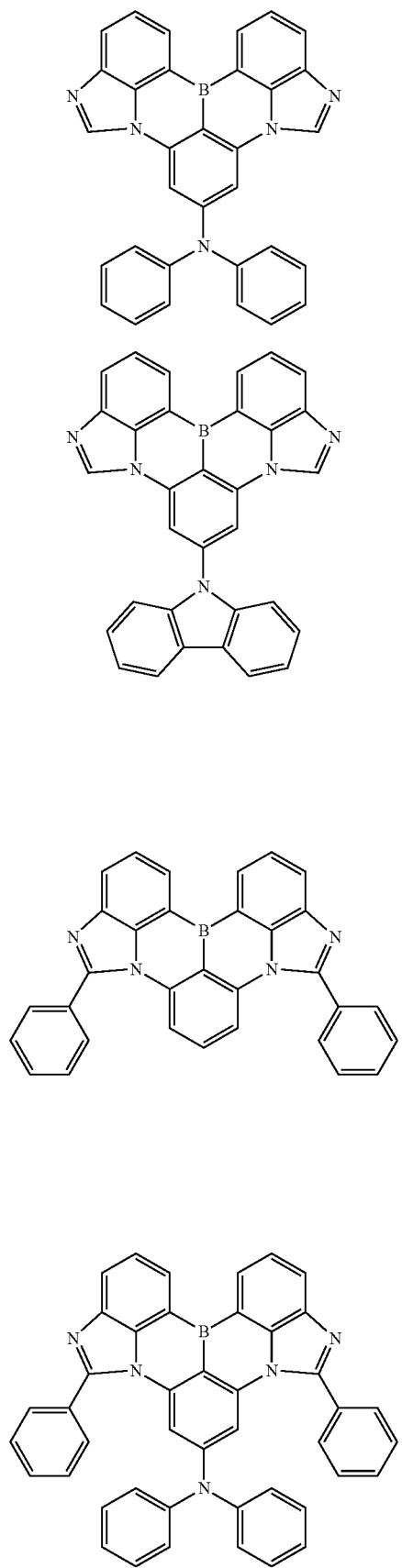
-continued
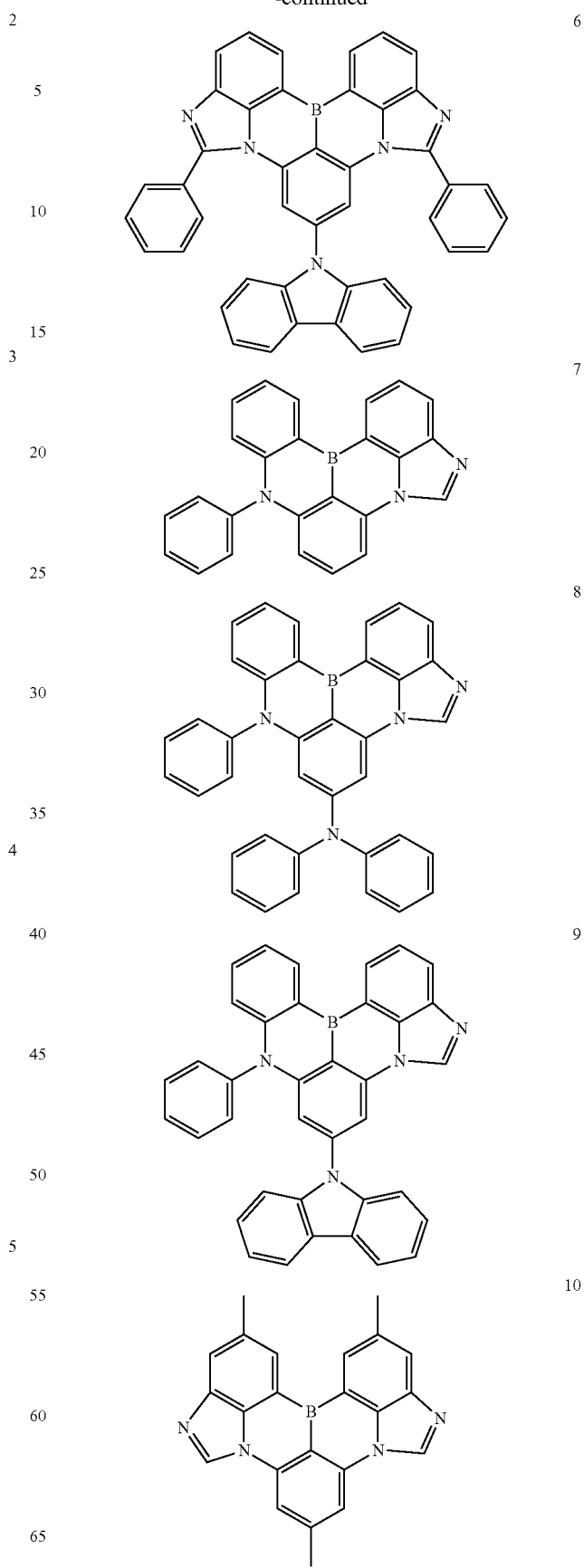

11
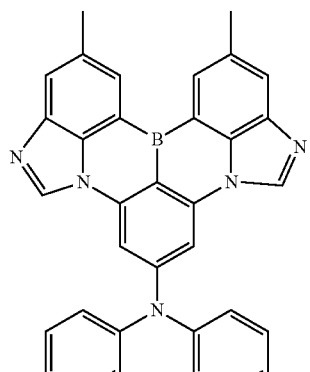
12
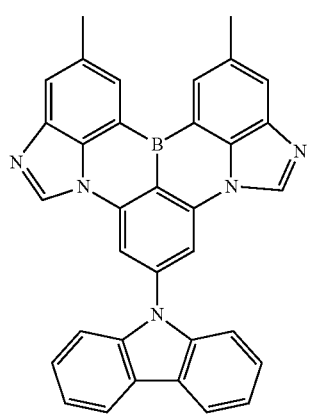
13
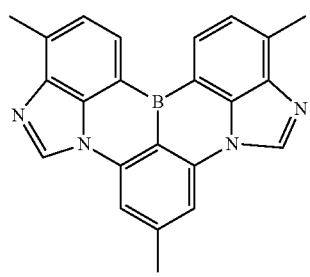
14
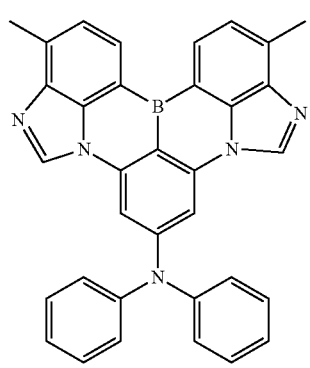
15
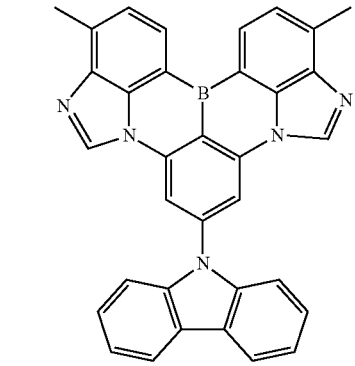
16
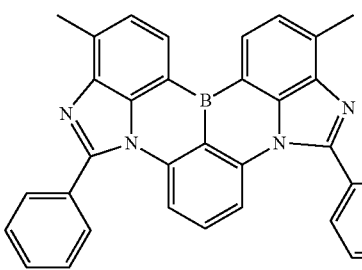
17
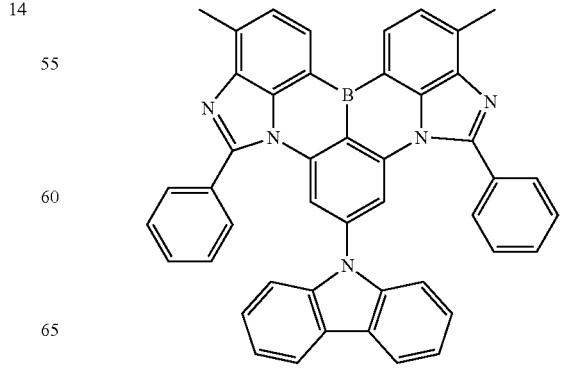
18

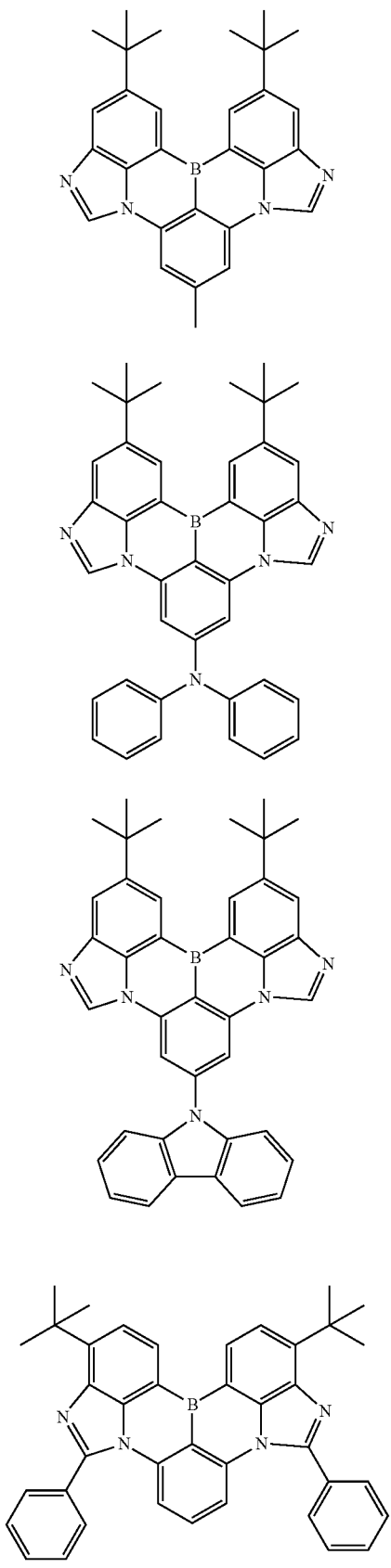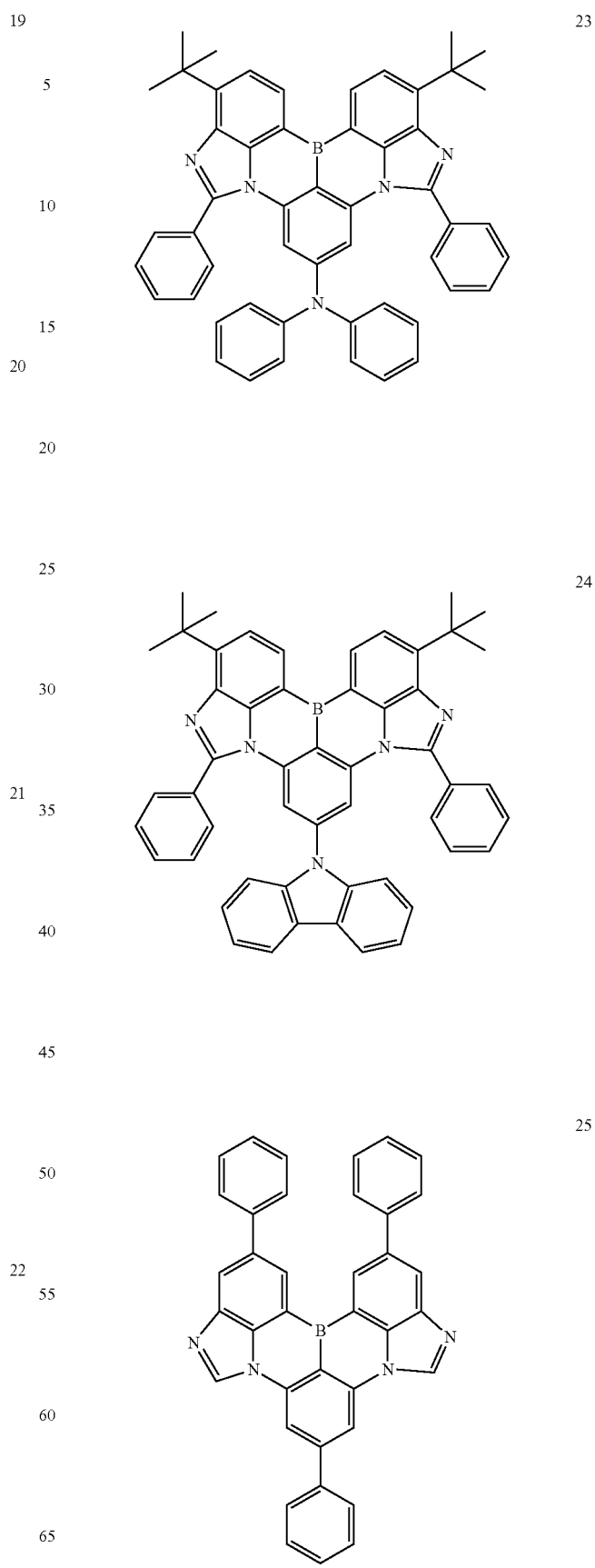

-continued
26
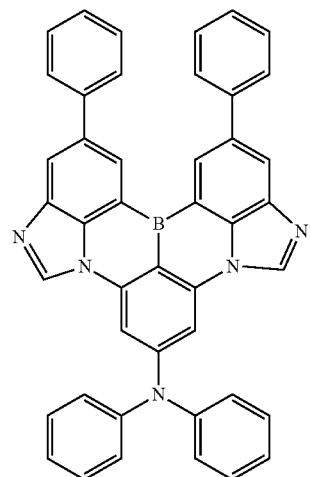
27
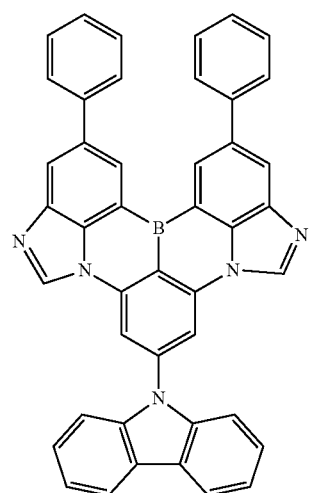
28
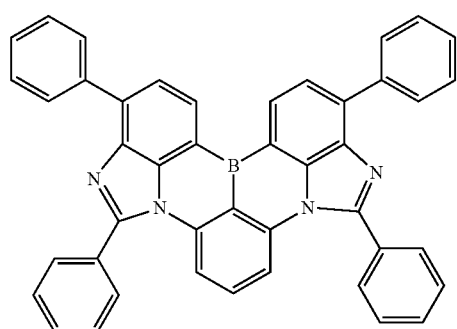
-continued
29
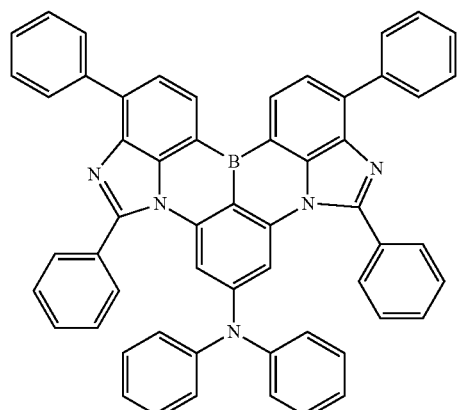
30
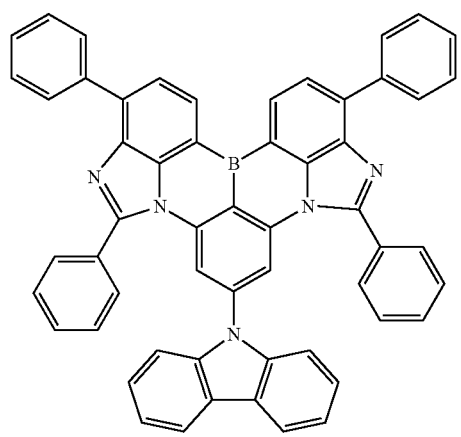
31
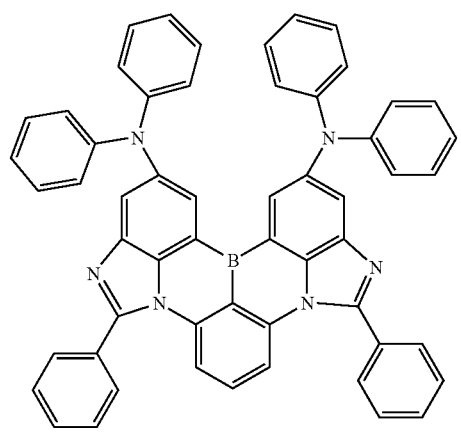

32
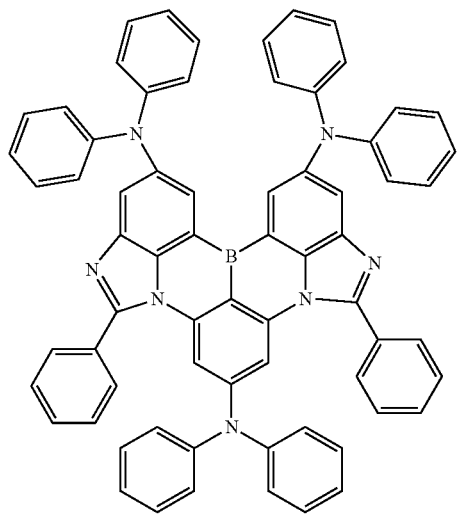
33
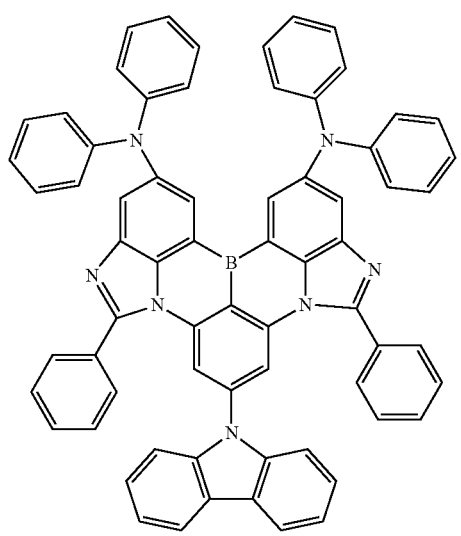
34
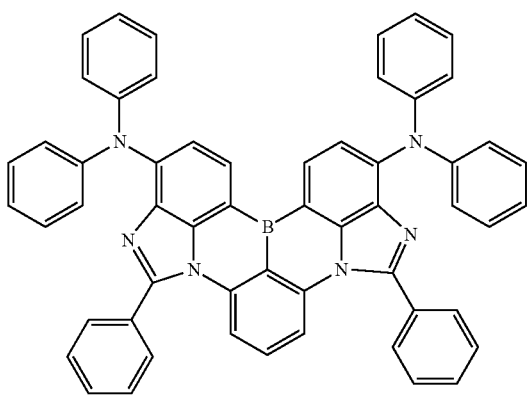
35
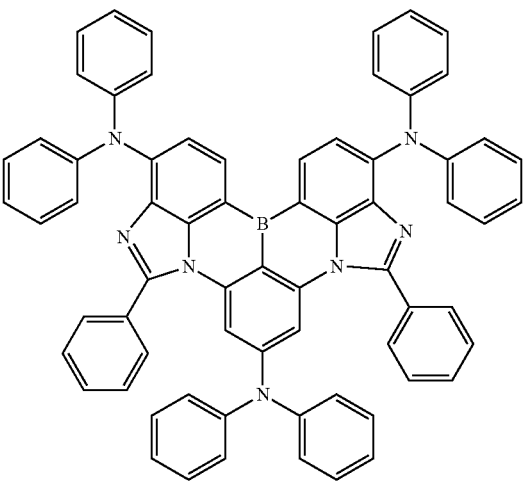
36
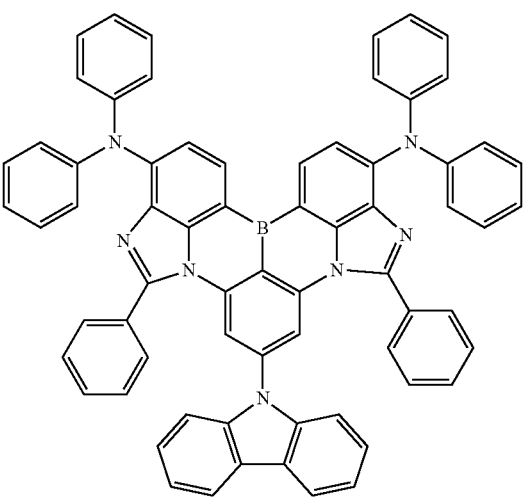
37
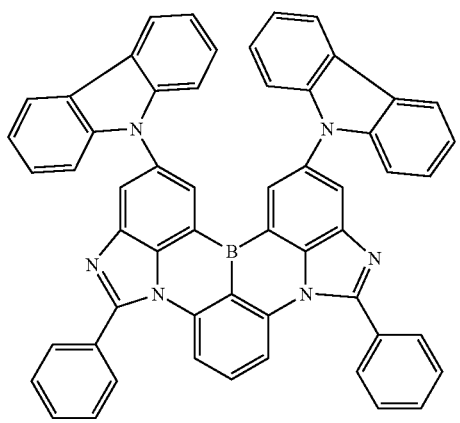

103
-continued
38
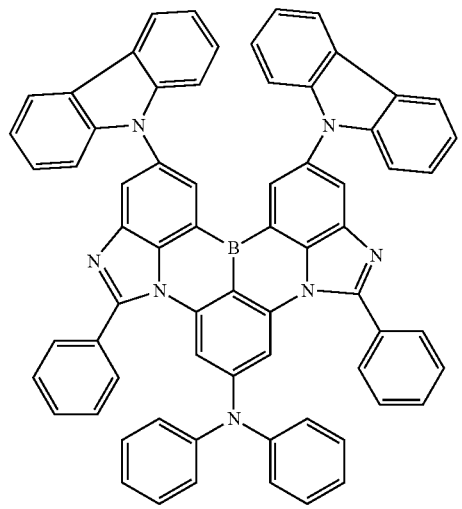
39
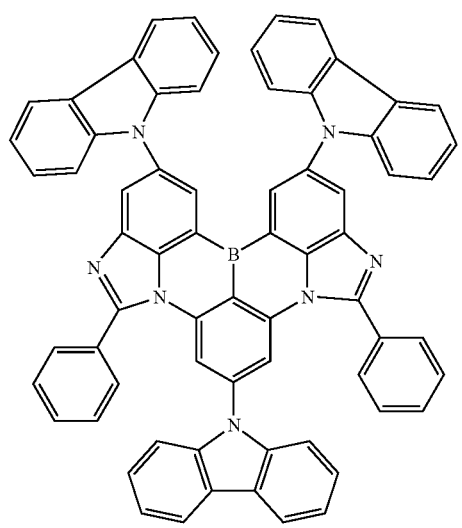
40
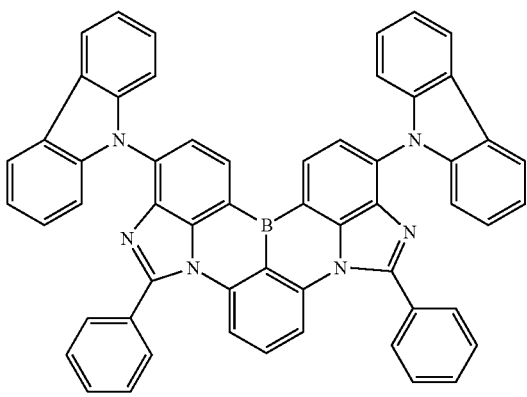
104
-continued
41
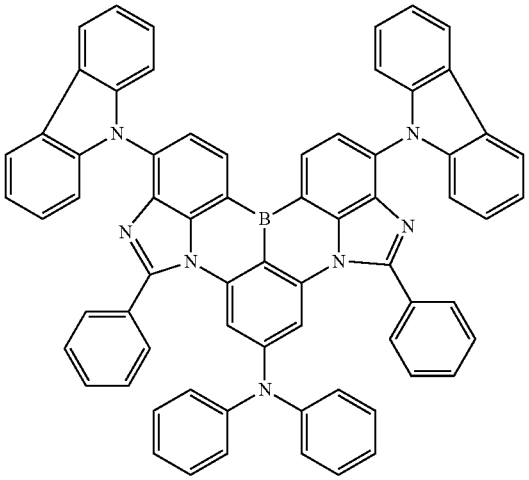
42
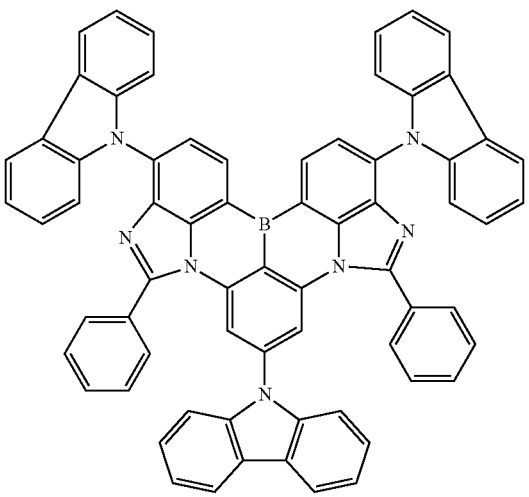
43
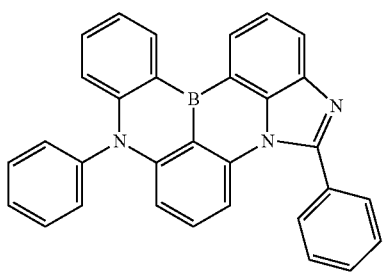
44
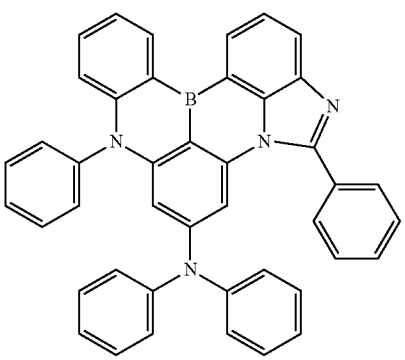

45
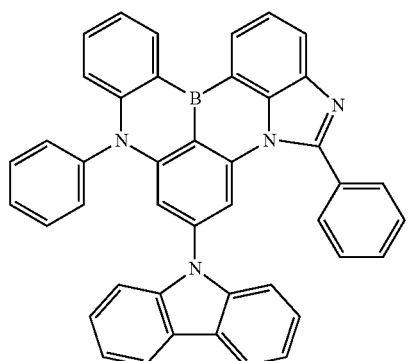
46
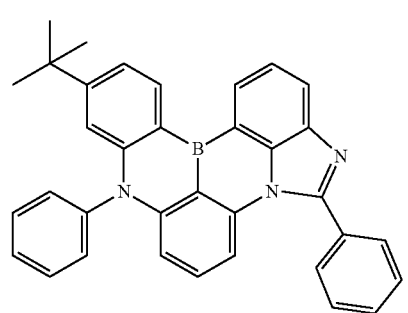
47
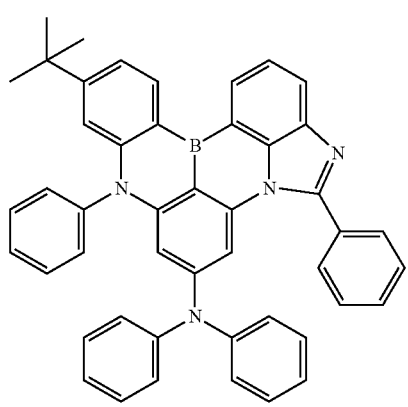
48
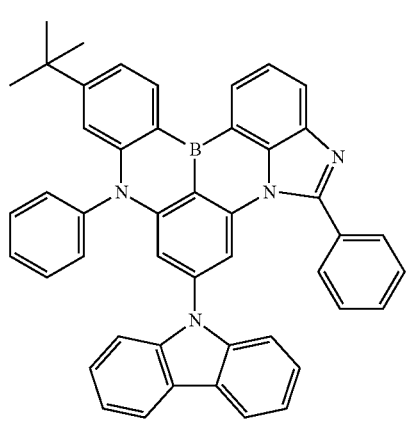
49
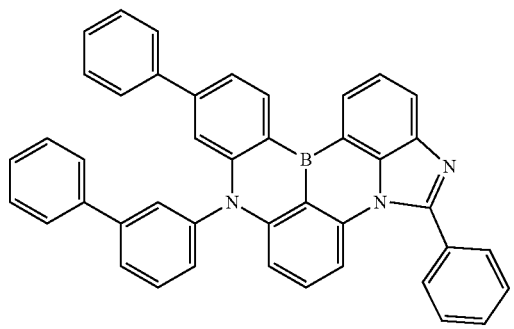
50
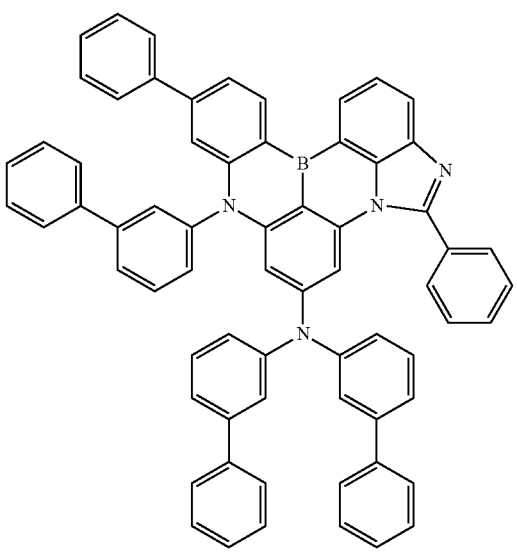
51
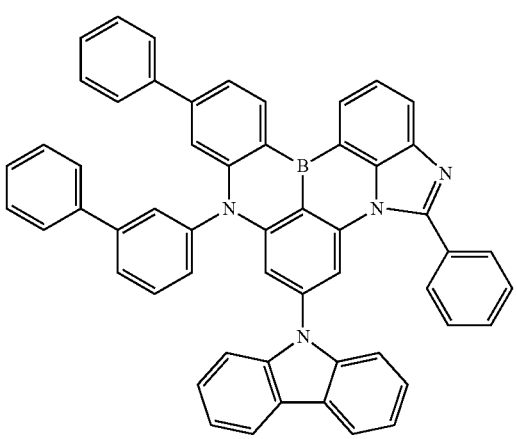

52
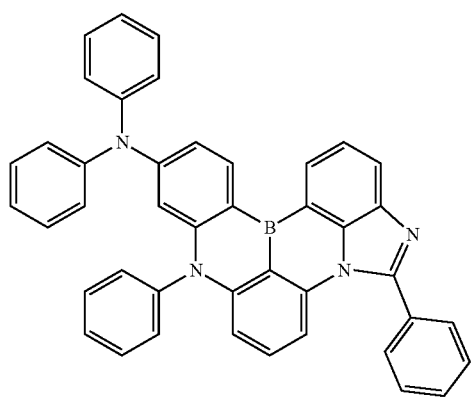
53
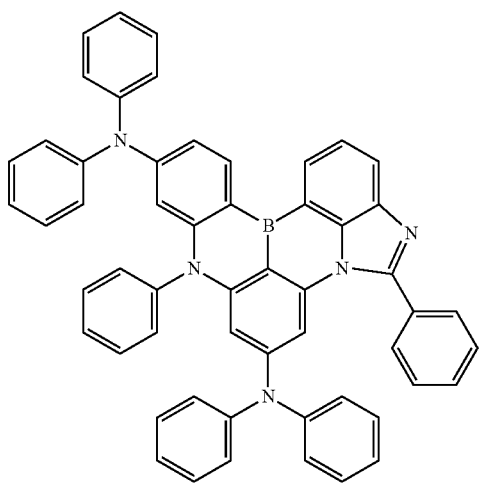
54
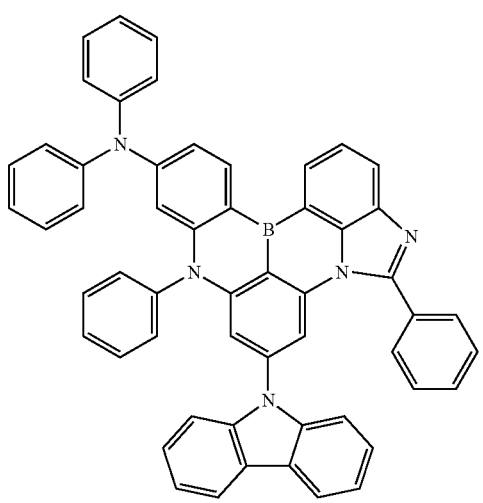
55
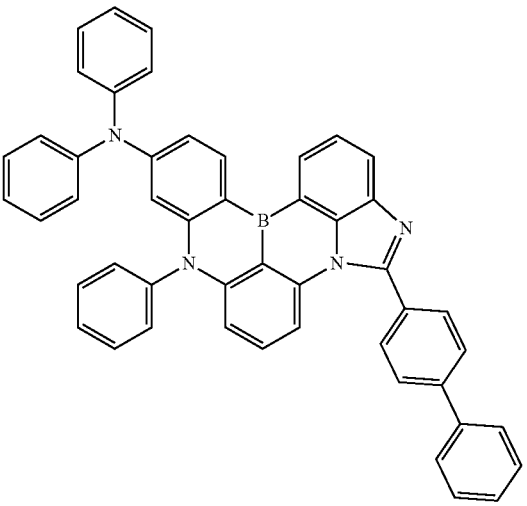
56
57
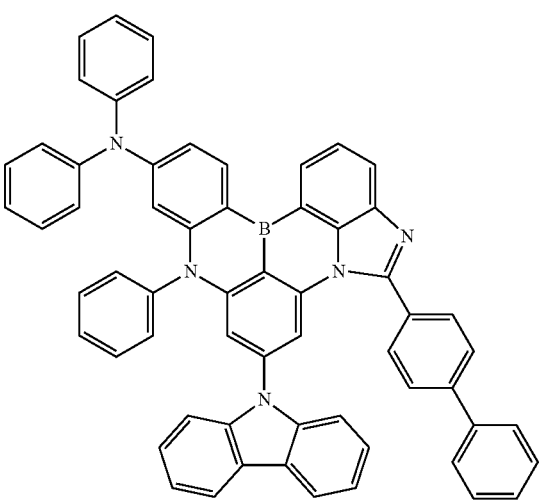

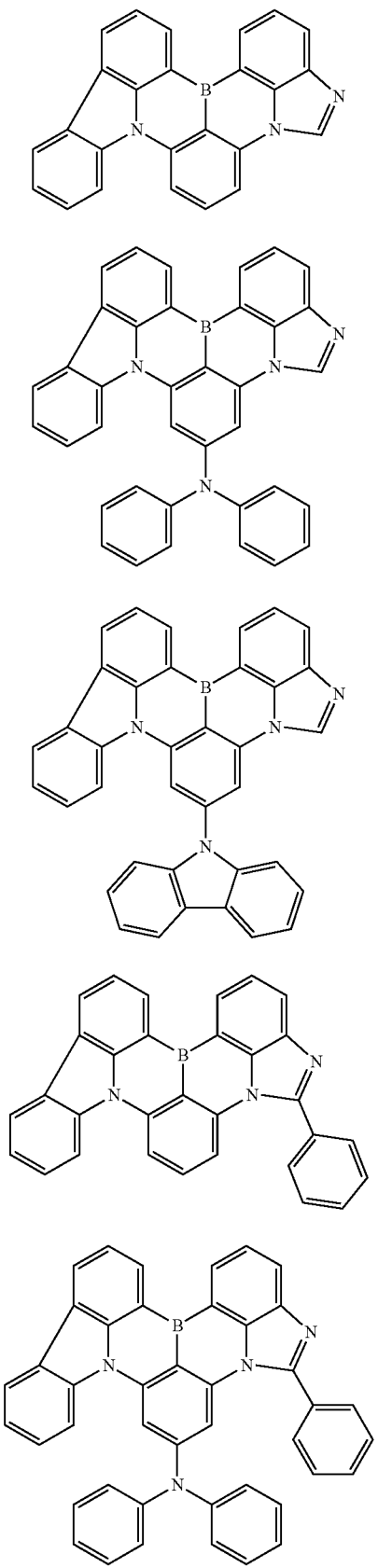
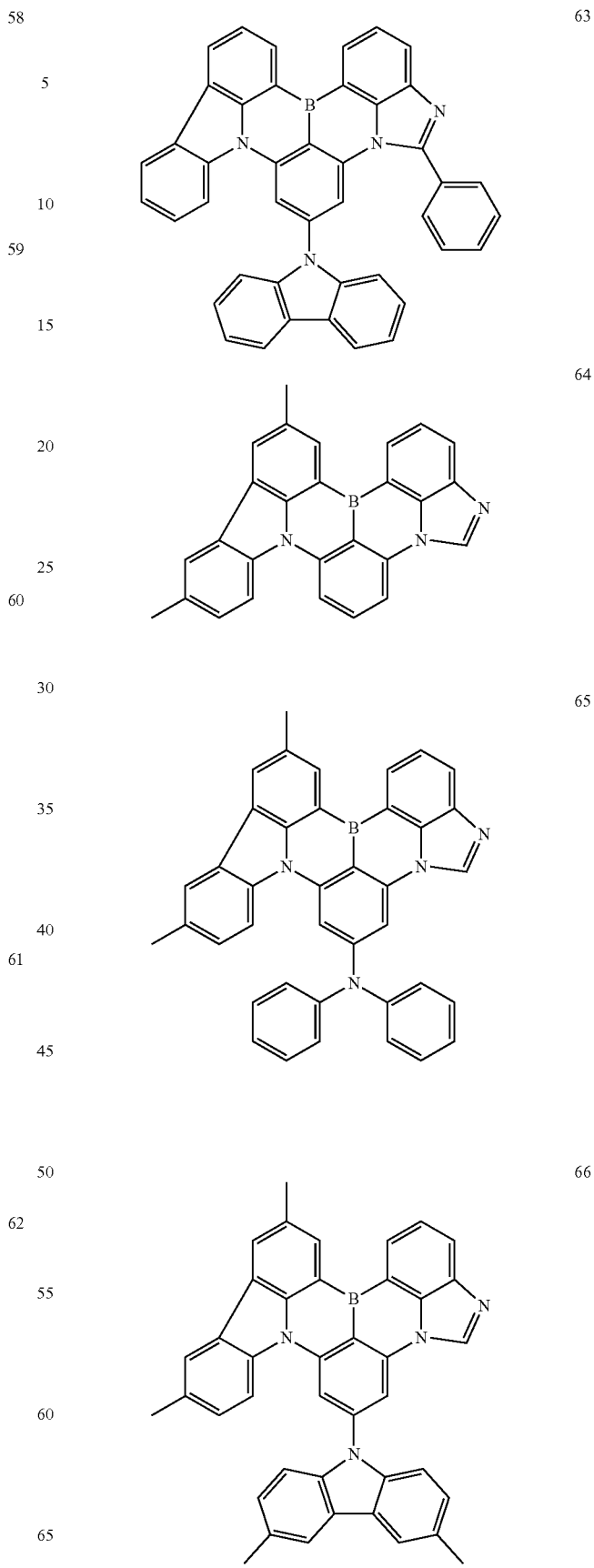

67
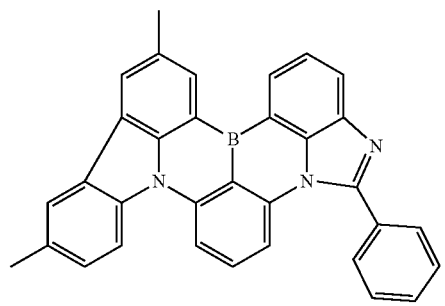
68
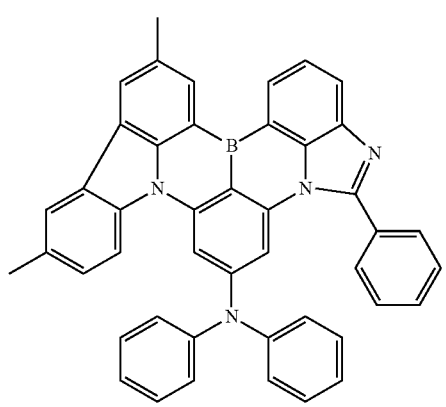
69
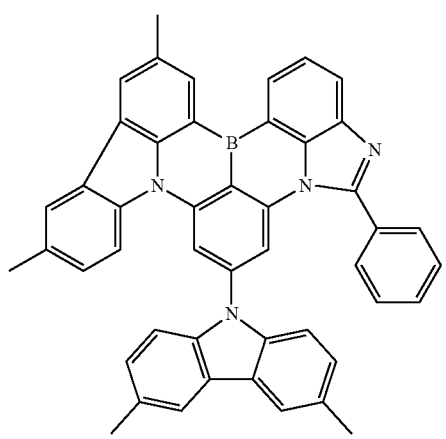
70
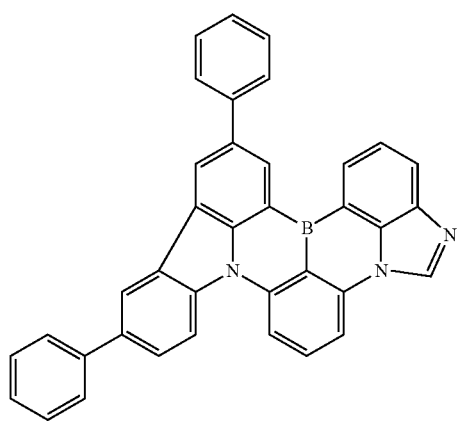
71
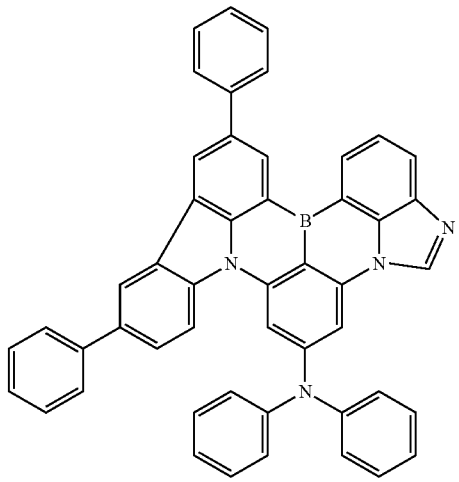
72
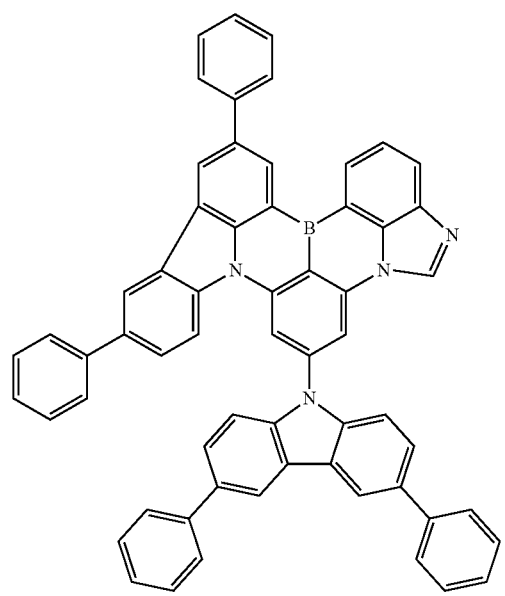
73
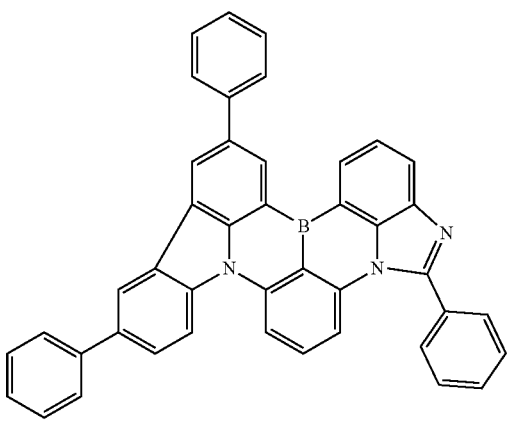

74
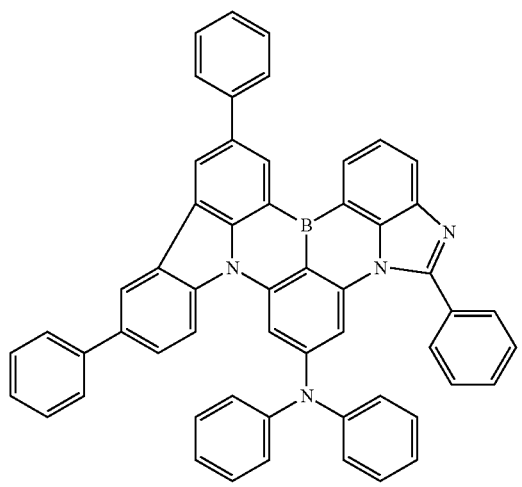
75
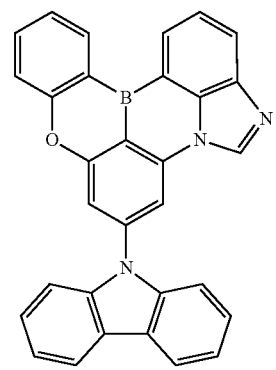
76
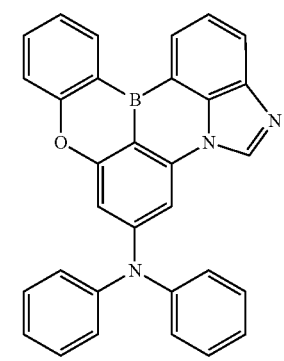
77
78
79
80
81
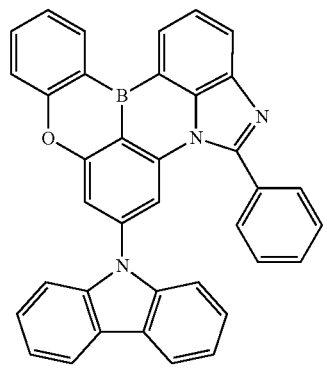

82
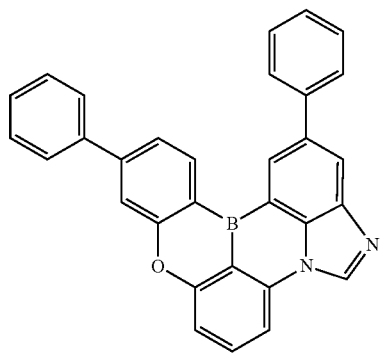
83
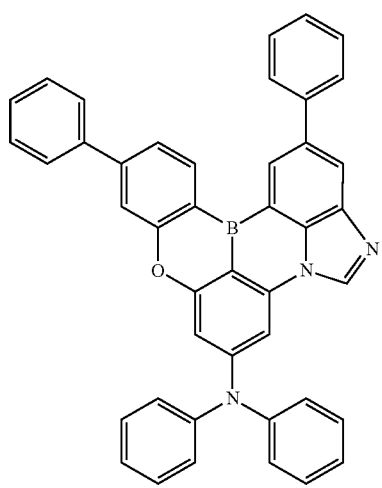
84
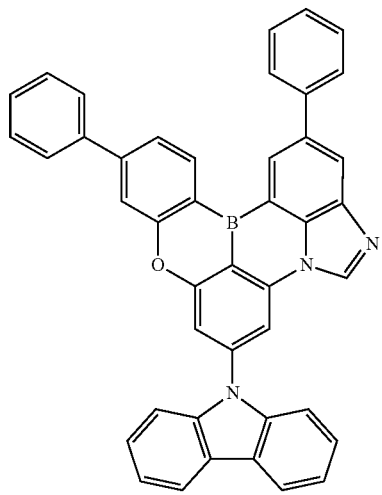
85
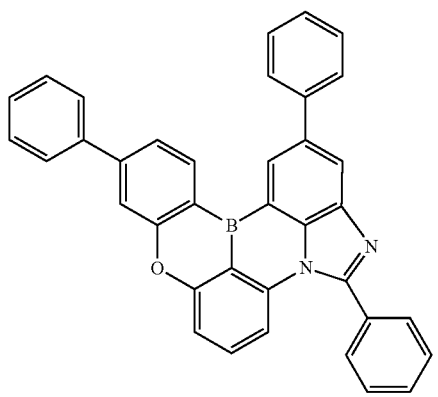
86
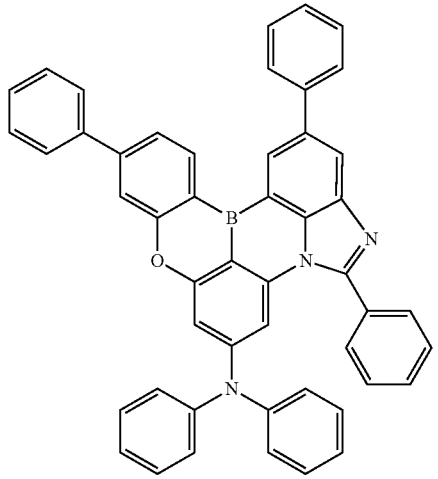
87
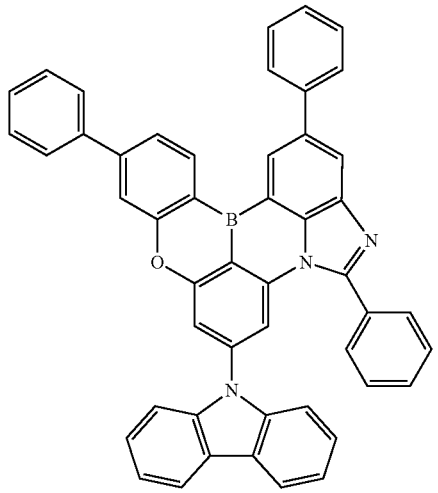

88
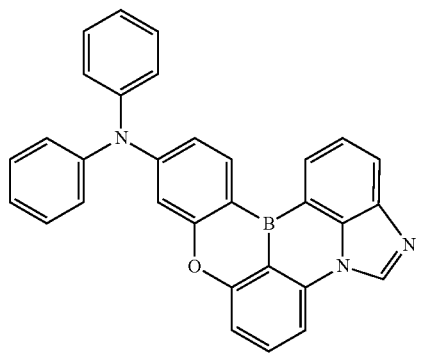
89
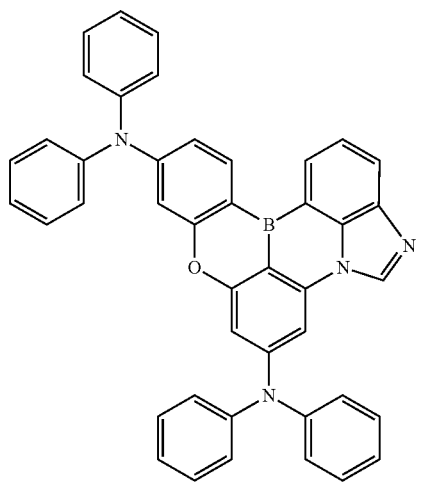
90
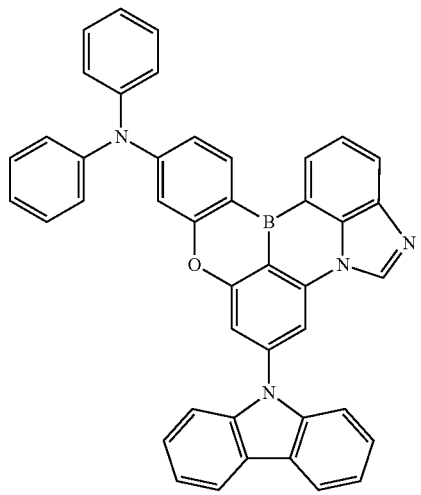
91
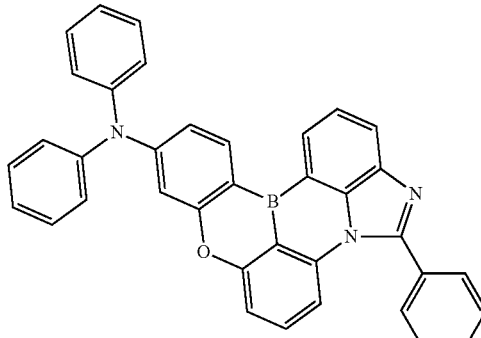
92
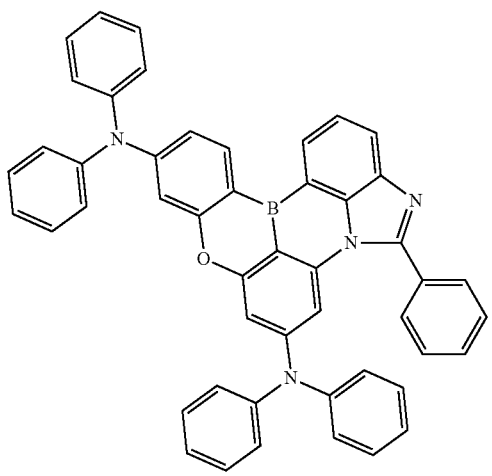
93
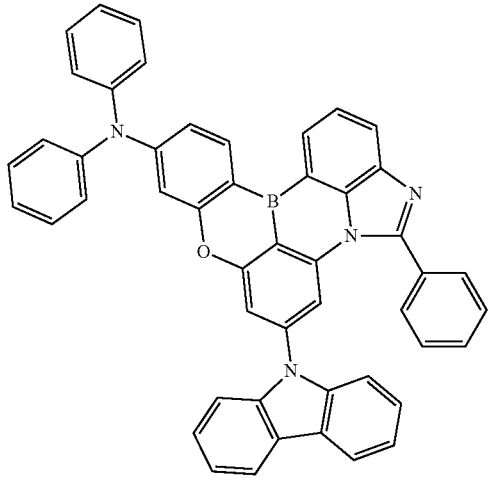
94
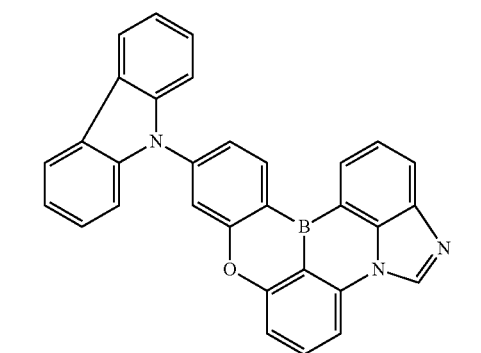

119
95
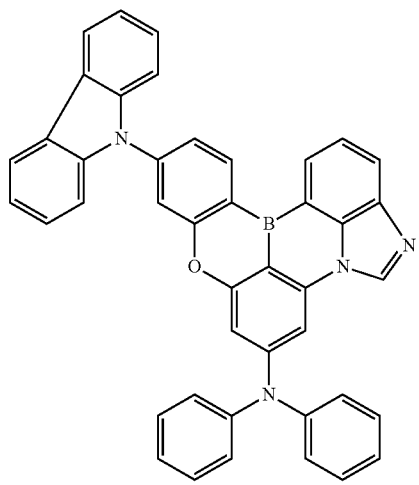
96
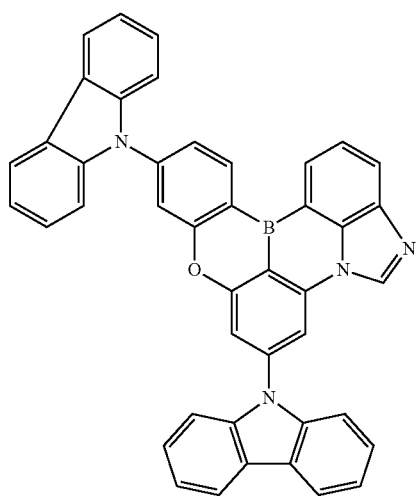
97
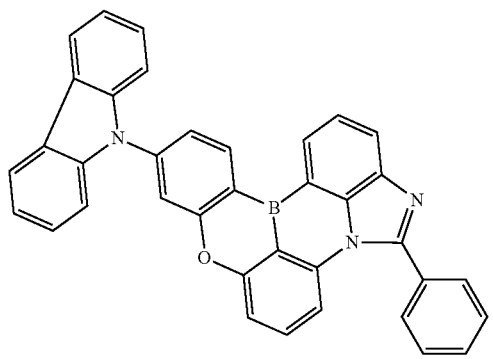
120
98
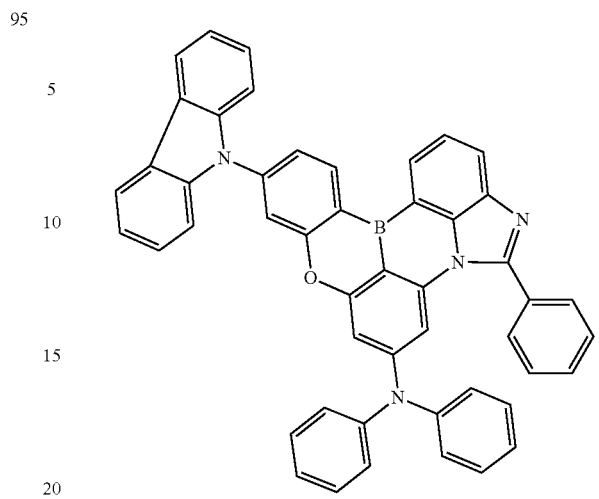
99
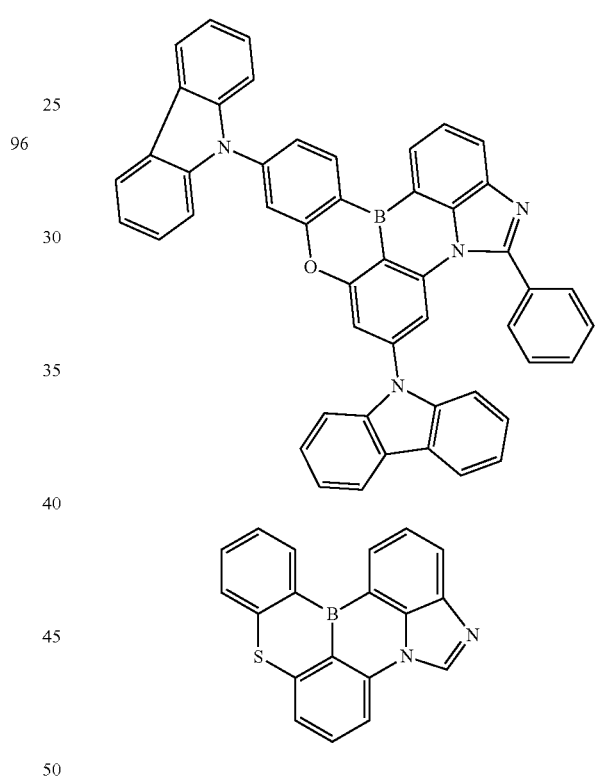
100
101
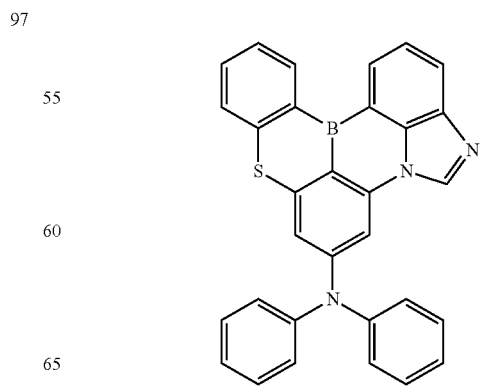

102
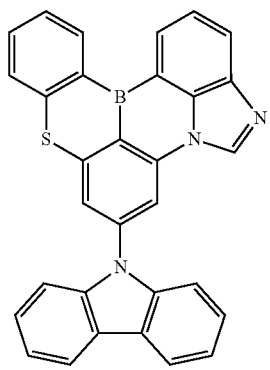
103
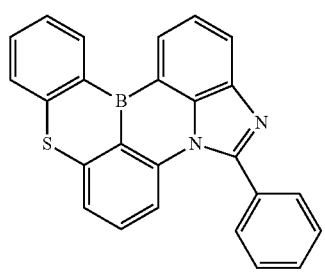
104
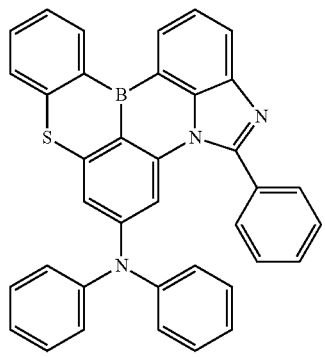
105
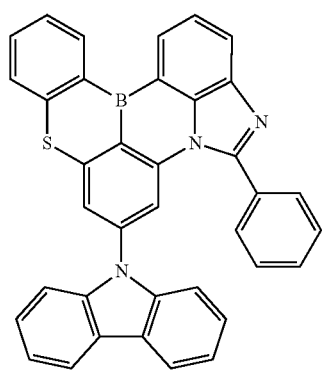
106
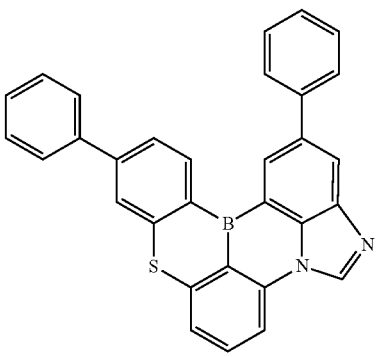
107
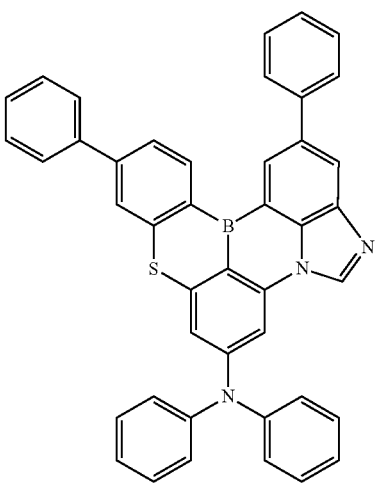
108
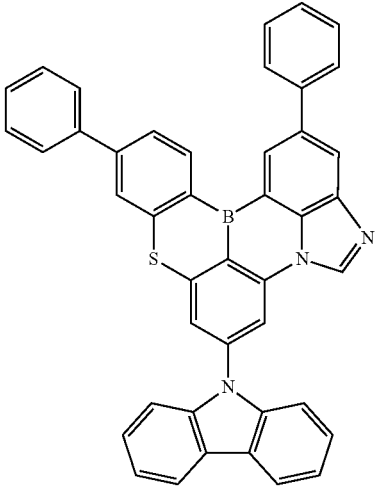

-continued
109
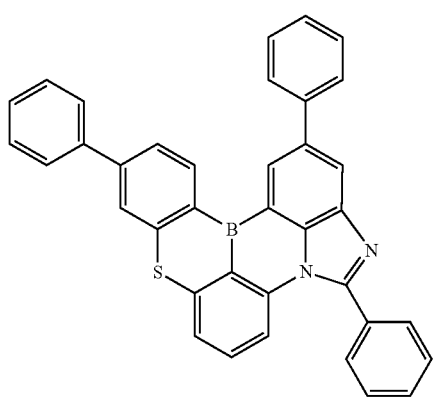
110
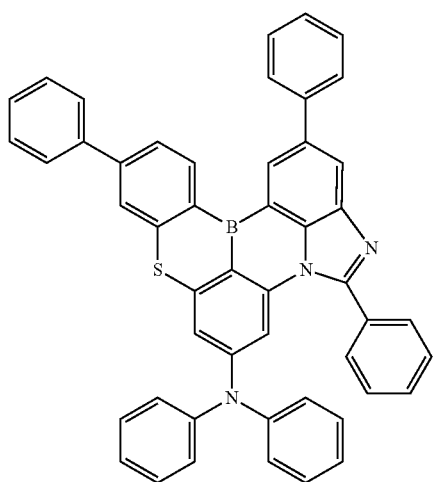
111
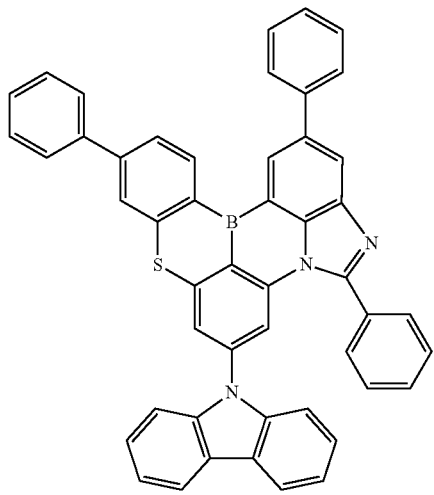
-continued
112
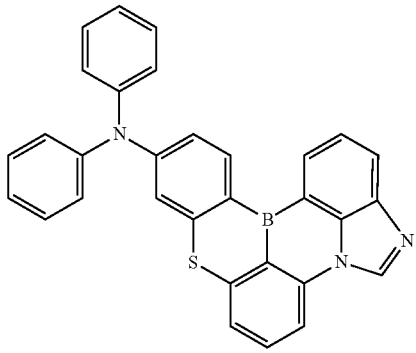
113
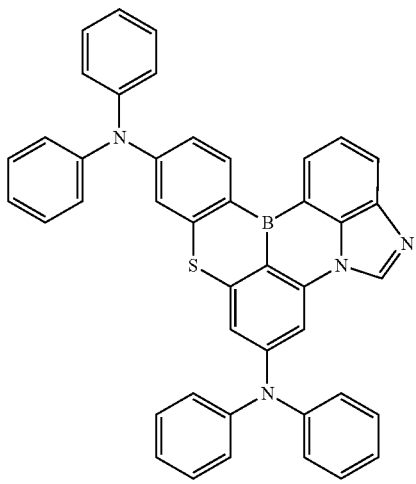
114
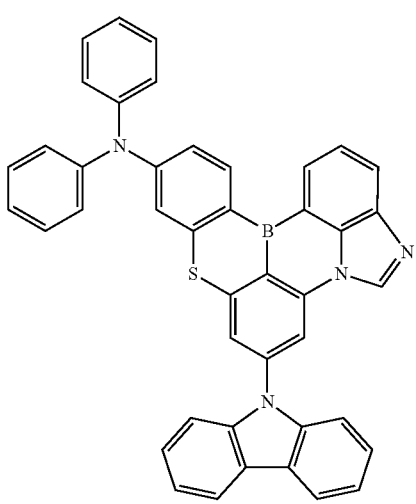

125
-continued
115
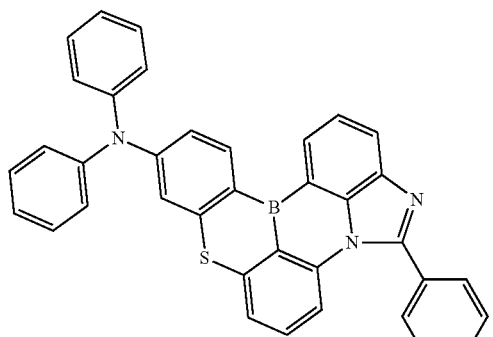
116
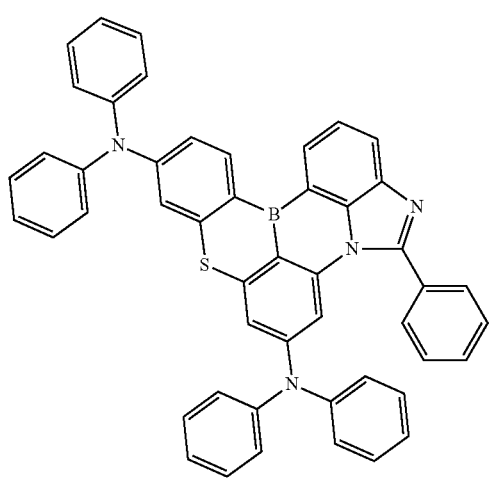
117
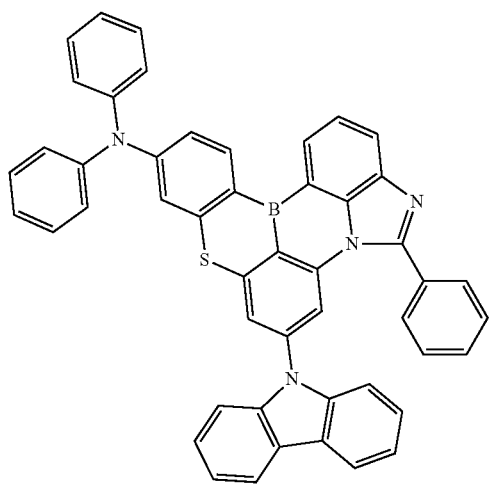
118
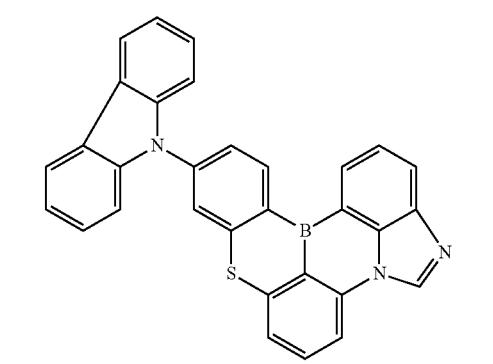
126
-continued
119
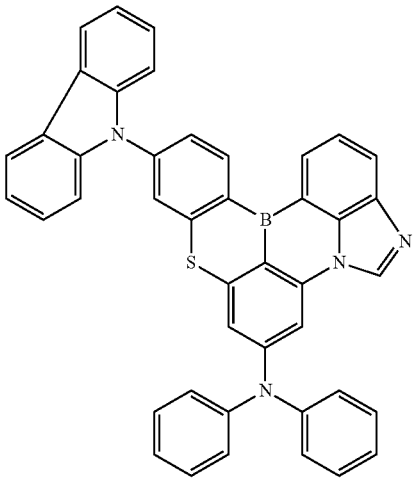
120
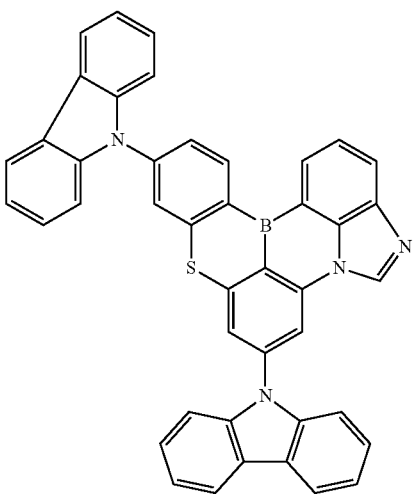
121
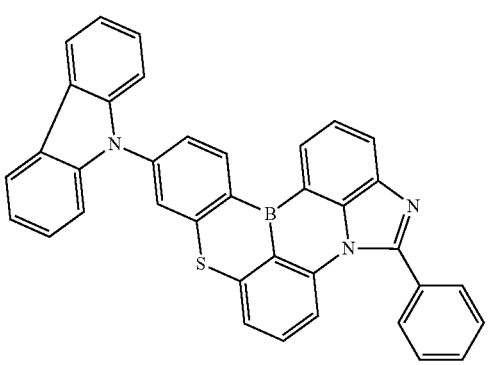

122
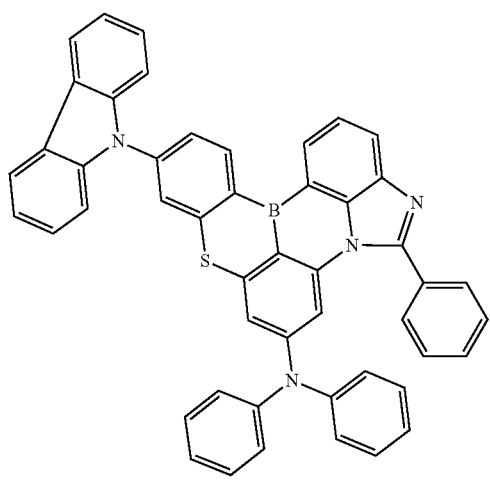
123
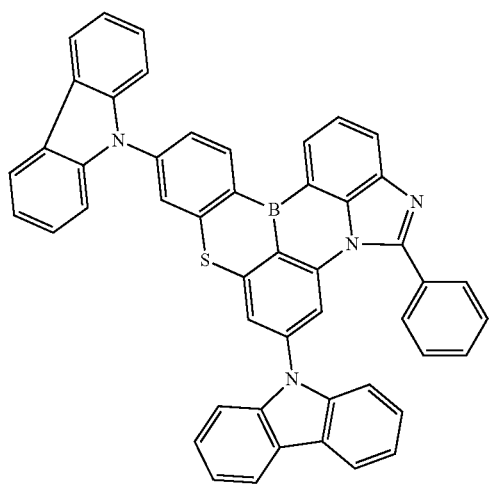
124
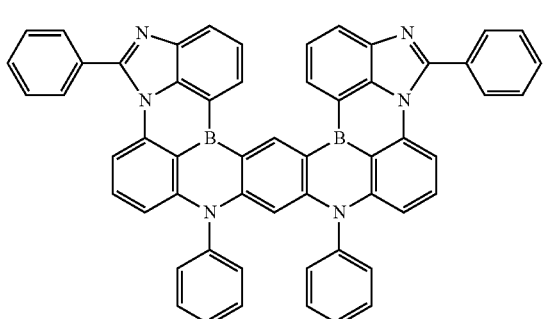
125
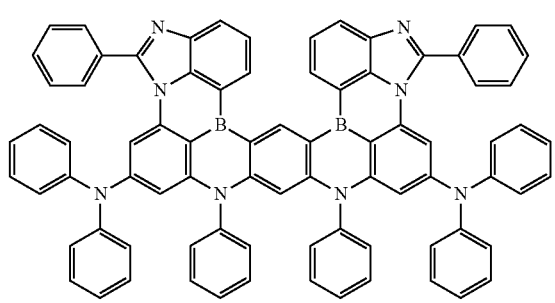
126
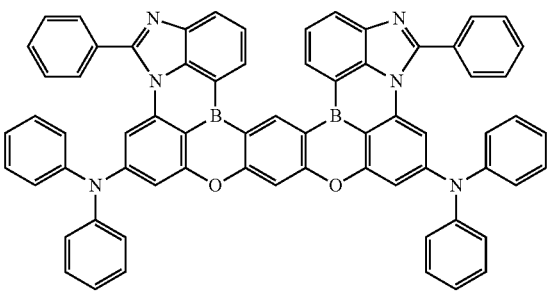
127
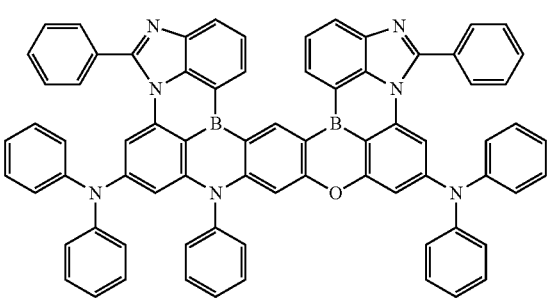
128
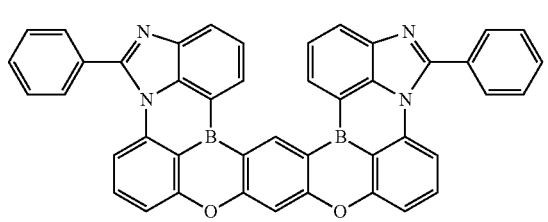
129
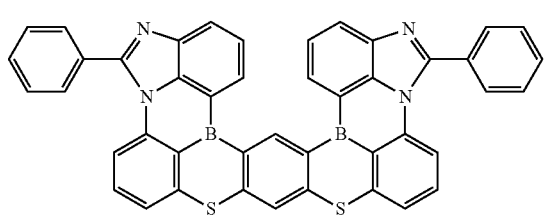
130
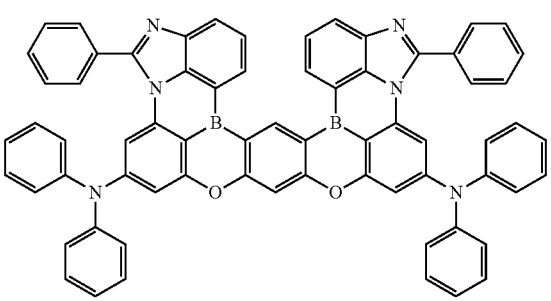

131
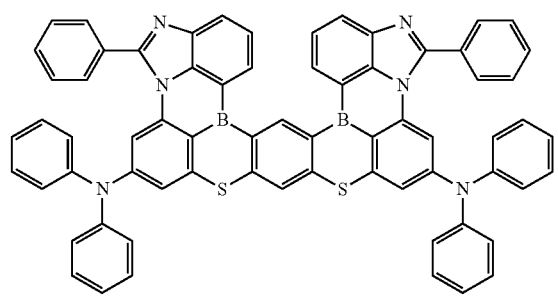
132
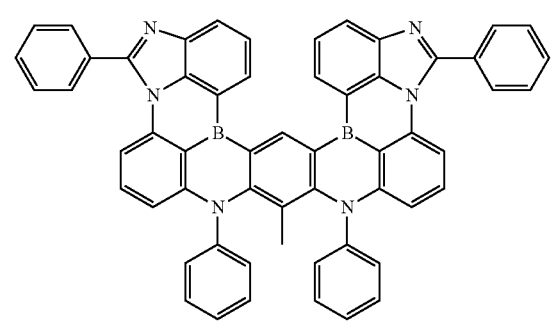
133
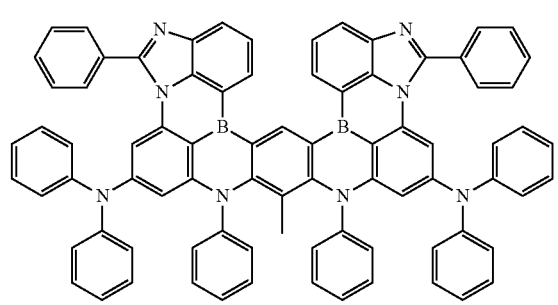
134
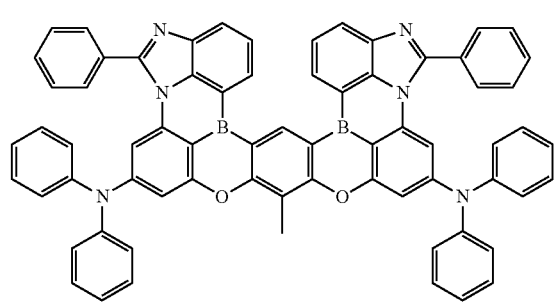
135
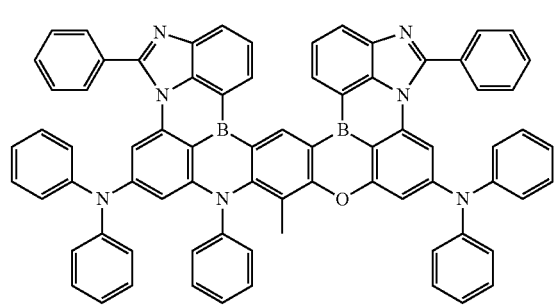
136
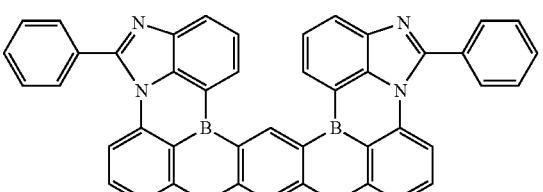
137
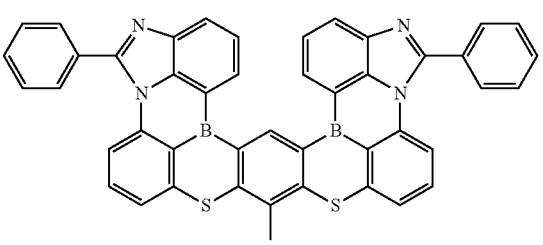
138
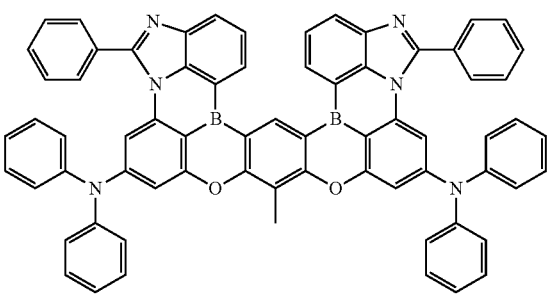
139
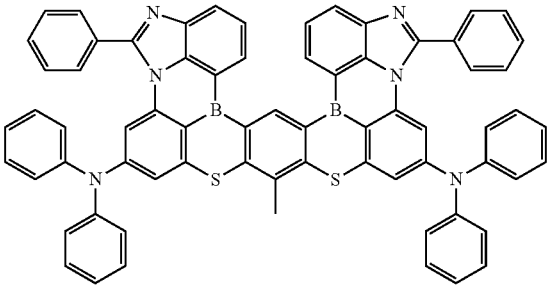
140
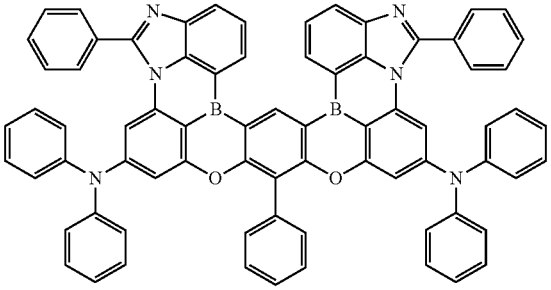

141
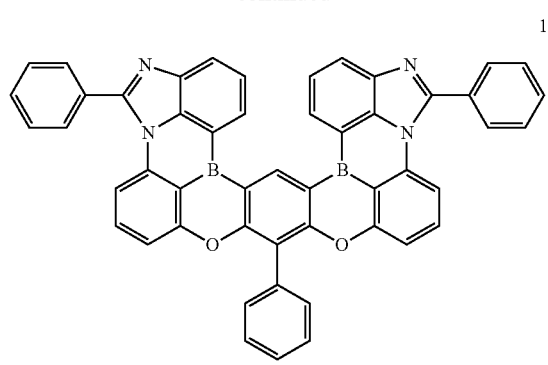
142
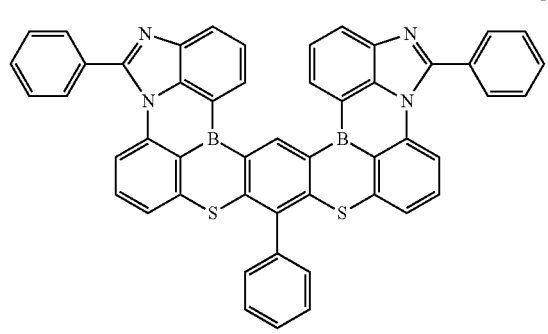
143
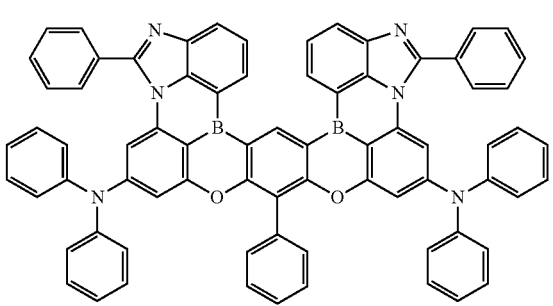
144
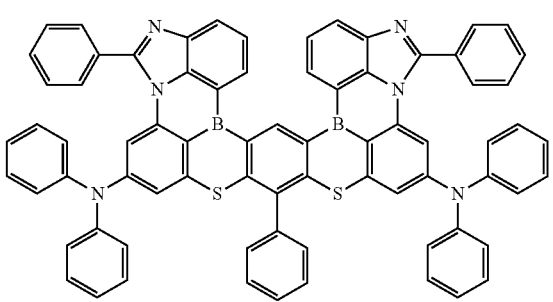
145
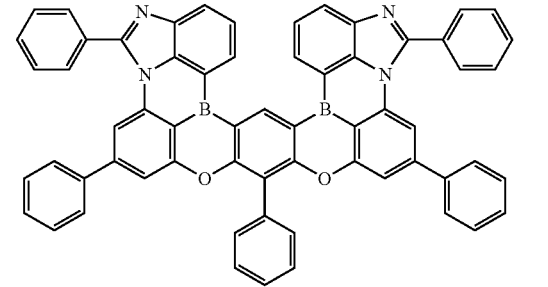
146
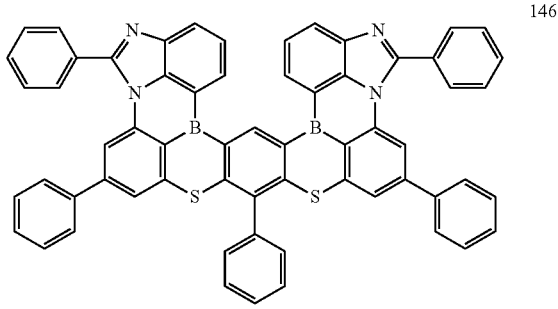
147
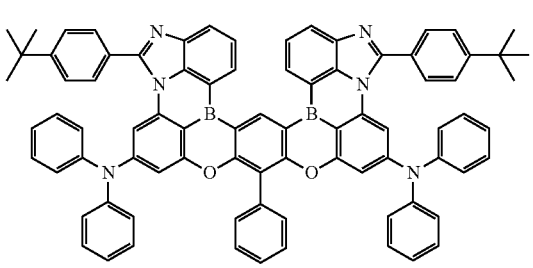
148
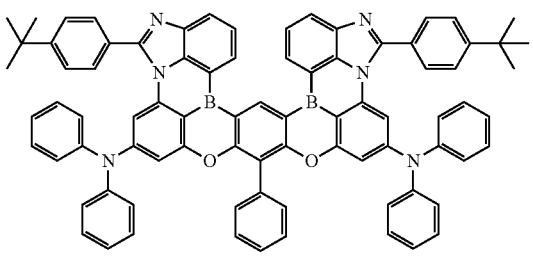
149
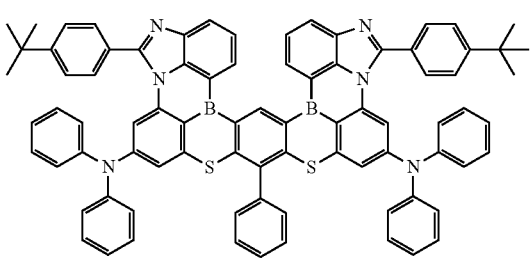
150
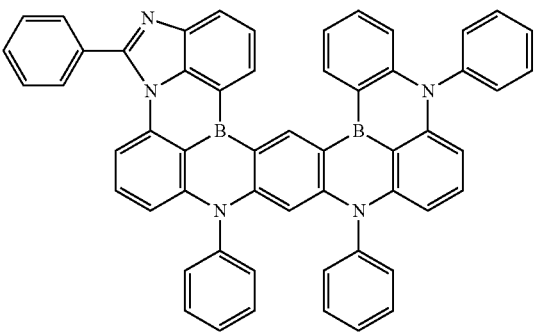

151
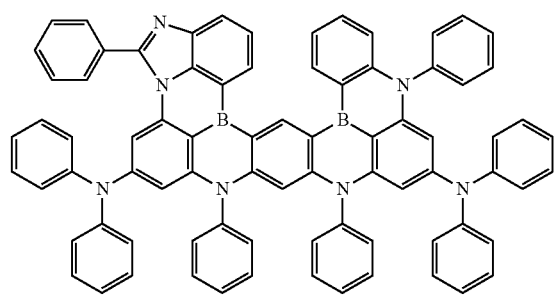
152
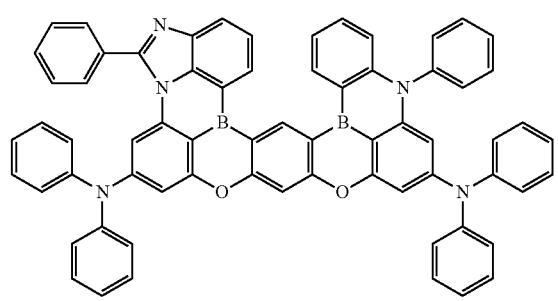
153
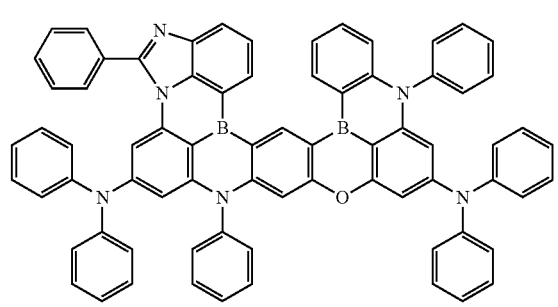
154
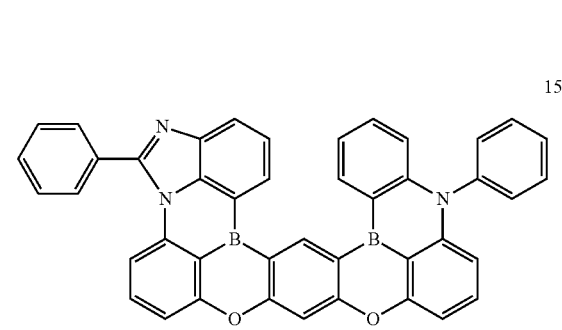
155
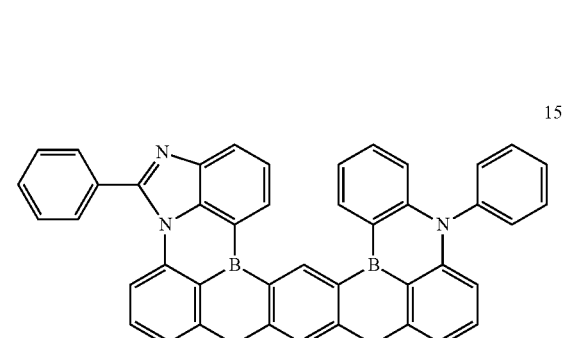
156
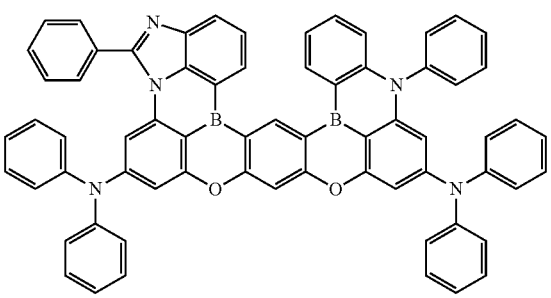
157
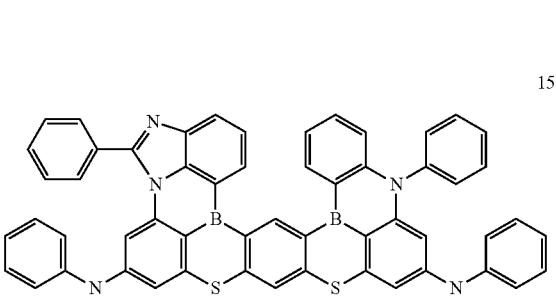
158
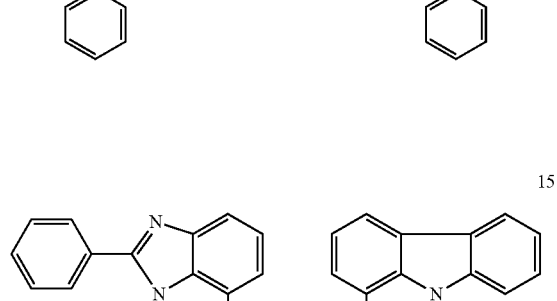
159
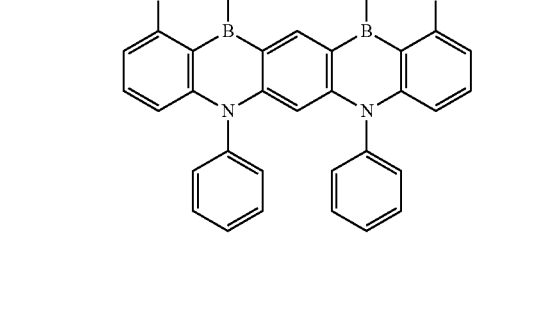

160
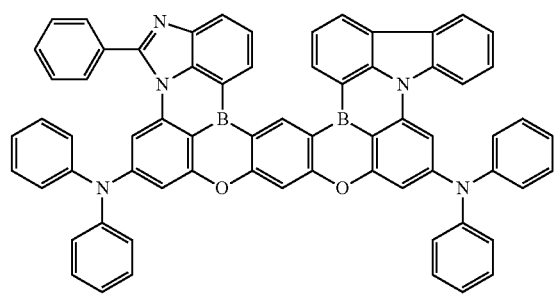
163
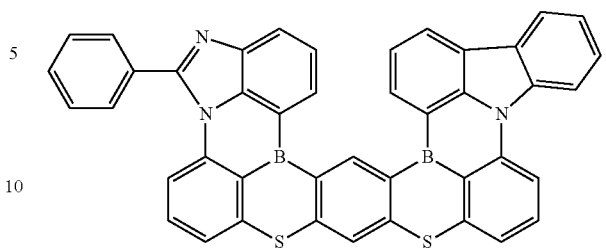
161
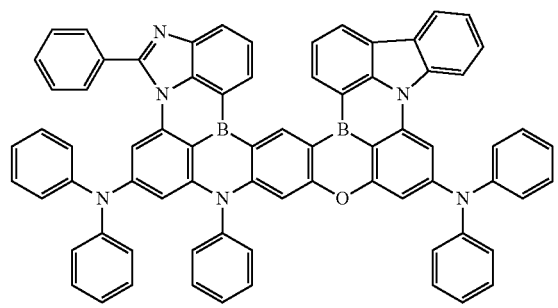
164
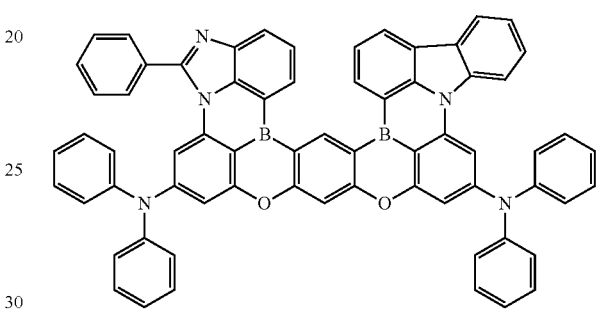
162
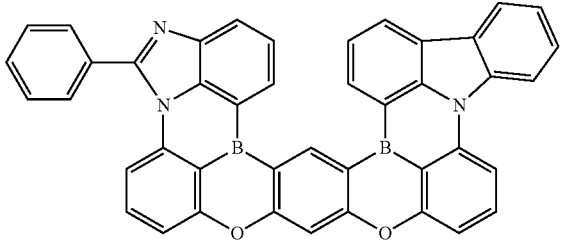
165
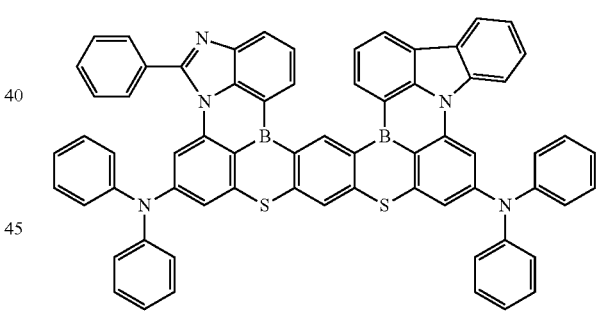
167
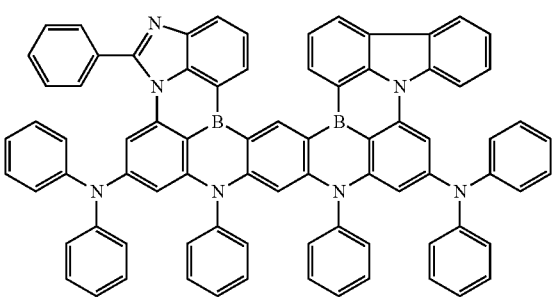
168
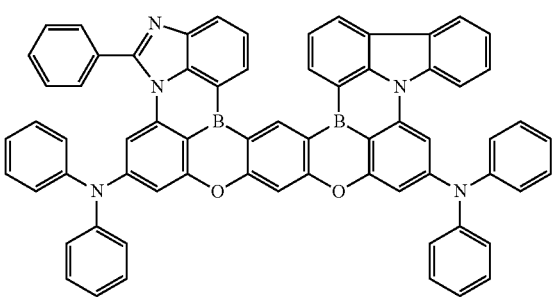

-continued
169
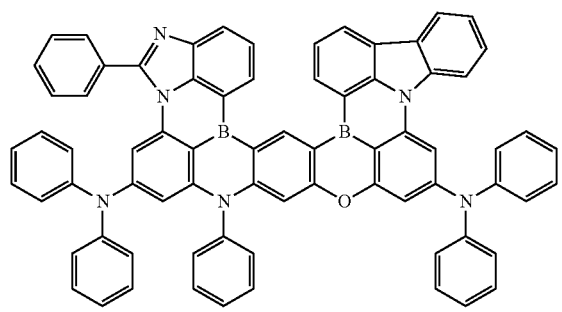
170
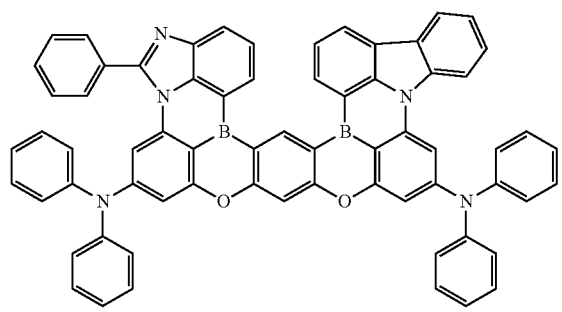
171
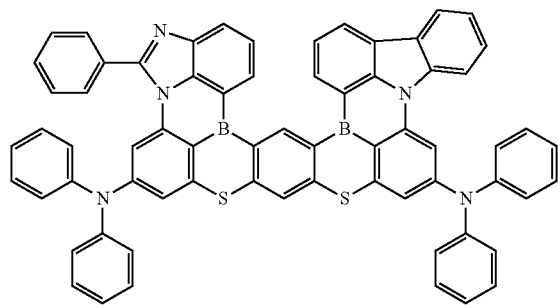
172
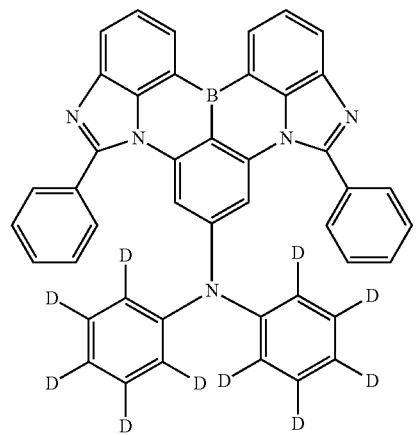
173
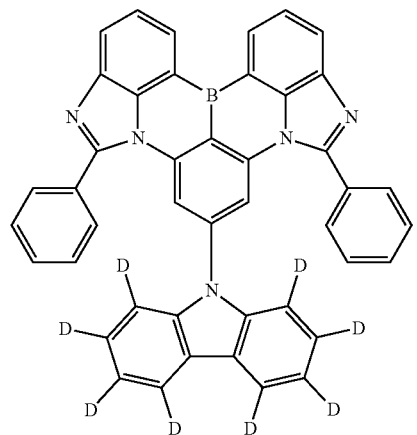
174
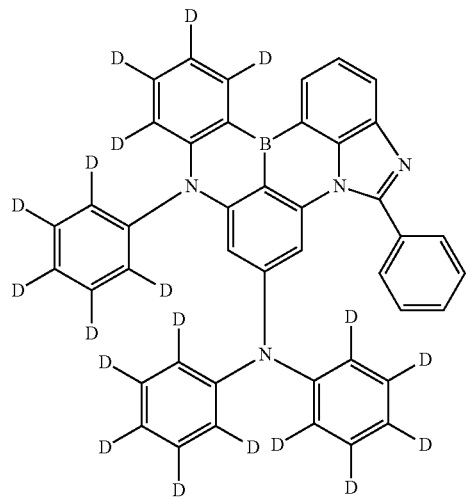

175
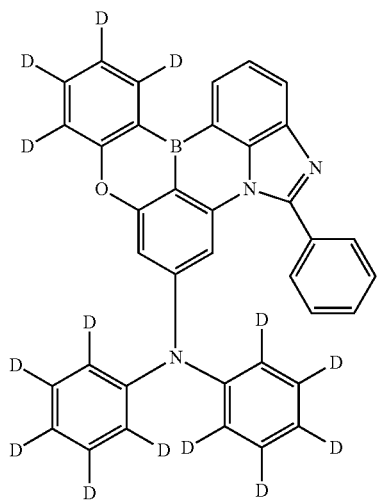
176
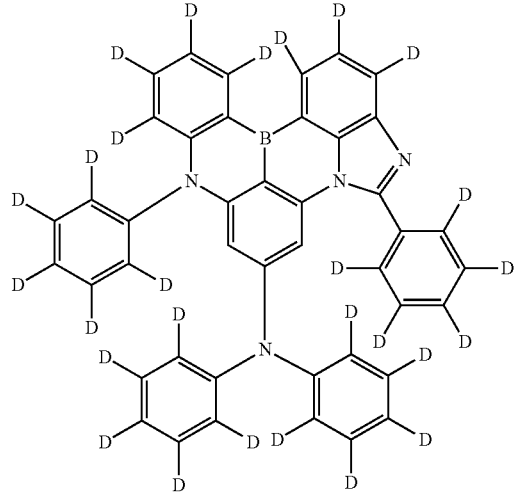
177
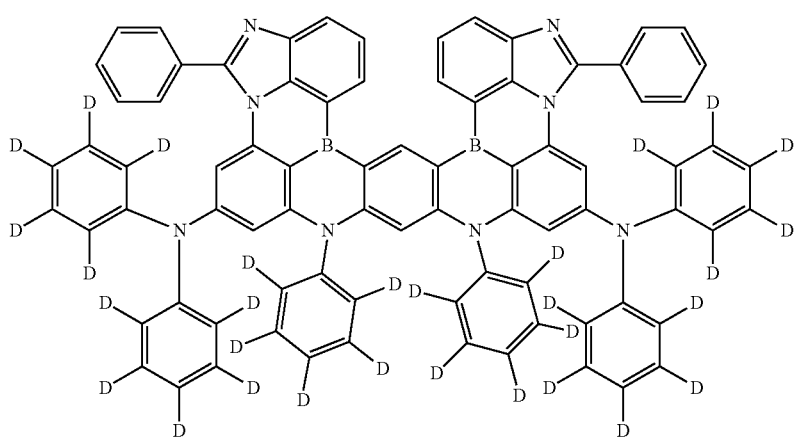
178
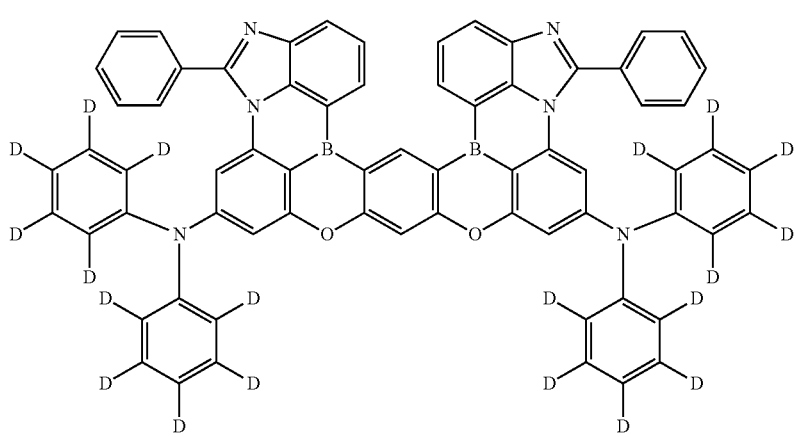

-continued

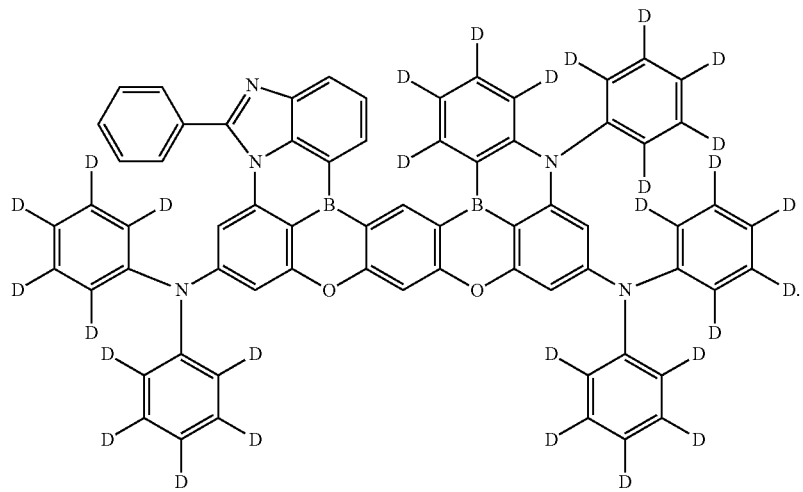

15. A nitrogen-containing compound represented by Formula 1:

[Formula 1]

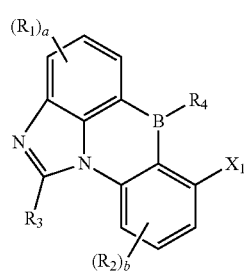

wherein in Formula 1, $X_1$ is $NAr_1Ar_2$, $OAr_3$, or $SAr_4$, $Ar_1$ to $Ar_4$ are each independently a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, $R_1$ to $R_4$ are each independently a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, and a and b are each independently an integer from 0 to 3.

16. The nitrogen-containing compound of claim 15, wherein Formula 1 is represented by Formula 2:

[Formula 2]

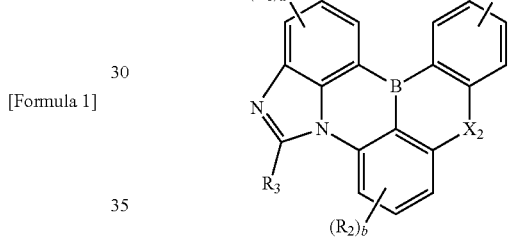

wherein in Formula 2, $X_2$ is $NAr_1$, O, or S, $R_5$ is a hydrogen atom, a deuterium atom, a halogen atom, a substituted or unsubstituted amine group, a substituted or unsubstituted boron group, a substituted or unsubstituted thiol group, a substituted or unsubstituted oxy group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, c is an integer from 0 to 4, and $Ar_1$, $R_1$ to $R_3$, a and b are the same as defined in Formula 1.

17. The nitrogen-containing compound of claim 16, wherein Formula 2 is represented by Formula 3:

[Formula 3]

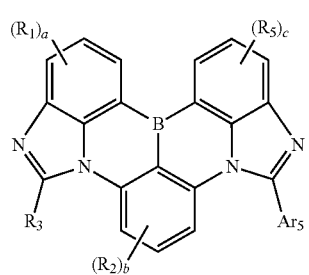

wherein in Formula 3,

Ar$_5$ is a hydrogen atom, a deuterium atom, a substituted or unsubstituted aryl group having 6 to 30 ring-forming carbon atoms, or a substituted or unsubstituted heteroaryl group having 2 to 30 ring-forming carbon atoms, and R$_1$ to R$_3$, R$_5$, and a to c are the same as defined in Formula 2.

18. The nitrogen-containing compound of claim 16, wherein Formula 2 is represented by Formula 4-1 or Formula 4-2:

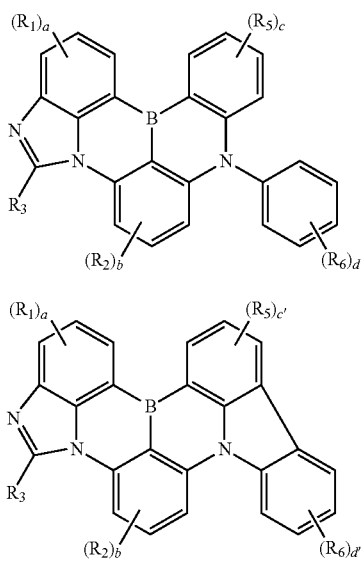

[Formula 4-1]

[Formula 4-2]

wherein in Formula 4-1 and Formula 4-2,

R$_6$ is a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, c' is an integer from 0 to 3, d is an integer from 0 to 5, d' is an integer from 0 to 4, and R$_1$ to R$_3$, R$_5$, and a to c are the same as defined in Formula 2.

19. The nitrogen-containing compound of claim 16, wherein Formula 2 is represented by Formula 6:

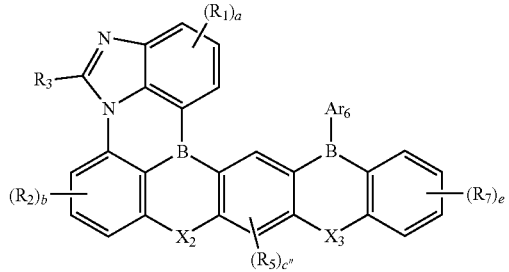

[Formula 6]

wherein in Formula 6,

X$_3$ is NAr$_1$, O, or S,

Ar$_6$ is a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, R$_7$ is a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, c" is an integer from 0 to 2, e is an integer from 0 to 4, and X$_2$, Ar$_1$, R$_1$ to R$_3$, R$_5$, a and b are the same as defined in Formula 2.

20. The nitrogen-containing compound of claim 15, wherein the compound represented by Formula 1 is one selected from Compound Group 1:

[Compound Group 1]

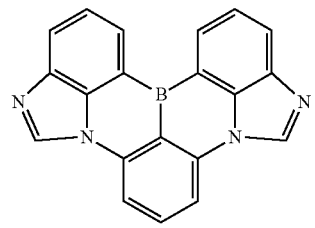

1

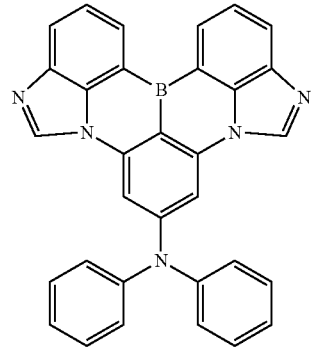

2

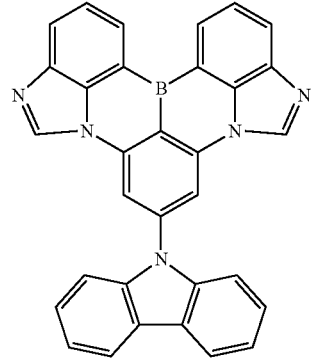

3

4
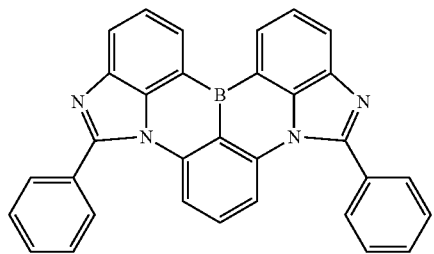
5
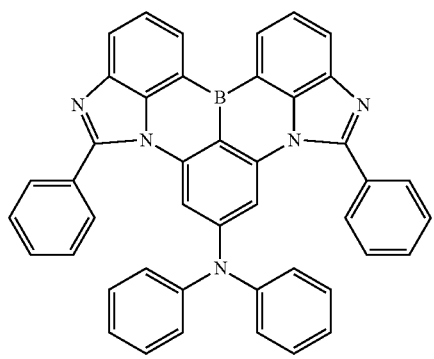
6
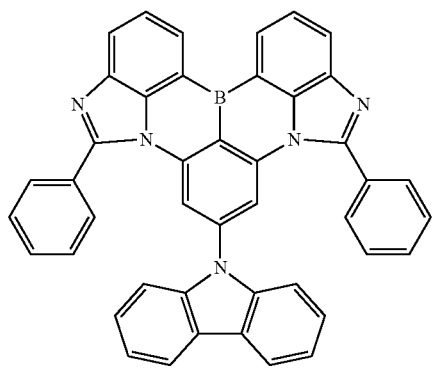
7
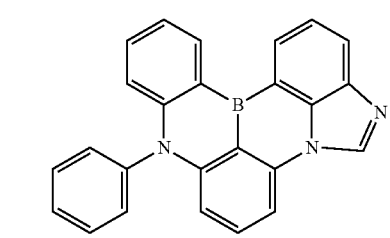
8
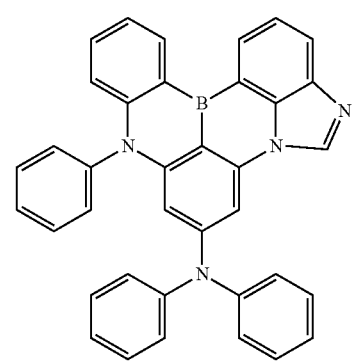
9
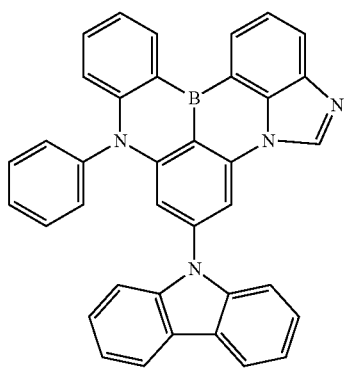
10
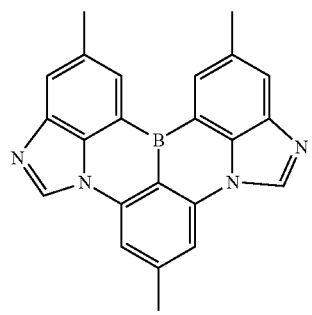
11
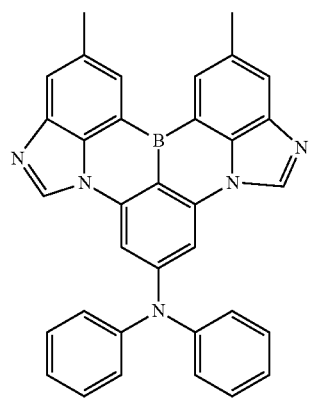
12
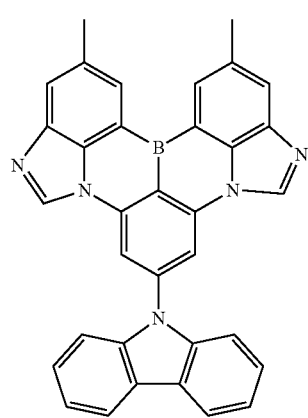

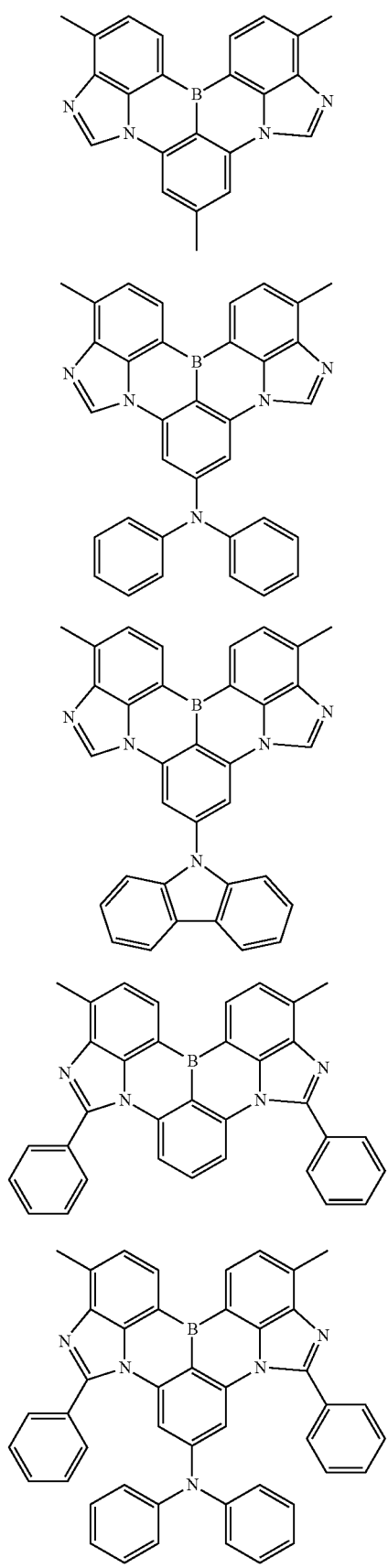
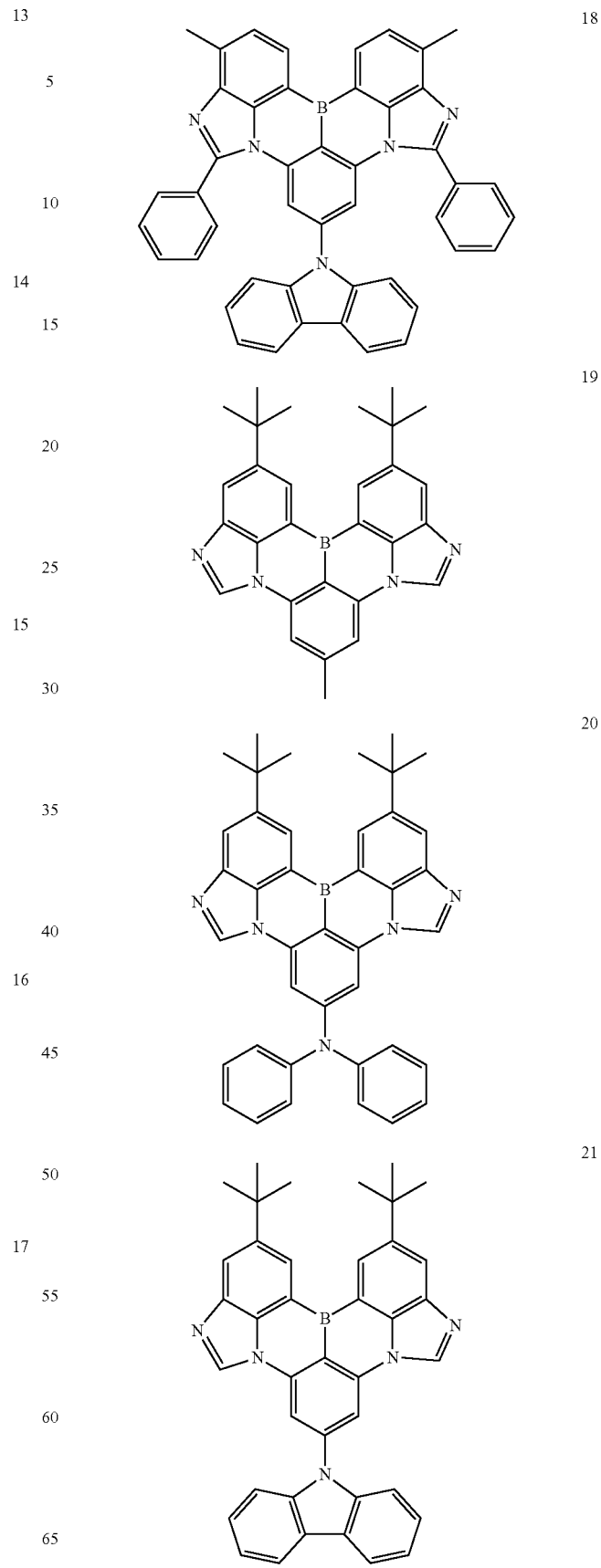

149
-continued
22
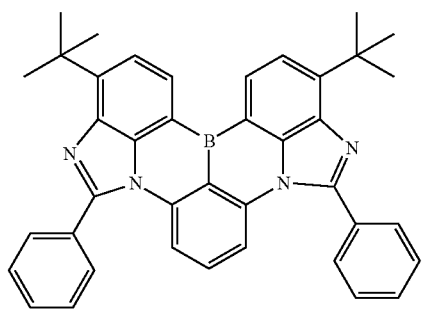
23
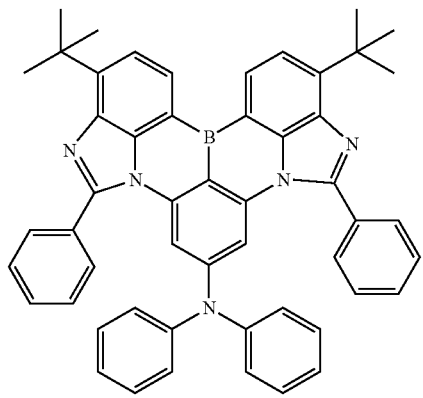
24
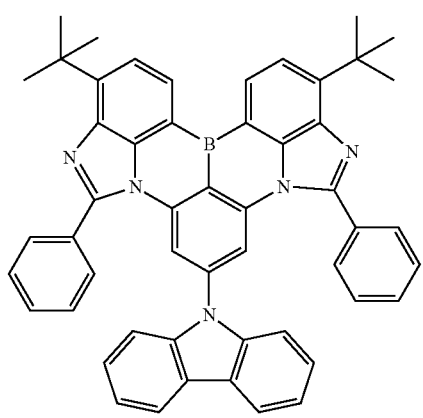
25
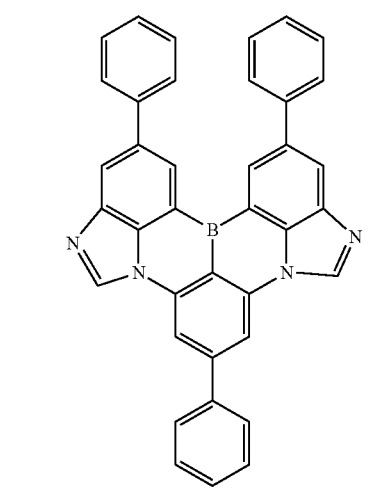
150
-continued
26
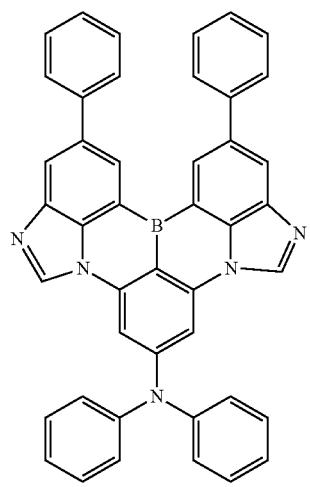
27
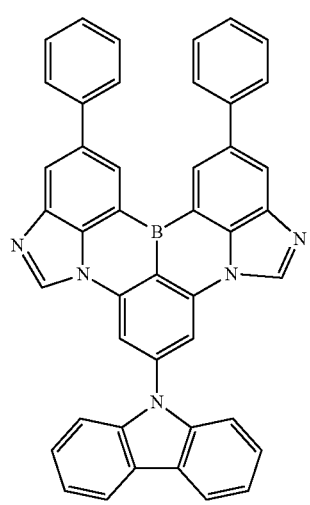
28
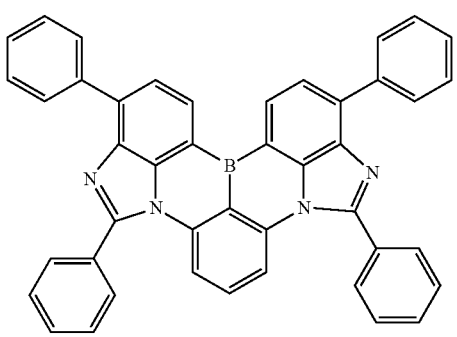

151
-continued
29
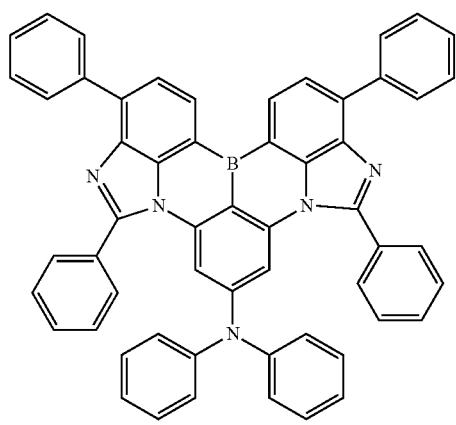
30
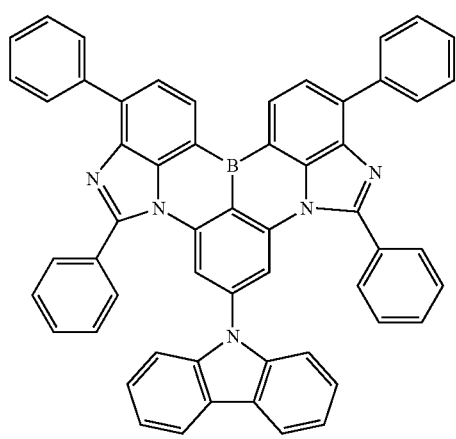
31
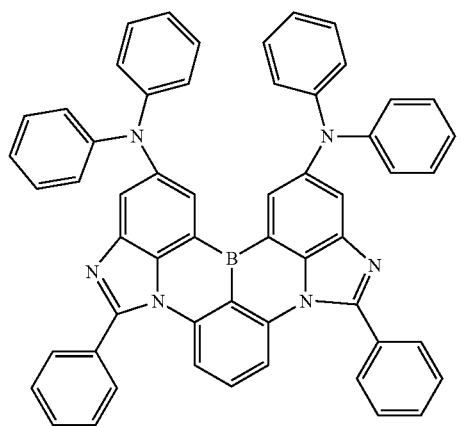
152
-continued
32
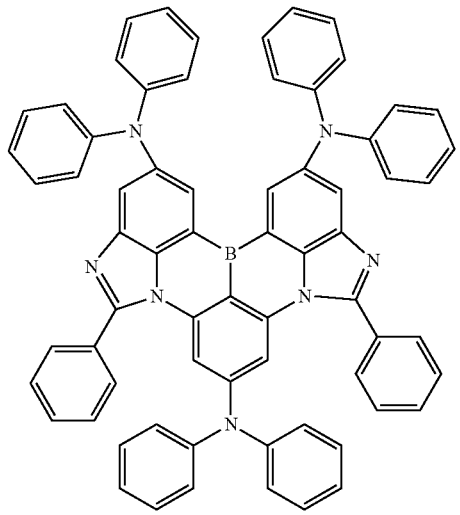
33
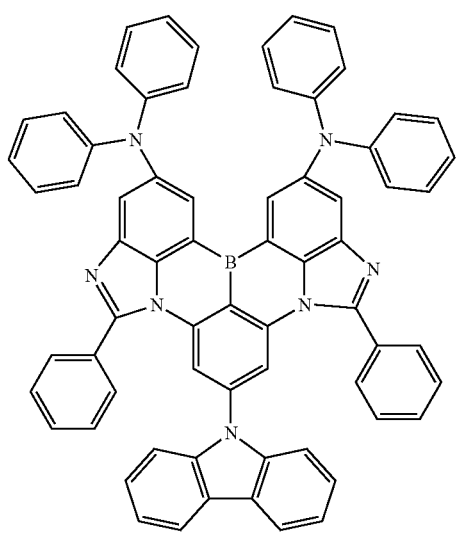
34
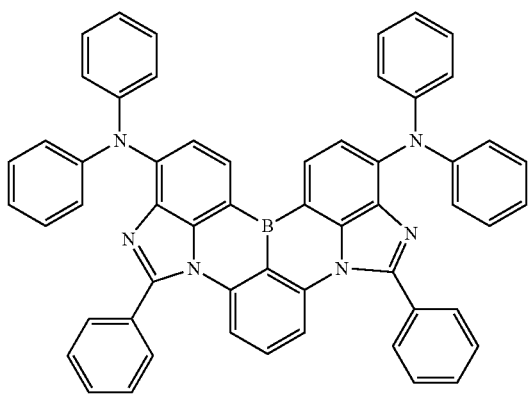

35
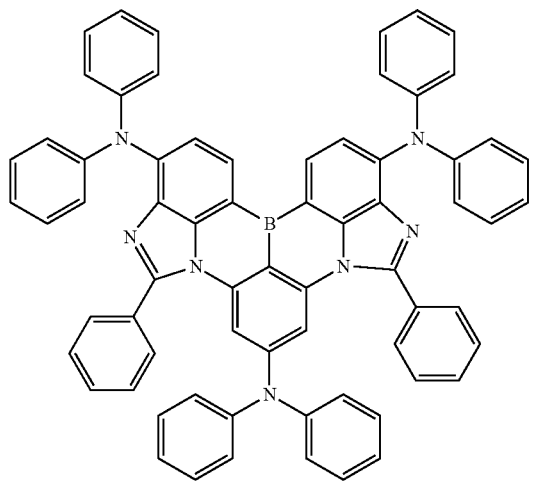
36
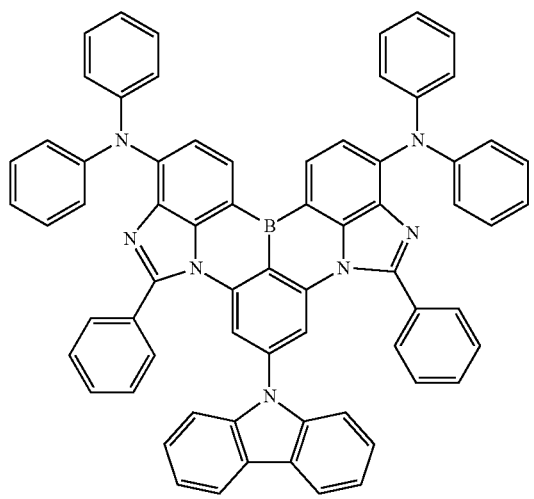
38
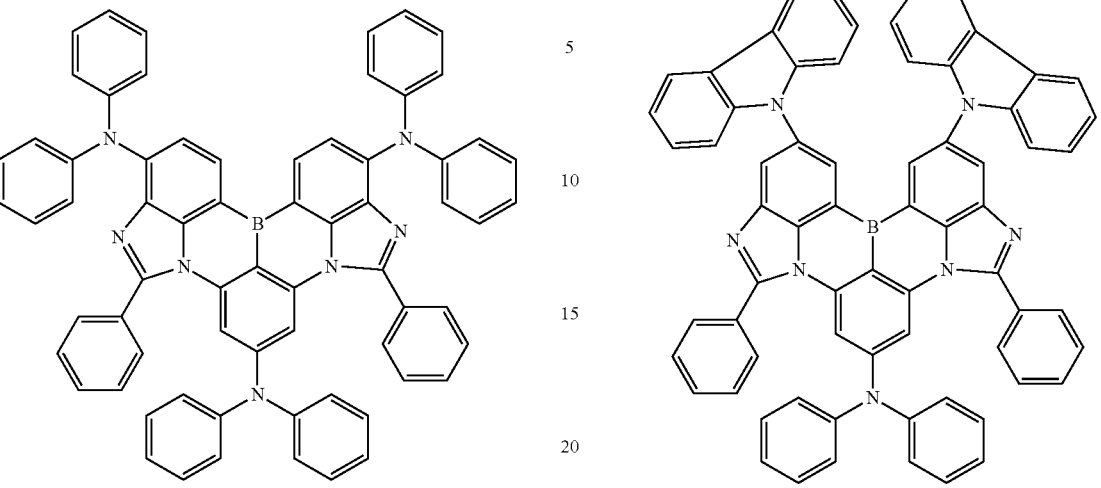
39
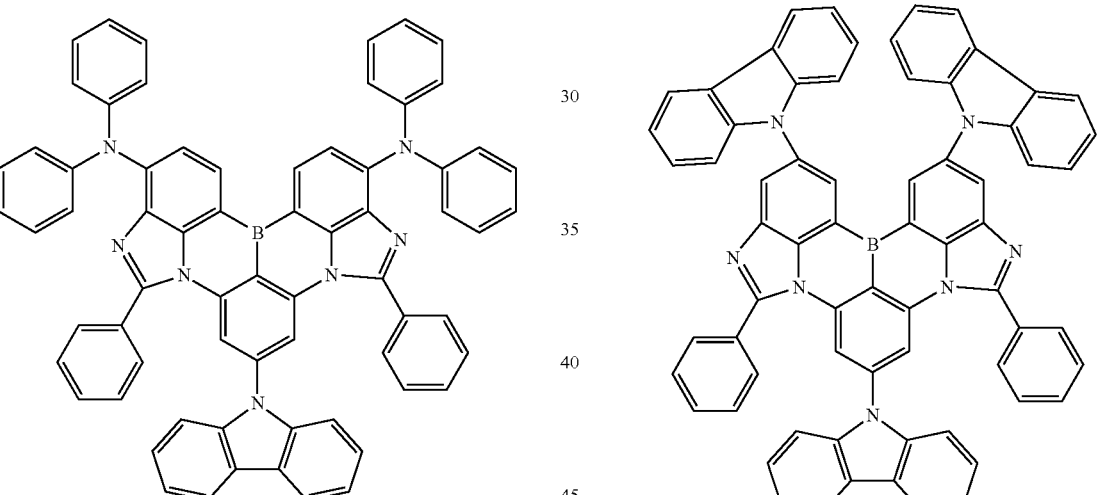
37
40
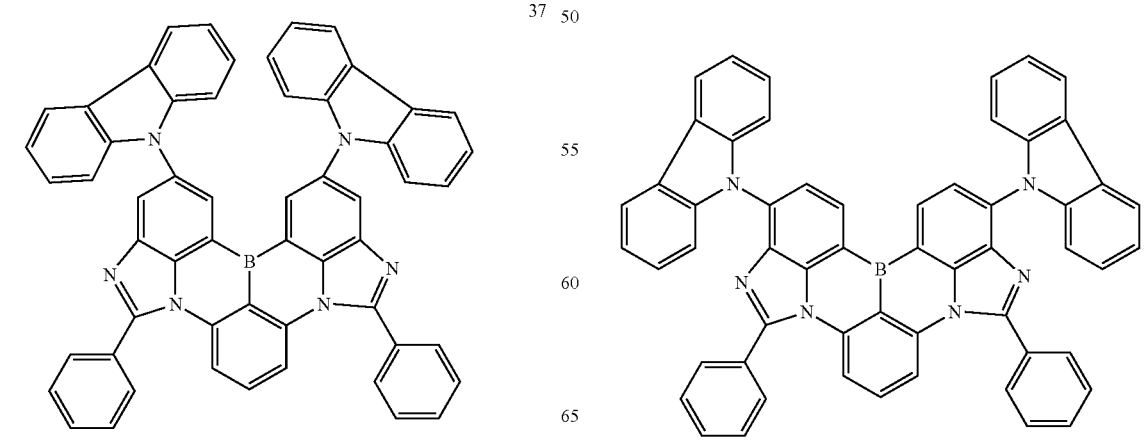

-continued
41
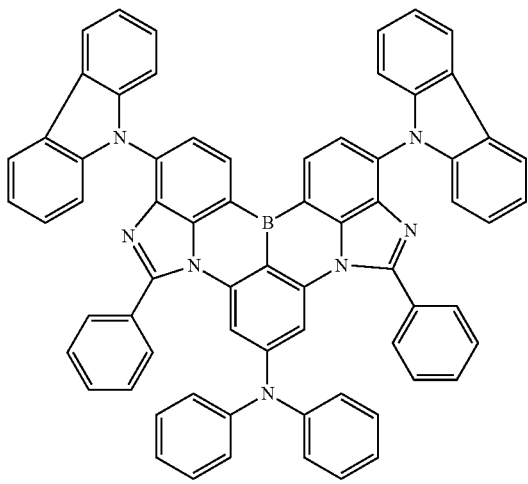
42
45
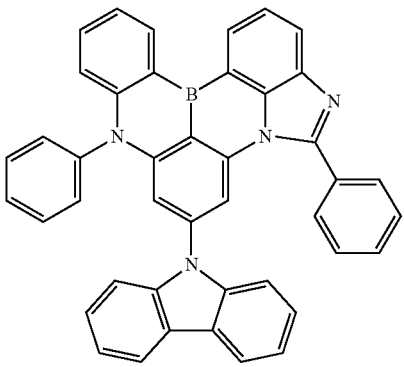
46
47
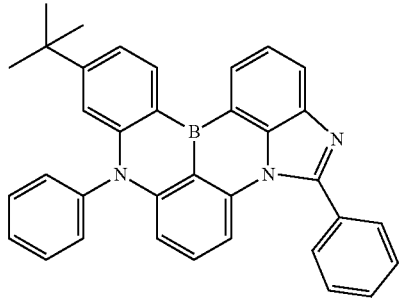
48
43
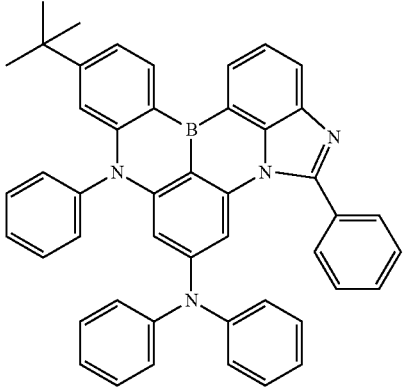
44
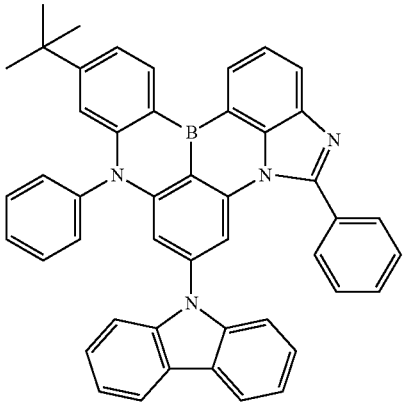

157
-continued
49
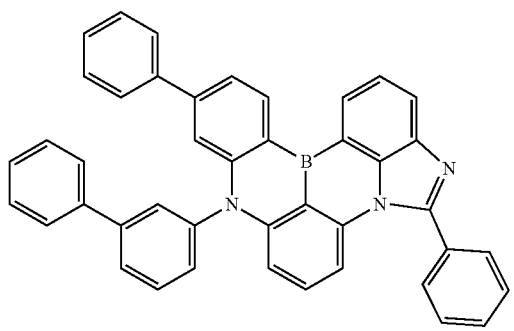
50
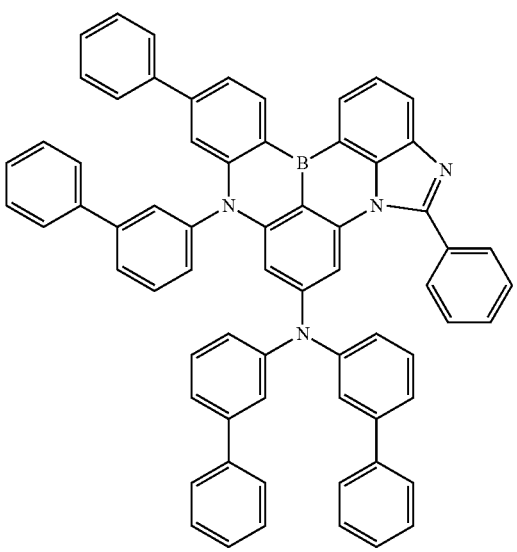
51
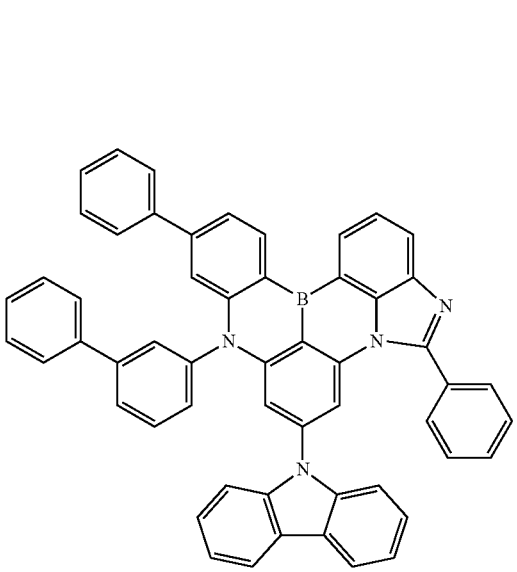
158
-continued
52
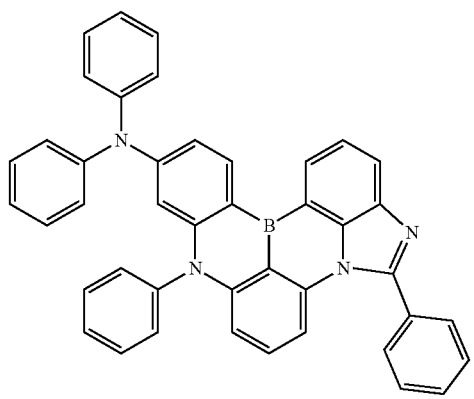
53
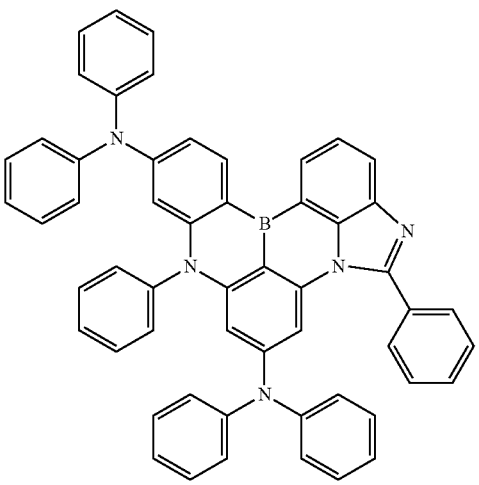
54
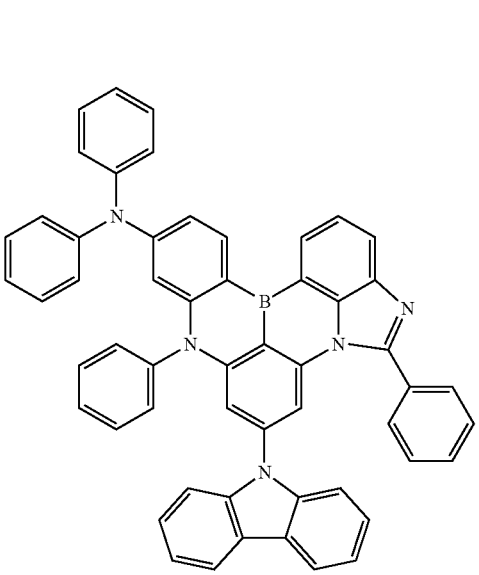

159
-continued
55
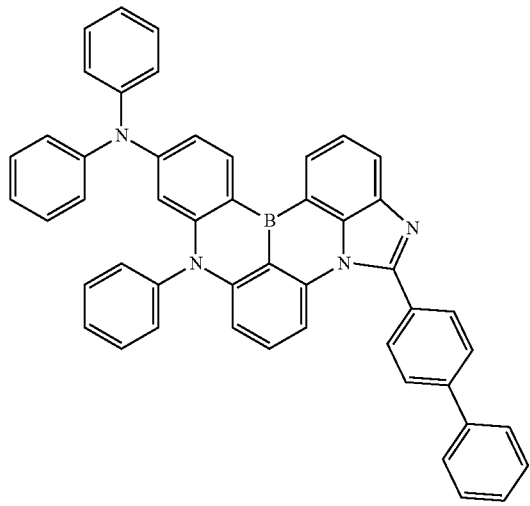
56
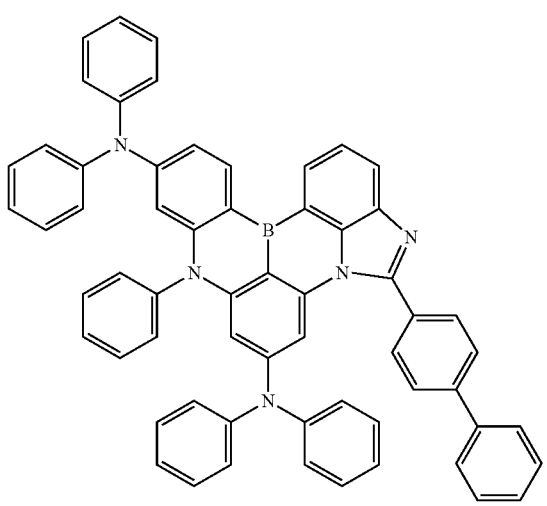
57
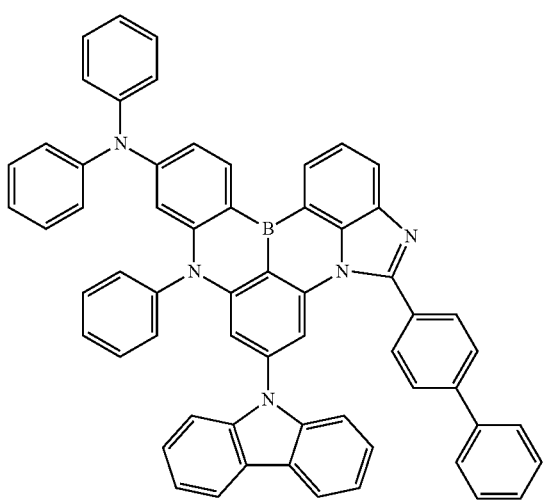
160
-continued
58
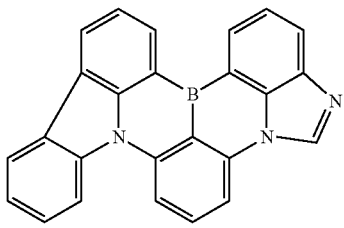
59
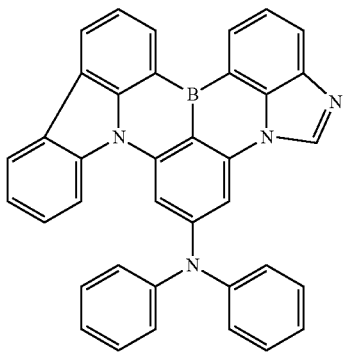
60
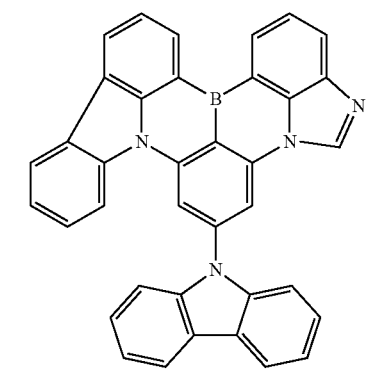
61
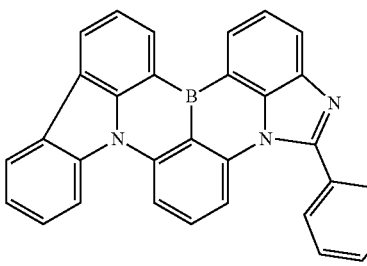
62